(12) United States Patent
Yano et al.

(10) Patent No.: US 9,417,799 B2
(45) Date of Patent: *Aug. 16, 2016

(54) MEMORY SYSTEM AND METHOD FOR CONTROLLING A NONVOLATILE SEMICONDUCTOR MEMORY

(71) Applicant: KABUSHIKI KAISHA TOSHIBA, Minato-ku (JP)

(72) Inventors: Junji Yano, Kanagawa (JP); Kosuke Hatsuda, Tokyo (JP); Hidenori Matsuzaki, Tokyo (JP); Wataru Okamoto, Kanagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/742,374

(22) Filed: Jun. 17, 2015

(65) Prior Publication Data

US 2015/0309728 A1 Oct. 29, 2015

Related U.S. Application Data

(63) Continuation of application No. 14/253,991, filed on Apr. 16, 2014, now Pat. No. 9,092,324, which is a continuation of application No. 12/394,632, filed on Feb. 27, 2009, now Pat. No. 8,745,313.

(30) Foreign Application Priority Data

Mar. 1, 2008 (JP) ................................. 2008-051464

(51) Int. Cl.
*G06F 12/00* (2006.01)
*G06F 3/06* (2006.01)
(Continued)

(52) U.S. Cl.
CPC ................ *G06F 3/061* (2013.01); *G06F 3/065* (2013.01); *G06F 3/0661* (2013.01);
(Continued)

(58) Field of Classification Search
CPC ..... G06F 3/061; G06F 12/0246; G06F 3/065; G06F 3/0661; G06F 3/0679; G06F 2206/1014; G11C 11/5628; G11C 16/0483; G11C 16/102; G11C 2211/5643; G11C 2211/7203; G11C 2211/7205; G11C 2211/5646

See application file for complete search history.

(56) References Cited

U.S. PATENT DOCUMENTS 5,568,423 A 10/1996 Jou et al.
6,704,835 B1 * 3/2004 Garner ................ G06F 12/0804
365/185.33

(Continued)

FOREIGN PATENT DOCUMENTS

| JP | 2002-318714 | 10/2002 |
| JP | 3688835 | 6/2005 |
| JP | 2005-222550 | 8/2005 |

OTHER PUBLICATIONS

John L. Hennessy, et al., "Computer Organization and Design", "The Hardware / Software Interface", Morgan Kaufmann Publishers, Inc., Aug. 31, 2004, 3 pages.

*Primary Examiner* — Kalpit Parikh
(74) *Attorney, Agent, or Firm* — Oblon, McClelland, Maier & Neustadt, L.L.P

(57) ABSTRACT

A memory system includes a nonvolatile semiconductor memory having blocks, the block being data erasing unit; and a controller configured to execute; an update processing for; writing superseding data in a block, the superseding data being treated as valid data; and invalidating superseded data having the same logical address as the superseding data, the superseded data being treated as invalid data; and a compaction processing for; retrieving blocks having invalid data using a management table, the management table managing blocks in a linked list format for each number of valid data included in the block; selecting a compaction source block having at least one valid data from the retrieved blocks; copying a plurality of valid data included in the compaction source blocks into a compaction target block; invalidating the plurality of valid data in the compaction source blocks; and releasing the compaction source blocks in which all data are invalidated.

16 Claims, 35 Drawing Sheets

(51) Int. Cl.
*G06F 12/02* (2006.01)
*G11C 11/56* (2006.01)
*G11C 16/04* (2006.01)
*G11C 16/10* (2006.01)

(52) U.S. Cl.
CPC ......... *G06F 3/0679* (2013.01); *G06F 12/0246* (2013.01); *G11C 11/5628* (2013.01); *G11C 16/0483* (2013.01); *G11C 16/102* (2013.01); *G06F 2206/1014* (2013.01); *G06F 2212/7203* (2013.01); *G06F 2212/7205* (2013.01); *G11C 2211/5643* (2013.01); *G11C 2211/5646* (2013.01)

(56) References Cited

U.S. PATENT DOCUMENTS

| | | | |
|---|---|---|---|
| 6,742,078 | B1 | 5/2004 | Chien et al. |
| 7,039,781 | B2 | 5/2006 | Iwata et al. |
| 7,890,550 | B2 | 2/2011 | Jung et al. |
| 2002/0099904 | A1 | 7/2002 | Conley |
| 2003/0225961 | A1 | 12/2003 | Chow et al. |
| 2005/0174849 | A1 | 8/2005 | In et al. |
| 2006/0026211 | A1 | 2/2006 | Potteiger |
| 2007/0033325 | A1 | 2/2007 | Sinclair |
| 2008/0155178 | A1 | 6/2008 | Sinclair et al. |

\* cited by examiner

FIG.9

| | way 1 | | way n |
|---|---|---|---|
| Line 1 | STATE FLAG+LOGICAL TRACK ADDRESS | | ... |
| ⋮ | ⋮ | | ⋮ |
| Line m | STATE FLAG+LOGICAL TRACK ADDRESS | | ... |

| | way 1 (25a) | | way n |
|---|---|---|---|
| Line 1 | STATE FLAG+SECTOR POSITION BITMAP+LOGICAL TRACK ADDRESS | | ... |
| Line 2 | 25b ... 25c | | ... |
| ⋮ | ⋮ | | ⋮ |
| Line m | ... | | ... |

FIG.13
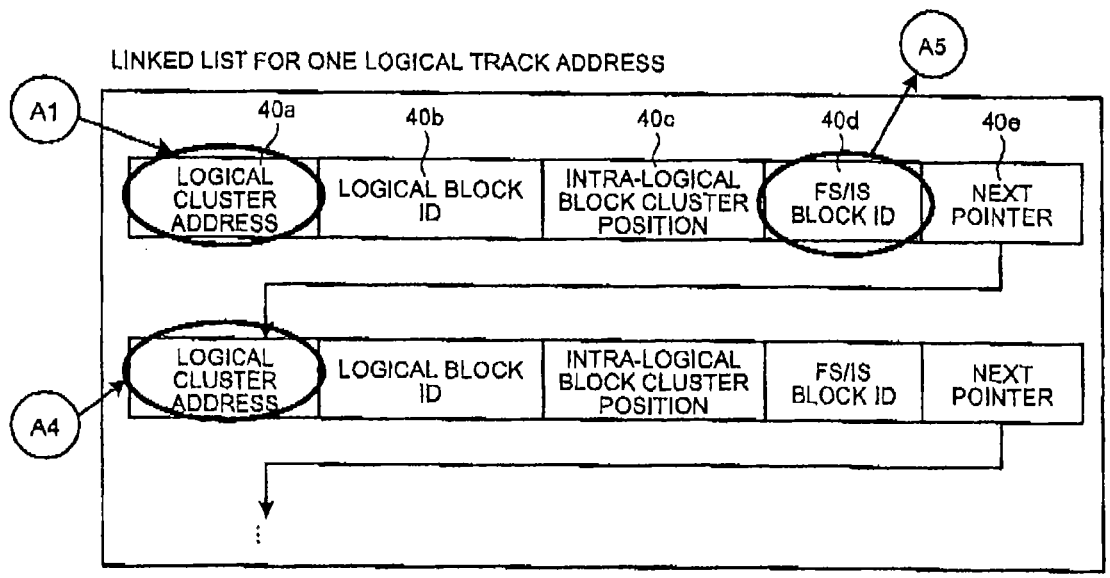
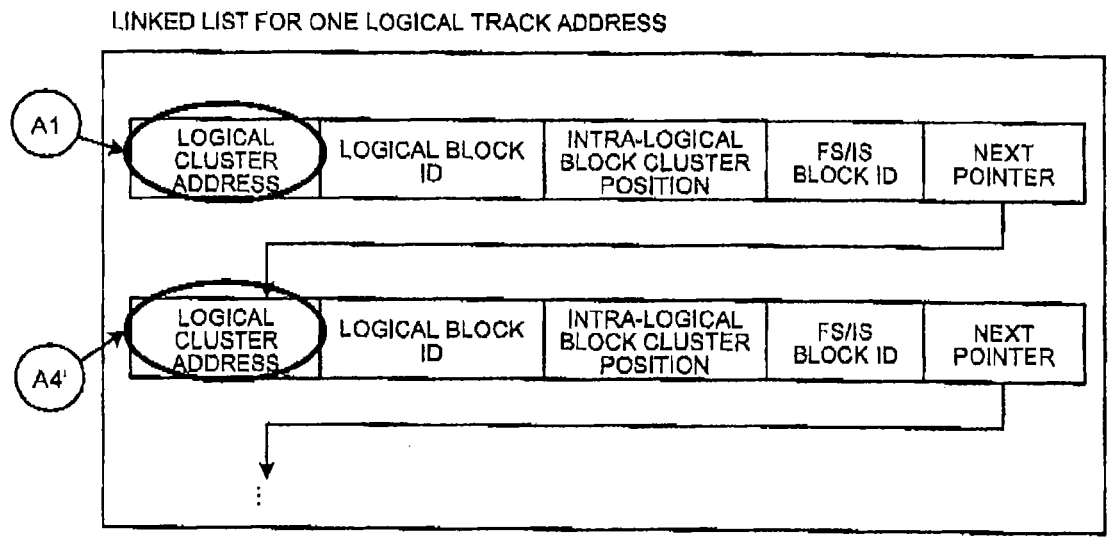

FIG.14

| 35a | 35b | 35c | 35d | 35e |
|---|---|---|---|---|
| LOGICAL BLOCK ID | TRACK MANAGEMENT POINTER (FOR $2^i$ TRACKS) | NUMBER OF VALID TRACKS | WRITABLE TOP TRACK | VALID |
| BLOCK 0 | ... | ... | ... | ... |
| BLOCK 3 | ... | ... | ... | ... |
| ⋮ | ⋮ | ⋮ | ⋮ | ⋮ |
| BLOCK m | ... | ... | ... | ... |

FIG.17

| LOGICAL BLOCK ID | PHYSICAL BLOCK ID×8 | NUMBER OF TIMES OF ERASING | NUMBER OF TIMES OF READOUT |
|---|---|---|---|
| ⋮ | ⋮ | ⋮ | ⋮ |
| ⋮ | ⋮ | ⋮ | ⋮ |
| ⋮ | ⋮ | ⋮ | ⋮ |
| ⋮ | ⋮ | ⋮ | ⋮ |

50a — LOGICAL BLOCK ID
50b — PHYSICAL BLOCK ID×8
50c — NUMBER OF TIMES OF ERASING
50d — NUMBER OF TIMES OF READOUT

FIG.20

| TO<br>FROM | WC | FS | IS | MS |
|---|---|---|---|---|
| WC | N/A | CLUSTER FLUSH | N/A | TRACK FLUSH AND PASSIVE MERGE |
| FS | N/A | CLUSTER PADDING | (BLOCK FLUSH) | TRACK FLUSH AND PASSIVE MERGE |
| IS | N/A | CLUSTER PADDING | IS COMPACTION | TRACK FLUSH AND PASSIVE MERGE |
| MS | N/A | CLUSTER PADDING | N/A | TRACK PADDING MS COMPACTION |

FIG.24

| LOGICAL BLOCK ID | PHYSICAL BLOCK ID×8 | NUMBER OF TIMES OF ERASING | NUMBER OF TIMES OF READOUT | ERASING TIME |
|---|---|---|---|---|
| ⋮ | ⋮ | ⋮ | ⋮ | ⋮ |
| ⋮ | ⋮ | ⋮ | ⋮ | ⋮ |
| ⋮ | ⋮ | ⋮ | ⋮ | ⋮ |
| ⋮ | ⋮ | ⋮ | ⋮ | ⋮ |

50a — LOGICAL BLOCK ID
50b — PHYSICAL BLOCK ID×8
50c — NUMBER OF TIMES OF ERASING
50d — NUMBER OF TIMES OF READOUT
50e — ERASING TIME

FIG.25

| channel 0 | | channel 1 | | channel 2 | | channel 3 | |
|---|---|---|---|---|---|---|---|
| plane 0 | plane 1 | plane 0 | plane 1 | plane 0 | plane 1 | plane 0 | plane 1 |
| ID#0 | ID#1 | ID#2 | ID#3 | ID#4 | ID#5 | ID#6 | ID#7 |
| PHYSICAL BLOCK ID | ⋮ | ⋮ | ⋮ | ⋮ | ⋮ | ⋮ | ⋮ |
| ⋮ | ⋮ | ⋮ | ⋮ | ⋮ | ⋮ | ⋮ | ⋮ |
| ⋯ | ⋯ | ⋯ | ⋯ | ⋯ | ⋯ | ⋯ | ⋯ |

| 35a | 35b | 35c | 35d | 35e | 35g | 35h |
|---|---|---|---|---|---|---|
| LOGICAL BLOCK ID | TRACK MANAGEMENT POINTER (FOR $2^i$ TRACKS) | NUMBER OF VALID TRACKS | WRITABLE TOP TRACK | VALID | PREV POINTER | NEXT POINTER |
| BLOCK 0 | ... | ... | ... | ... | ... | ... |
| BLOCK 3 | ... | ... | ... | ... | ... | ... |
| ... | ... | ... | ... | ... | ... | ... |
| BLOCK m | ... | ... | ... | ... | ... | ... |

(A2) → 35b

MEMORY SYSTEM AND METHOD FOR CONTROLLING A NONVOLATILE SEMICONDUCTOR MEMORY

CROSS-REFERENCE TO RELATED APPLICATIONS

This application is a continuation of U.S. application Ser. No. 14/253,991 filed Apr. 16, 2014, which is a continuation of U.S. application Ser. No. 12/394,632 filed Feb. 27, 2009, which is based upon and claims the benefit of priority from the prior Japanese Patent Application No. 2008-051464, filed on Mar. 1, 2008; the entire contents of which are incorporated herein by reference.

BACKGROUND OF THE INVENTION

1. Field of the Invention

The present invention relates to a memory system including a nonvolatile semiconductor memory and a method for controlling a nonvolatile semiconductor memory.

2. Description of the Related Art

As an external storage device used in a computer system, an SSD (Solid State Drive) mounted with a nonvolatile semiconductor memory such as a NAND-type flash memory attracts attention. The flash memory has advantages such as high speed and light weight compared with a magnetic disk device.

The SSD includes a plurality of flash memory chips, a controller that performs read/write control for the respective flash memory chips in response to a request from a host apparatus, a buffer memory for performing data transfer between the respective flash memory chips and the host apparatus, a power supply circuit, and a connection interface to the host apparatus (e.g., Japanese Patent No. 3688835).

Examples of the nonvolatile semiconductor memory include nonvolatile semiconductor memories in which a unit of erasing, writing, and readout is fixed such as a nonvolatile semiconductor memory that, in storing data, once erases the data in block units and then performs writing and a nonvolatile semiconductor memory that performs writing and readout in page units in the same manner as the NAND-type flash memory.

On the other hand, a unit for a host apparatus such as a personal computer to write data in and read out the data from a secondary storage device such as a hard disk is called sector. The sector is set independently from a unit of erasing, writing, and readout of a semiconductor storage device.

For example, whereas a size of a block (a block size) of the nonvolatile semiconductor memory is 512 kB and a size of a page (a page size) thereof is 4 kB, a size of a sector (a sector size) of the host apparatus is set to 512 B.

In this way, the unit of erasing, writing, and readout of the nonvolatile semiconductor memory may be larger than the unit of writing and readout of the host apparatus.

Therefore, when the secondary storage device of the personal computer such as the hard disk is configured by using the nonvolatile semiconductor memory, it is necessary to write data with a small size from the personal computer as the host apparatus by adapting the size to the block size and the page size of the nonvolatile semiconductor memory.

The data recorded by the host apparatus such as the personal computer has both temporal locality and spatial locality (see, for example, David A. Patterson and John L. Hennessy, "Computer Organization and Design: The Hardware/Software Interface", Morgan Kaufmann Pub, 2004 Aug. 31). Therefore, when data is recorded, if the data is directly recorded in an address designated from the outside, rewriting, i.e., erasing processing temporally concentrates in a specific area and a bias in the number of times of erasing increases. Therefore, in the NAND-type flash memory, processing called wear leveling for equally distributing data update sections is performed.

In the wear leveling processing, for example, a logical address designated by the host apparatus is translated into a physical address of the nonvolatile semiconductor memory in which the data update sections are equally distributed.

When a large-capacity secondary storage device is configured by using the NAND flash memory, if a unit of data management is a small size (e.g., a page size) when the address conversion is performed, the size of a management table increases and does not fit in a main memory of a controller of the secondary storage device, and the address conversion cannot be performed at high speed. In this way, the size of the management table inevitably increases according to an increase in capacity of the NAND flash memory as the secondary storage device. Therefore, there is a demand for a method for reducing a capacity of the management table as much as possible.

As explained above, when a data erasing unit (a block) and a data management unit are different, according to the progress of rewriting of the flash memory, blocks are made porous by invalid (non-latest) data. When the blocks in such a porous state increases, substantially usable blocks decrease and a storage area of the flash memory cannot be effectively used. Therefore, processing called compaction for collecting valid latest data and rewriting the data in different blocks may be performed (see, for example, Japanese Patent Application Laid-Open No. 2005-22550). In this compaction processing, because processing time is long depending on the method, there is a demand for a method for reducing processing time of the compaction.

BRIEF SUMMARY OF THE INVENTION

A memory system according to an embodiment of the present invention comprises: a nonvolatile semiconductor memory having a plurality of blocks, the block having a plurality of pages, the block being data erasing unit and the page being data writing unit, the block being erased before rewriting to the same page; and a controller configured to execute; an update processing for; writing superseding data in a block having at least one writable page, the superseding data being treated as valid data; and invalidating superseded data having the same logical address as the superseding data, the superseded data being treated as invalid data; and a compaction processing for; retrieving blocks having invalid data using a management table, the management table managing blocks in a linked list format for each number of valid data included in the block; selecting a compaction source block having at least one valid data from the retrieved blocks; copying a plurality of valid data included in the compaction source blocks into a compaction target block; invalidating the plurality of valid data in the compaction source blocks; and releasing the compaction source blocks in which all data are invalidated.

According to another aspect of the present invention, there is provided a method of controlling a nonvolatile semiconductor memory, the nonvolatile semiconductor memory having a plurality of blocks, the block having a plurality of pages, the block being data erasing unit and the page being data writing unit, the block being erased before rewriting to the same page, comprising: executing an update processing which includes; writing superseding data in a block having at least one writable page, the superseding data being treated as valid data; and invalidating superseded data having the same logical address as the superseding data, the superseded data being treated as invalid data; and executing a compaction processing which includes; retrieving blocks having invalid data using a management table, the management table managing blocks in a linked list format for each number of valid data included in the block; selecting a compaction source block having at least one valid data from the retrieved blocks; copying a plurality of valid data included in the compaction source blocks into a compaction target block; invalidating the plurality of valid data in the compaction source blocks; and releasing the compaction source blocks in which all data are invalidated.

BRIEF DESCRIPTION OF THE DRAWINGS

FIG. 9 is a diagram of an example of an RC cluster management table;

FIG. 10 is a diagram of an example of a WC cluster management table;

FIG. 13 is a diagram of an example of an FS/IS management table;

FIG. 14 is a diagram of an example of an MS logical block management table;

FIG. 17 is a diagram of an example of a logical-to-physical conversion table;

FIG. 20 is a diagram of combinations of inputs and outputs in a flow of data among components and causes of the flow;

FIG. 24 is a diagram of another example of the logical-to-physical conversion table;

FIG. 25 is a diagram of an example of a BB management table;

FIG. 32 is a diagram of an example of an MS logical block management table having a linked list for each number of valid tracks;

DETAILED DESCRIPTION OF THE INVENTION

Figure 1:
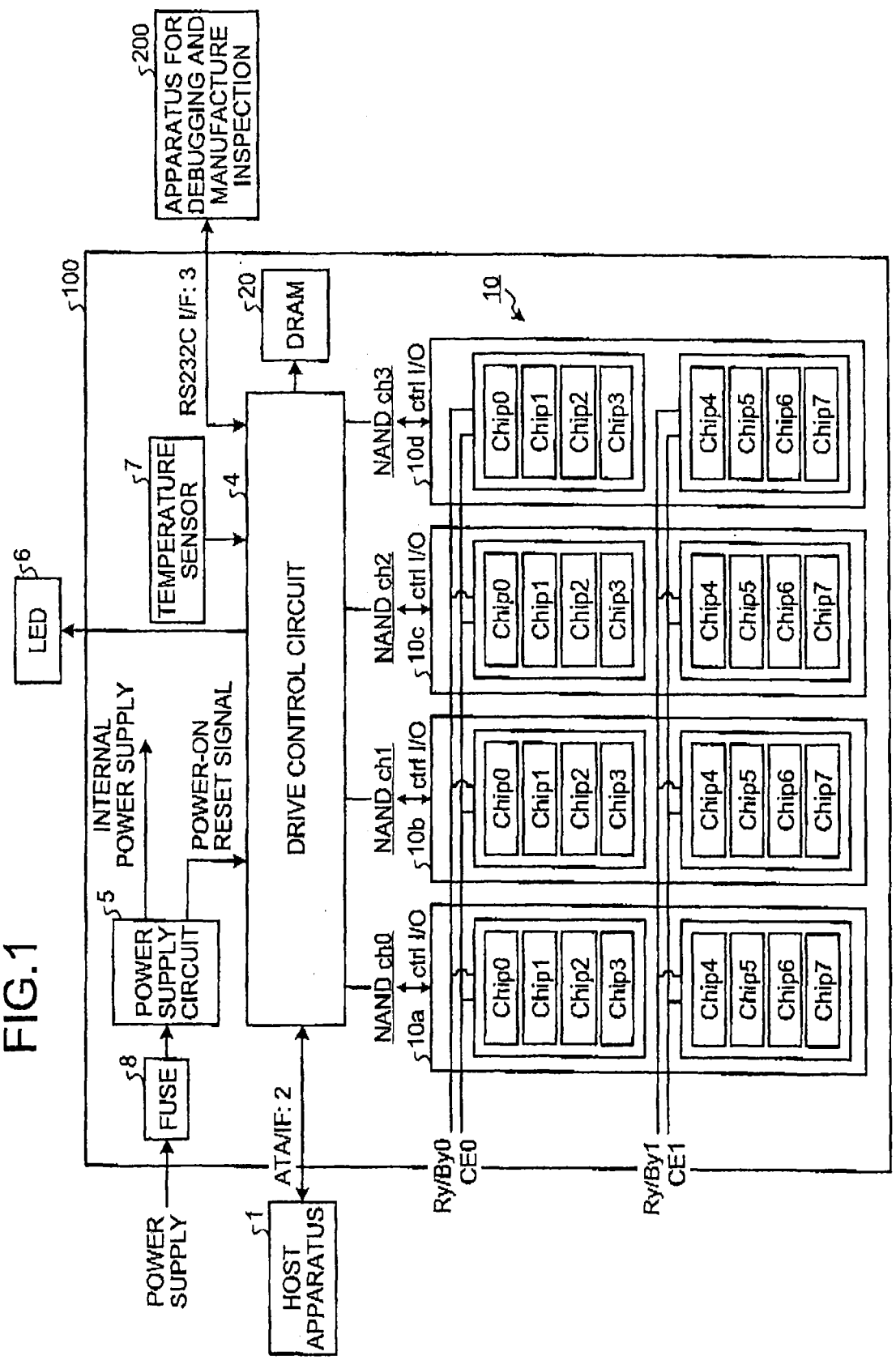
FIG. 1 is a block diagram of a configuration example of an SSD.

Embodiments of the present invention are explained below with reference to the accompanying drawings. In the following explanation, components having the same functions and configurations are denoted by the same reference numerals and signs. Redundant explanation of the components is made only when necessary.

EMBODIMENTS

Embodiments of the present invention are explained below with reference to the drawings. In the following explanation, components having the same functions and configurations are denoted by the same reference numerals and signs. Redundant explanation of the components is performed only when necessary.

First, terms used in this specification are defined.

Physical page: A unit that can be collectively written and read out in a NAND memory chip. A physical page size is, for example, 4 kB. However, a redundant bit such as an error correction code added to main data (user data, etc.) in an SSD is not included. Usually, 4 kB+redundant bit (e.g., several 10 B) is a unit simultaneously written in a memory cell. However, for convenience of explanation, the physical page is defined as explained above.

Logical page: A writing and readout unit set in the SSD. The logical page is associated with one or more physical pages. A logical page size is, for example, 4 kB in an 8-bit normal mode and is 32 kB in a 32-bit double speed mode. However, a redundant bit is not included.

Physical block: A minimum unit that can be independently erased in the NAND memory chip. The physical block includes a plurality of physical pages. A physical block size is, for example, 512 kB. However, a redundant bit such as an error correction code added to main data in the SSD is not included. Usually, 512 kB+redundant bit (e.g., several 10 kB) is a unit simultaneously erased. However, for convenience of explanation, the physical block is defined as explained above.

Logical block: An erasing unit set in the SSD. The logical block is associated with one or more physical blocks. A logical block size is, for example, 512 kB in an 8-bit normal mode and is 4 MB in a 32-bit double speed mode. However, a redundant bit is not included.

Sector: A minimum access unit from a host. A sector size is, for example, 512 B.

Cluster: A management unit for managing "small data (fine grained data)" in the SSD. A cluster size is equal to or larger than the sector size, and for example, is set such that a size twice or larger natural number times as large as the cluster size is the logical page size. The cluster size can be set to be equal to a data management unit of a file system adopted by an operating system (OS) on a host side or can be set to be equal to the logical page size.

Track: A management unit for managing "large data (coarse grained data)" in the SSD. A track size is set such that a size twice or larger natural number times as large as the cluster size is the track size, and for example, a size twice or larger natural number times as large as the track size is the logical block size. The track size can be set to be equal to the logical block size to simplify data management.

Free block (FB): A logical block on a NAND-type flash memory for which a use is not allocated. When a use is allocated to the free block, the free block is used after being erased.

Bad block (BB): A physical block on the NAND-type flash memory that cannot be used as a storage area because of a large number of errors. For example, a physical block for which an erasing operation is not normally finished is registered as the bad block BB.

Writing efficiency: A statistical value of an erasing amount of the logical block with respect to a data amount written from the host in a predetermined period. As the writing efficiency is smaller, a wear degree of the NAND-type flash memory is smaller.

Valid cluster: A cluster that stores latest data corresponding to a logical address.

Invalid cluster: A cluster that stores non-latest data not to be referred as a result that a cluster having identical logical address is written in other storage area.

Valid track: A track that stores latest data corresponding to a logical address.

Invalid track: A track that stores non-latest data not to be referred as a result that a cluster having identical logical address is written in other storage area.

Compaction: Extracting only the valid cluster and the valid track from a logical block in the management object and rewriting the valid cluster and the valid track in a new logical block.

First Embodiment

FIG. 1 is a block diagram of a configuration example of an SSD (Solid State Drive) 100. The SSD 100 is connected to a host apparatus 1 such as a personal computer or a CPU core via a memory connection interface such as an ATA interface (ATA I/F) 2 and functions as an external storage of the host apparatus 1. The SSD 100 can transmit data to and receive data from an apparatus for debugging and manufacture inspection 200 via a communication interface 3 such as an RS232C interface (RS232C I/F). The SSD 100 includes a NAND-type flash memory (hereinafter abbreviated as NAND memory) 10 as a nonvolatile semiconductor memory, a drive control circuit 4 as a controller, a DRAM 20 as a volatile semiconductor memory, a power supply circuit 5, an LED for state display 6, a temperature sensor 7 that detects the temperature in a drive, and a fuse 8.

The power supply circuit 5 generates a plurality of different internal DC power supply voltages from external DC power supplied from a power supply circuit on the host apparatus 1 side and supplies these internal DC power supply voltages to respective circuits in the SSD 100. The power supply circuit 5 detects a rising edge of an external power supply, generates a power-on reset signal, and supplies the power-on reset signal to the drive control circuit 4. The fuse 8 is provided between the power supply circuit on the host apparatus 1 side and the power supply circuit 5 in the SSD 100. When an overcurrent is supplied from an external power supply circuit, the fuse 8 is disconnected to prevent malfunction of the internal circuits.

The NAND memory 10 has four parallel operation elements 10a to 10d that perform four parallel operations. One parallel operation element has two NAND memory packages. Each of the NAND memory packages includes a plurality of stacked NAND memory chips (e.g., 1 chip=2 GB). In the case of FIG. 1, each of the NAND memory packages includes stacked four NAND memory chips. The NAND memory 10 has a capacity of 64 GB. When each of the NAND memory packages includes stacked eight NAND memory chips, the NAND memory 10 has a capacity of 128 GB.

The DRAM 20 functions as a cache for data transfer between the host apparatus 1 and the NAND memory 10 and a memory for a work area. An FeRAM (Ferroelectric Random Access Memory), PRAM (Phase-change Random Access Memory), or MRAM (Magnetoresistive Random Access Memory) can be used instead of the DRAM 20. The drive control circuit 4 performs data transfer control between the host apparatus 1 and the NAND memory 10 via the DRAM 20 and controls the respective components in the SSD 100. The drive control circuit 4 supplies a signal for status display to the LED for state display 6. The drive control circuit 4 also has a function of receiving a power-on reset signal from the power supply circuit 5 and supplying a reset signal and a clock signal to respective units in the own circuit and the SSD 100.

Figure 2A:
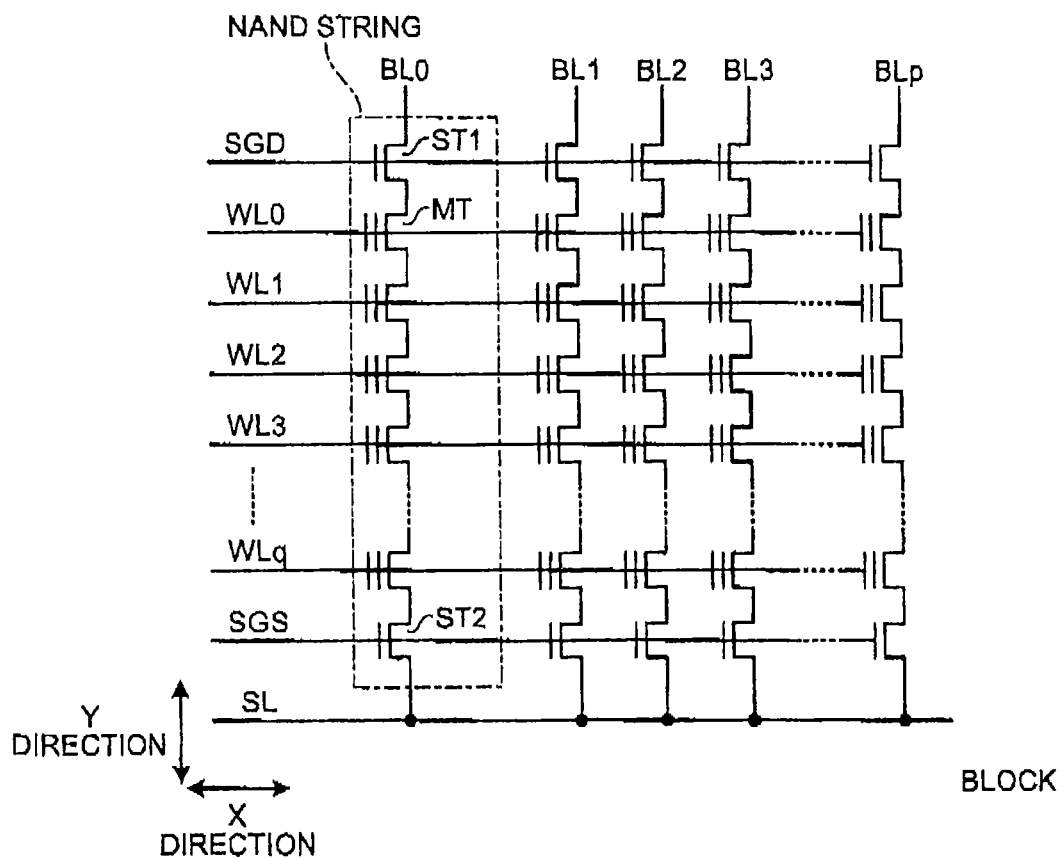
FIG. 2A is a circuit diagram of a configuration example of one physical block included in the NAND memory.

Each of the NAND memory chips is configured by arraying a plurality of physical blocks as units of data erasing. FIG. 2A is a circuit diagram of a configuration example of one physical block included in the NAND memory chip. Each physical block includes (p+1) NAND strings arrayed in order along an X direction (p is an integer equal to or larger than 0). A drain of a selection transistor ST1 included in each of the (p+1) NAND strings is connected to bit lines BL0 to BLp and a gate thereof is connected to a selection gate line SGD in common. A source of a selection transistor ST2 is connected to a source line SL in common and a gate thereof is connected to a selection gate line SGS in common.

Each of memory cell transistors MT includes a MOSFET (Metal Oxide Semiconductor Field Effect Transistor) including the stacked gate structure formed on a semiconductor substrate. The stacked gate structure includes a charge storage layer (a floating gate electrode) formed on the semiconductor substrate via a gate insulating film and a control gate electrode formed on the charge storage layer via an inter-gate insulating film. Threshold voltage changes according to the number of electrons accumulated in the floating gate electrode. The memory cell transistor MT stores data according to a difference in the threshold voltage. The memory cell transistor MT can be configured to store one bit or can be configured to store multiple values (data equal to or larger than two bits).

The memory cell transistor MT is not limited to the structure having the floating gate electrode and can be the structure such as a MONOS (Metal-Oxide-Nitride-Oxide-Silicon)

type that can adjust a threshold by causing a nitride film interface as a charge storage layer to trap electrons. Similarly, the memory cell transistor MT of the MONOS structure can be configured to store one bit or can be configured to store multiple values (data equal to or larger than two bits).

In each of the NAND strings, (q+1) memory cell transistors MT are arranged between the source of the selection transistor ST1 and the drain of the selection transistor ST2 such that current paths thereof are connected in series. In other words, the memory cell transistors MT are connected in series in a Y direction such that adjacent ones of the memory cell transistors MT share a diffusion region (a source region or a drain region).

Control gate electrodes of the memory cell transistors MT are connected to word lines WL0 to WLq, respectively, in order from the memory cell transistor MT located on the most drain side. Therefore, a drain of the memory cell transistor MT connected to the word line WL0 is connected to the source of the selection transistor ST1. A source of the memory cell transistor MT connected to the word line WLq is connected to the drain of the selection transistor ST2.

The word lines WL0 to WLq connect the control gate electrodes of the memory cell transistors MT in common among the NAND strings in the physical block. In other words, the control gates of the memory cell transistors MT present in an identical row in the block are connected to an identical word line WL. (p+1) memory cell transistors MT connected to the identical word line WL is treated as one page (physical page). Data writing and data readout are performed by each physical page.

The bit lines BL0 to BLp connect drains of selection transistors ST1 in common among the blocks. In other words, the NAND strings present in an identical column in a plurality of blocks are connected to an identical bit line BL.

Figure 2B:
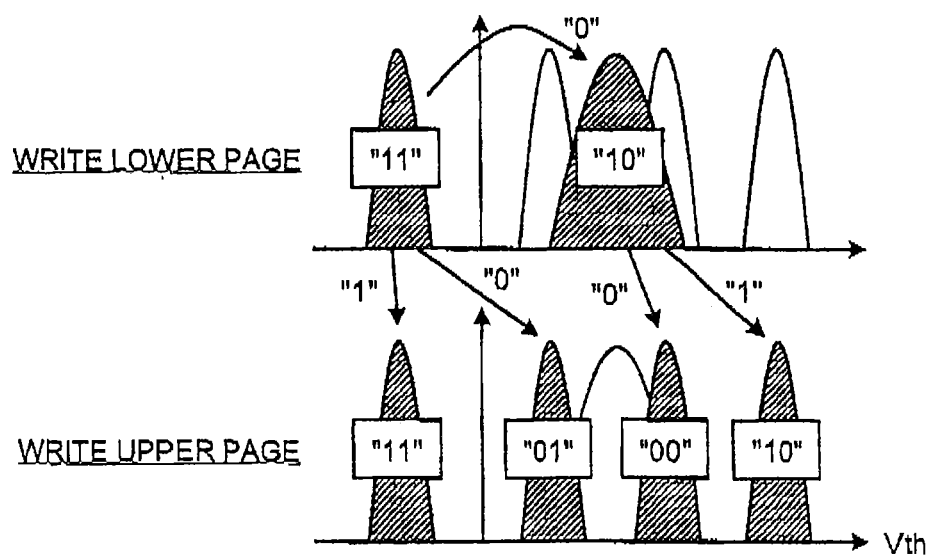
FIG. 2B is a schematic diagram of a threshold distribution in a quaternary data storage mode for storing two bits in one memory cell transistor MT.

FIG. 2B is a schematic diagram of a threshold distribution, for example, in a quaternary data storage mode for storing two bits in one memory cell transistor MT. In the quaternary data storage mode, any one of quaternary data "xy" defined by upper page data "x" and lower page data "y" can be stored in the memory cell transistor MT.

As the quaternary data "xy", for example, "11", "01", "00", and "10" are allocated in order of threshold voltages of the memory cell transistor MT. The data "11" is an erased state in which the threshold voltage of the memory cell transistor MT is negative.

In a lower page writing operation, the data "10" is selectively written in the memory cell transistor MT having the data "11" (in the erased state) according to the writing of the lower bit data "y". A threshold distribution of the data "10" before upper page writing is located about in the middle of threshold distributions of the data "01" and the data "00" after the upper page writing and can be broader than a threshold distribution after the upper page writing. In a upper page writing operation, writing of upper bit data "x" is selectively applied to a memory cell of the data "11" and a memory cell of the data "10". The data "01" and the data "00" are written in the memory cells.

Figure 3:
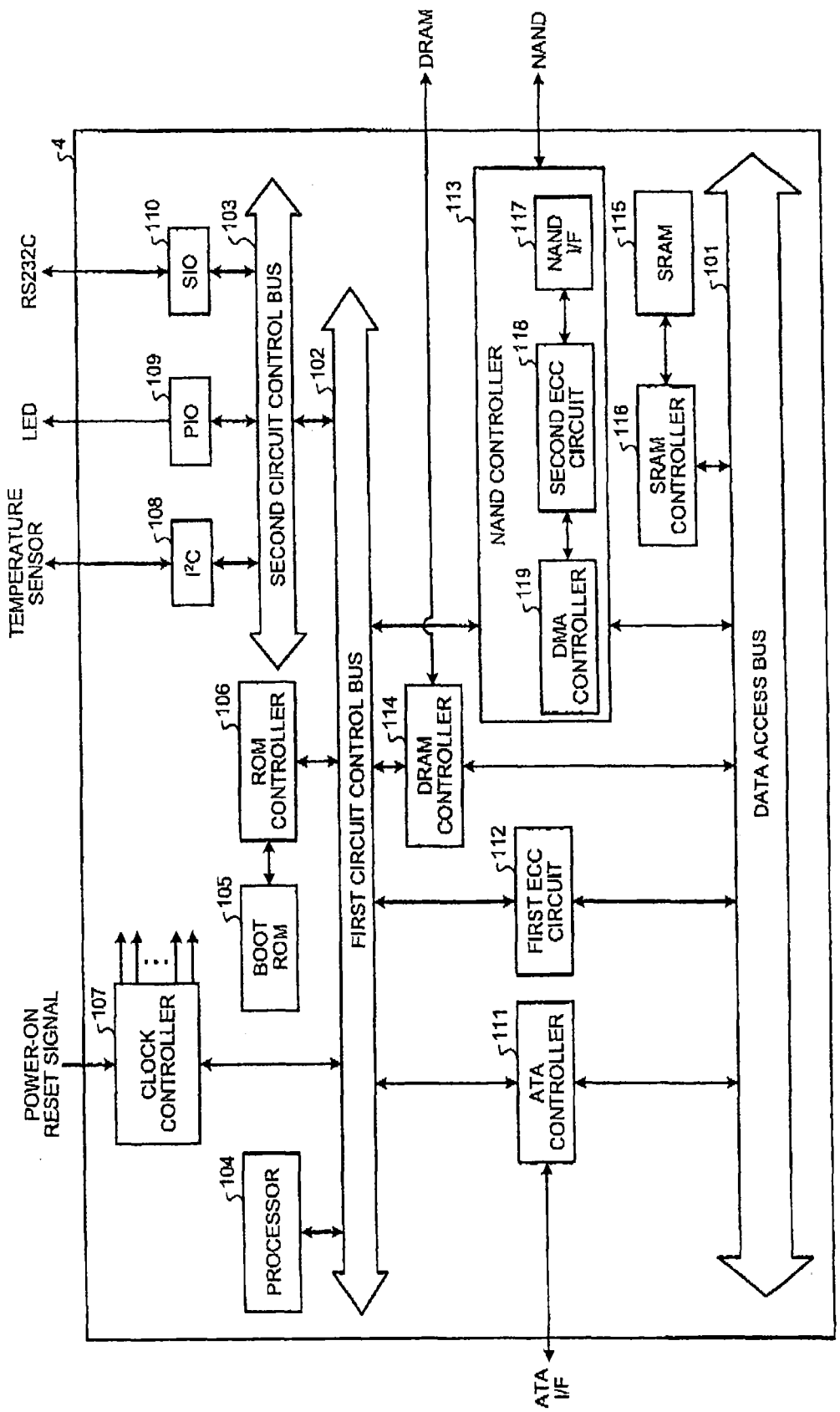
FIG. 3 is a block diagram of a hardware internal configuration example of a drive control circuit.

FIG. 3 is a block diagram of a hardware internal configuration example of the drive control circuit 4. The drive control circuit 4 includes a data access bus 101, a first circuit control bus 102, and a second circuit control bus 103. A processor 104 that controls the entire drive control circuit 4 is connected to the first circuit control bus 102. A boot ROM 105, in which a boot program for booting respective management programs (FW: firmware) stored in the NAND memory 10 is stored, is connected to the first circuit control bus 102 via a ROM controller 106. A clock controller 107 that receives the power-on rest signal from the power supply circuit 5 shown in FIG. 1 and supplies a reset signal and a clock signal to the respective units is connected to the first circuit control bus 102.

The second circuit control bus 103 is connected to the first circuit control bus 102. An I²C circuit 108 for receiving data from the temperature sensor 7 shown in FIG. 1, a parallel IO (PIO) circuit 109 that supplies a signal for status display to the LED for state display 6, and a serial IO (SIO) circuit 110 that controls the RS232C I/F 3 are connected to the second circuit control bus 103.

An ATA interface controller (ATA controller) 111, a first ECC (Error Checking and Correction) circuit 112, a NAND controller 113, and a DRAM controller 114 are connected to both the data access bus 101 and the first circuit control bus 102. The ATA controller 111 transmits data to and receives data from the host apparatus 1 via the ATA interface 2. An SRAM 115 used as a data work area and a firm ware expansion area is connected to the data access bus 101 via an SRAM controller 116. When the firmware stored in the NAND memory 10 is started, the firmware is transferred to the SRAM 115 by the boot program stored in the boot ROM 105.

The NAND controller 113 includes a NAND I/F 117 that performs interface processing for interface with the NAND memory 10, a second ECC circuit 118, and a DMA controller for DMA transfer control 119 that performs access control between the NAND memory 10 and the DRAM 20. The second ECC circuit 118 performs encode of a second correction code and performs encode and decode of a first error correction code. The first ECC circuit 112 performs decode of a second error correction code. The first error correction code and the second error correction code are, for example, a hamming code, a BCH (Bose Chaudhuri Hocqenghem) code, an RS (Reed Solomon) code, or an LDPC (Low Density Parity Check) code. Correction ability of the second error correction code is higher than correction ability of the first error correction code.

As shown in FIGS. 1 and 3, in the NAND memory 10, the four parallel operation elements 10a to 10d are connected in parallel to the NAND controller 112 in the drive control circuit 4 via four eight-bit channels (4 ch). Three kinds of access modes explained below are provided according to a combination of whether the four parallel operation elements 10a to 10d are independently actuated or actuated in parallel and whether a double speed mode (Multi Page Program/Multi Page Read/Multi Block Erase) provided in the NAND memory chip is used.

(1) 8-Bit Normal Mode

An 8-bit normal mode is a mode for actuating only one channel and performing data transfer in 8-bit units. Writing and readout are performed in the physical page size (4 kB). Erasing is performed in the physical block size (512 kB). One logical block is associated with one physical block and a logical block size is 512 kB.

(2) 32-Bit Normal Mode

A 32-bit normal mode is a mode for actuating four channels in parallel and performing data transfer in 32-bit units. Writing and readout are performed in the physical page size×4 (16 kB). Erasing is performed in the physical block size×4 (2 MB). One logical block is associated with four physical blocks and a logical block size is 2 MB.

(3) 32-Bit Double Speed Mode

A 32-bit double speed mode is a mode for actuating four channels in parallel and performing writing and readout using a double speed mode of the NAND memory chip. Writing and readout are performed in the physical page size×4×2 (32 kB).

Erasing is performed in the physical block size×4×2 (4 MB). One logical block is associated with eight physical blocks and a logical block size is 4 MB.

In the 32-bit normal mode or the 32-bit double speed mode for actuating four channels in parallel, four or eight physical blocks operating in parallel are erasing units for the NAND memory 10 and four or eight physical pages operating in parallel are writing units and readout units for the NAND memory 10. In operations explained below, basically, the 32-bit double speed mode is used. For example, it is assumed that one logical block=4 MB=$2^i$ tracks=$2^j$ pages=$2^k$ clusters=$2^l$ sectors (i, j, k, and l are natural numbers and a relation of i<j<k<l holds).

A logical block accessed in the 32-bit double speed mode is accessed in 4 MB units. Eight (2×4ch) physical blocks (one physical block=512 kB) are associated with the logical block. When the bad block BB managed in physical block units is detected, the bad block BB is unusable. Therefore, in such a case, a combination of the eight physical blocks associated with the logical block is changed to not include the bad block BB.

Figure 4:
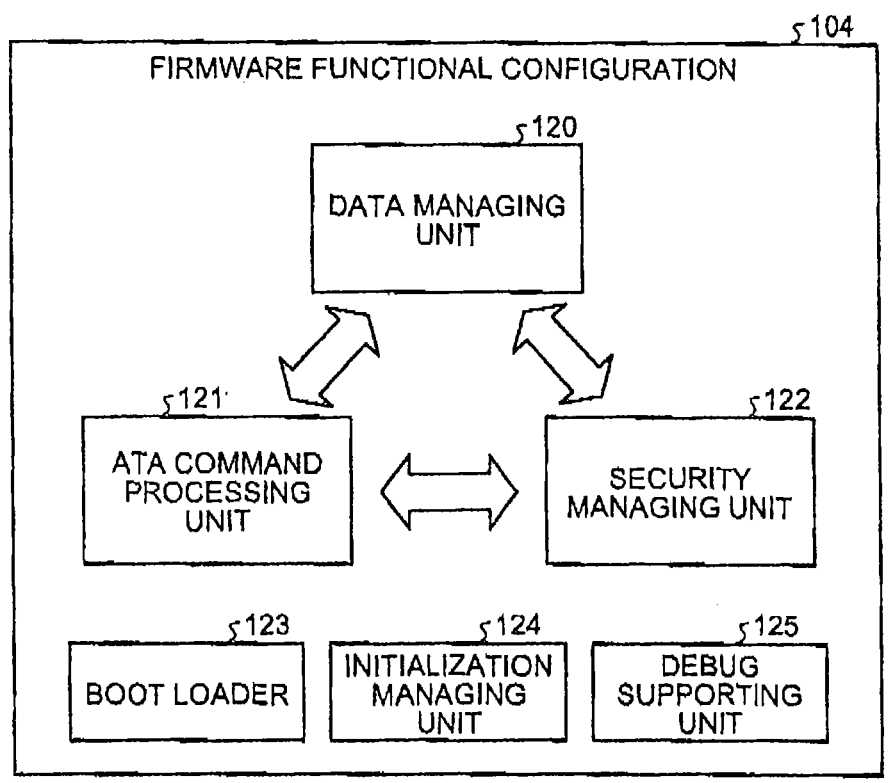
FIG. 4 is a block diagram of a functional configuration example of a processor.

FIG. 4 is a block diagram of a functional configuration example of firmware realized by the processor 104. Functions of the firmware realized by the processor 104 are roughly classified into a data managing unit 120, an ATA-command processing unit 121, a security managing unit 122, a boot loader 123, an initialization managing unit 124, and a debug supporting unit 125.

The data managing unit 120 controls data transfer between the NAND memory 10 and the DRAM 20 and various functions concerning the NAND memory 10 via the NAND controller 112 and the first ECC circuit 114. The ATA-command processing unit 121 performs data transfer processing between the DRAM 20 and the host apparatus 1 in cooperation with the data managing unit 120 via the ATA controller 110 and the DRAM controller 113. The security managing unit 122 manages various kinds of security information in cooperation with the data managing unit 120 and the ATA-command processing unit 121.

The boot loader 123 loads, when a power supply is turned on, the management programs (firmware) from the NAND memory 10 to the SRAM 120. The initialization managing unit 124 performs initialization of respective controllers and circuits in the drive control circuit 4. The debug supporting unit 125 processes data for debug supplied from the outside via the RS232C interface. The data managing unit 120, the ATA-command processing unit 121, and the security managing unit 122 are mainly functional units realized by the processor 104 executing the management programs stored in the SRAM 114.

In this embodiment, functions realized by the data managing unit 120 are mainly explained. The data managing unit 120 performs, for example, provision of functions that the ATA-command processing unit 121 requests the NAND memory 10 and the DRAM 20 as storage devices to provide (in response to various commands such as a Write request, a Cache Flush request, and a Read request from the host apparatus), management of a correspondence relation between a host address region and the NAND memory 10 and protection of management information, provision of fast and highly efficient data readout and writing functions using the DRAM 20 and the NAND 10, ensuring of reliability of the NAND memory 10.

Figure 5:
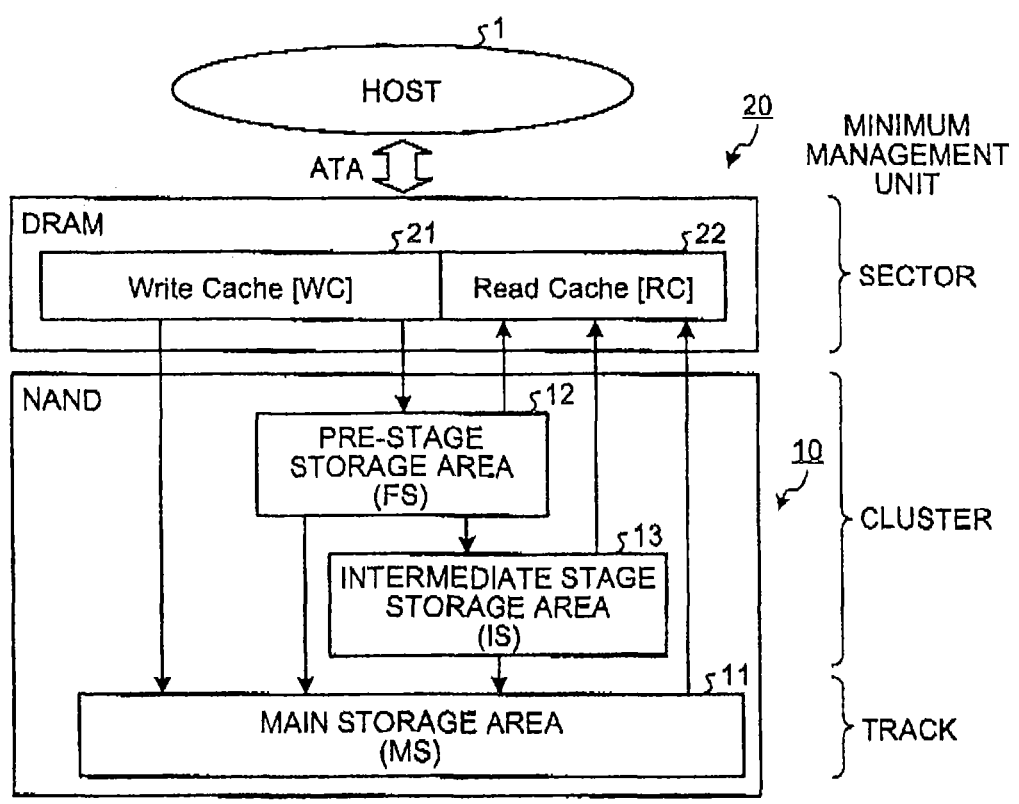
FIG. 5 is a block diagram of a functional configuration formed in a NAND memory and a DRAM.

FIG. 5 is a diagram of functional blocks formed in the NAND memory 10 and the DRAM 20. A write cache (WC) 21 and a read cache (RC) 22 configured on the DRAM 20 are interposed between the host 1 and the NAND memory 10.

The WC 21 temporarily stores Write data from the host apparatus 1. The RC 22 temporarily stores Read data from the NAND memory 10. The WC 21 and the RC 22 may be configured on different DRAM chips or other kind of memory chips described above.

The logical blocks in the NAND memory 10 are allocated to respective management areas of a pre-stage storage area (FS: Front Storage) 12, an intermediate stage storage area (IS: Intermediate Storage) 13, and a main storage area (MS: Main Storage) 11 by the data managing unit 120 in order to reduce an amount of erasing for the NAND memory 10 during writing. The FS 12 manages data from the WC 21 in cluster units, i.e., "small units" and stores small data (fine grained data) for a short period. The IS 13 manages data overflowing from the FS 12 in cluster units, i.e., "small units" and stores small data (fine grained data) for a long period. The MS 11 stores data from the WC 21, the FS 12, and the IS 13 in track units, i.e., "large units" and stores large data (coarse grained data) for a long period. For example, storage capacities are in a relation of MS>IS and FS>WC.

When the small management unit is applied to all the storage areas of the NAND memory 10, a size of a management table explained later is enlarged and does not fit in the DRAM 20. Therefore, the respective storages of the NAND memory 10 are configured to manage, in small management units, only data just written recently and small data with low efficiency of writing in the NAND memory 10. The techniques using the "small units" together with the "large units" in the SSD 100 are described in the International Application No. PCT2008/JP/073950, the entire contents of which are incorporated herein by reference.

Figure 6:
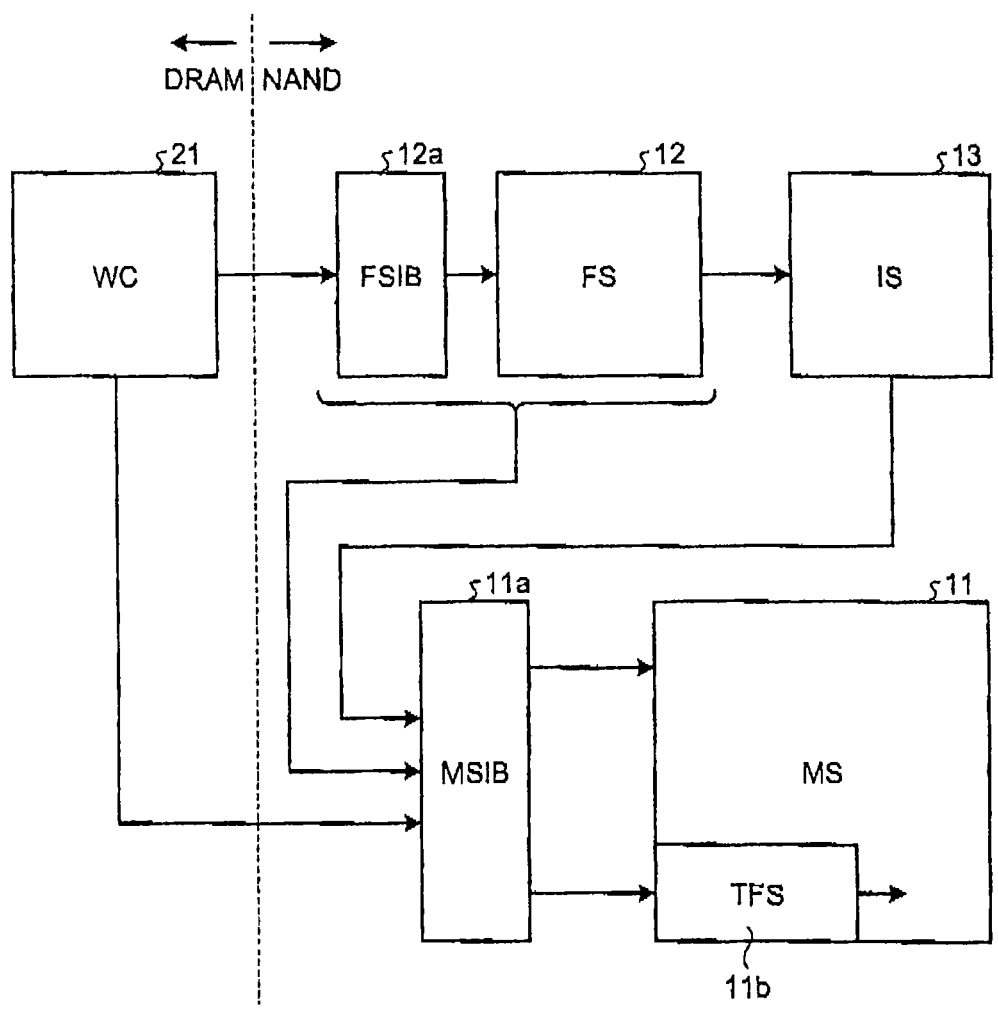
FIG. 6 is a detailed functional block diagram related to write processing from a WC to the NAND memory.

FIG. 6 is a more detailed functional block diagram related to write processing (WR processing) from the WC 21 to the NAND memory 10. An FS input buffer (FSIB) 12a that buffers data from the WC 21 is provided at a pre-stage of the FS 12. An MS input buffer (MSIB) 11a that buffers data from the WC 21, the FS 12, or the IS 13 is provided at a pre-stage of the MS 11. A track pre-stage storage area (TFS) 11b is provided in the MS 11. The TFS 11b is a buffer that has the FIFO (First in First out) structure interposed between the MSIB 11a and the MS 11. Data recorded in the TFS 11b is data with an update frequency higher than that of data recorded in the MS 11. Any of the logical blocks in the NAND memory 10 is allocated to the MS 11, the MSIB 11a, the TFS 11b, the FS 12, the FSIB 12a, and the IS 13.

Figure 7:
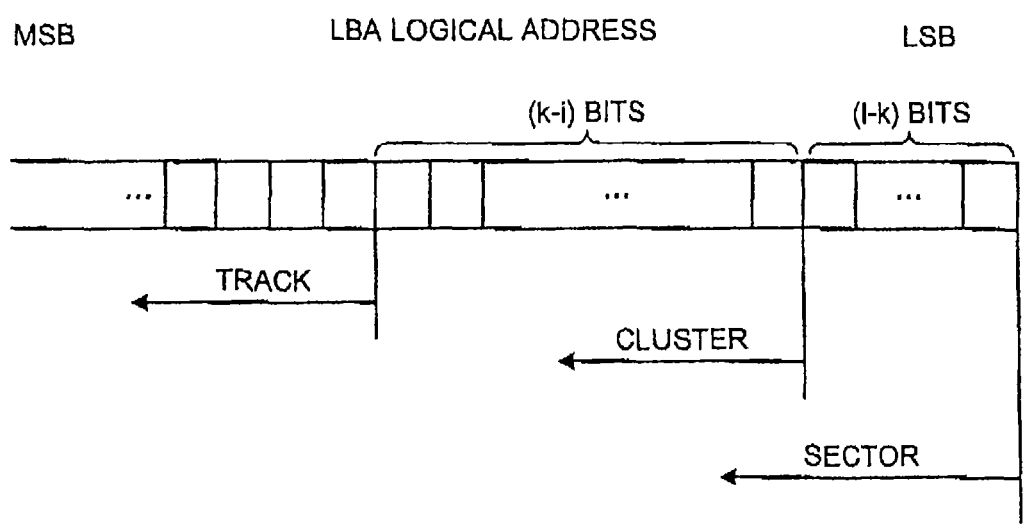
FIG. 7 is a diagram of an LBA logical address.

Specific functional configurations of the respective components shown in FIGS. 5 and 6 are explained in detail. When the host apparatus 1 performs Read or Write for the SSD 100, the host apparatus 1 inputs LBA (Logical Block Addressing) as a logical address via the ATA interface. As shown in FIG. 7, the LBA is a logical address in which serial numbers from 0 are attached to sectors (size: 512 B). In this embodiment, as management units for the WC 21, the RC 22, the FS 12, the IS 13, and the MS 11, which are the components shown in FIG. 5, a logical cluster address formed of a bit string equal to or higher in order than a low-order (l−k+1)th bit of the LBA and a logical track address formed of bit strings equal to or higher in order than a low-order (l−i+1)th bit of the LBA are defined. One cluster=$2^{(l-k)}$ sectors and one track=$2^{(k-i)}$ clusters. Read cache (RC) 22

The RC 22 is explained. The RC 22 is an area for temporarily storing, in response to a Read request from the ATA-command processing unit 121, Read data from the NAND memory 10 (the FS 12, the IS 13, and the MS 11). In this embodiment, the RC 22 is managed in, for example, an m-line/n-way (m is a natural number equal to or larger than $2^{(k-i)}$ and n is a natural number equal to or larger than 2) set associative system and can store data for one cluster in one entry. A line is determined by LSB (k−i) bits of the logical cluster address. The RC 22 can be managed in a full-associative system or can be managed in a simple FIFO system.

Write Cache (WC) 21

The WC 21 is explained. The WC 21 is an area for temporarily storing, in response to a Write request from the ATA-command processing unit 121, Write data from the host apparatus 1. The WC 21 is managed in the m-line/n-way (m is a natural number equal to or larger than $2^{(k-i)}$ and n is a natural number equal to or larger than 2) set associative system and can store data for one cluster in one entry. A line is determined by LSB (k−i) bits of the logical cluster address. For example, a writable way is searched in order from a way 1 to a way n. Tracks registered in the WC 21 are managed in LRU (Least Recently Used) by the FIFO structure of a WC track management table 24 explained later such that the order of earliest update is known. The WC 21 can be managed by the full-associative system. The WC 21 can be different from the RC 22 in the number of lines and the number of ways.

Data written according to the Write request is once stored on the WC 21. A method of determining data to be flushed from the WC 21 to the NAND 10 complies with rules explained below.

(i) When a writable way in a line determined by a tag is a last (in this embodiment, nth) free way, i.e., when the last free way is used, a track updated earliest based on an LRU among tracks registered in the line is decided to be flushed.

(ii) When the number of different tracks registered in the WC 21 exceeds a predetermined permissible number, tracks with the numbers of clusters smaller than a predetermined number in a WC are decided to be flushed in order of LRUs.

Tracks to be flushed are determined according to the policies explained above. In flushing the tracks, all data included in an identical track is flushed. When an amount of data to be flushed exceeds, for example, 50% of a track size, the data is flushed to the MS 11. When an amount of data to be flushed does not exceed, for example, 50% of a track size, the data is flushed to the FS 12.

When track flush is performed under the condition (i) and the data is flushed to the MS 11, a track satisfying a condition that an amount of data to be flushed exceeds 50% of a track size among the tracks in the WC 21 is selected and added to flush candidates according to the policy (i) until the number of tracks to be flushed reaches $2^i$ (when the number of tracks is equal to or larger than $2^i$ from the beginning, until the number of tracks reaches $2^{i+1}$). In other words, when the number of tracks to be flushed is smaller than $2^i$, tracks having valid clusters more than $2^{(k-i-1)}$ are selected in order from the oldest track in the WC and added to the flush candidates until the number of tracks reaches $2^i$.

When track flush is performed under the condition (i) and the track is flushed to the FS 12, a track satisfying the condition that an amount of data to be flushed does not exceed 50% of a track size is selected in order of LRUs among the tracks in the WC 21 and clusters of the track are added to the flush candidates until the number of clusters to be flushed reaches $2^k$. In other words, clusters are extracted from tracks having $2^{(k-i-1)}$ or less valid clusters by tracing the tracks in the WC in order from the oldest one and, when the number of valid clusters reaches $2^k$, the clusters are flushed to the FSIB 12a in logical block units. However, when $2^k$ valid clusters are not found, clusters are flushed to the FSIB 12a in logical page units. A threshold of the number of valid clusters for determining whether the flush to the FS 12 is performed in logical block units or logical page units is not limited to a value for one logical block, i.e., $2^k$ and can be a value slightly smaller than the value for one logical block.

In a Cache Flush request from the ATA-command processing unit 121, all contents of the WC 21 are flushed to the FS 12 or the MS 11 under conditions same as the above (when an amount of data to be flushed exceeds 50% of a track size, the data is flushed to the MS 11 and, when the amount of data does not exceed 50%, the data is flushed to the FS 12).

Pre-Stage Storage Area (FS) 12

The FS 12 is explained. The FS 12 adapts an FIFO structure of logical block units in which data is managed in cluster units. The FS 12 is a buffer for regarding that data passing through the FS 12 has an update frequency higher than that of the IS 13 at the post stage. In other words, in the FIFO structure of the FS 12, a valid cluster (a latest cluster) passing through the FIFO is invalidated when rewriting in the same address from the host is performed. Therefore, the cluster passing through the FS 12 can be regarded as having an update frequency higher than that of a cluster flushed from the FS 12 to the IS 13 or the MS 11.

By providing the FS 12, likelihood of mixing of data with a high update frequency in compaction processing in the IS 13 at the post stage is reduced. When the number of valid clusters of a logical block is reduced to 0 by the invalidation, the logical block is released and allocated to the free block FB. When the logical block in the FS 12 is invalidated, a new free block FB is acquired and allocated to the FS 12.

When cluster flush from the WC 21 to the FS 12 is performed, the cluster is written in a logical block allocated to the FSIB 12a. When logical blocks, for which writing of all logical pages is completed, are present in the FSIB 12a, the logical blocks are moved from the FSIB 12a to the FS 12 by CIB processing explained later. In moving the logical blocks from the FSIB 12a to the FS 12, when the number of logical blocks of the FS 12 exceeds a predetermined upper limit value allowed for the FS 12, an oldest logical block is flushed from the FS 12 to the IS 13 or the MS 11. For example, a track with a ratio of valid clusters in the track equal to or larger than 50% is written in the MS 11 (the TFS 11b) and a logical block in which the valid cluster remains is moved to the IS 13.

As the data movement between components in the NAND memory 10, there are two ways, i.e., Move and Copy. Move is a method of simply performing relocation of a pointer of a management table explained later and not performing actual rewriting of data. Copy is a method of actually rewriting data stored in one component to the other component in page units, track units, or block units.

Intermediate Stage Storage Area (IS) 13

The IS 13 is explained. In the IS 13, management of data is performed in cluster units in the same manner as the FS 12. Data stored in the IS 13 can be regarded as data with a low update frequency. When movement (Move) of a logical block from the FS 12 to the IS 13, i.e., flush of the logical block from the FS 12 is performed, a logical block as an flush object, which is previously a management object of the FS 12, is changed to a management object of the IS 13 by the relocation of the pointer. According to the movement of the logical block from the FS 12 to the IS 13, when the number of blocks of the IS 13 exceeds a predetermined upper limit value allowed for the IS 13, i.e., when the number of writable free blocks FB in the IS decreases to be smaller than a threshold, data flush from the IS 13 to the MS 11 and compaction processing are executed. The number of blocks of the IS 13 is returned to a specified value.

The IS 13 executes flush processing and compaction processing explained below using the number of valid clusters in a track.

Tracks are sorted in order of the number of valid clusters× valid cluster coefficient (the number weighted according to whether a track is present in a logical block in which an invalid track is present in the MS 11; the number is larger when the invalid track is present than when the invalid track is not present). $2^{i+1}$ tracks (for two logical blocks) with a large value of a product are collected, increased to be natural number times as large as a logical block size, and flushed to the MSIB 11*a*.

When a total number of valid clusters of two logical blocks with a smallest number of valid clusters is, for example, equal to or larger than $2^k$ (for one logical block), which is a predetermined set value, the step explained above is repeated (to perform the step until a free block FB can be created from two logical blocks in the IS).

$2^k$ clusters are collected in order from logical blocks with a smallest number of valid clusters and compaction is performed in the IS.

Here, the two logical blocks with the smallest number of valid clusters are selected. However, the number is not limited to two and only has to be a number equal to or larger than two. The predetermined set value only has to be equal to or smaller than the number of clusters that can be stored in the number of logical blocks smaller than the number of selected logical blocks by one.

Main Storage Area (MS) 11

The MS 11 is explained. In the MS 11, management of data is performed in track units. Data stored in the MS 11 can be regarded as having a low update frequency. When Copy or Move of track from the WC 21, the FS 12, or the IS 13 to the MS 11 is performed, the track is written in a logical block allocated to the MSIB 11*a*. On the other hand, when only data (clusters) in a part of the track is written from the WC 21, the FS 12, or the IS 13, track padding explained later for merging existing track in the MS 11 and flushed data to create new track and, then, writing the created track in the MSIB 11*a* is performed. When invalid tracks are accumulated in the MS 11 and the number of logical blocks allocated to the MS 11 exceeds the upper limit of the number of blocks allowed for the MS 11, compaction processing is performed to create a free block FB.

As the compaction processing of the MS 11, for example, a method explained below with attention paid to only the number of valid tracks in a logical block is carried out.

Logical blocks are selected from one with a smallest number of valid tracks until a free block FB can be created by combining invalid tracks.

Compaction is executed for tracks stored in the selected logical blocks. The compaction involves passive merge explained later for collecting clusters in the WC 21, the FS 12, and the IS 13 and merging with the tracks stored in the selected logical blocks.

A logical block in which $2^i$ tracks can be integrated is output to the TFS 11*b* ($2^i$ track MS compaction) and tracks smaller in number than $2^i$ are output to the MSIB 11*a* (less than $2^i$ track compaction) to create a larger number of free blocks FB.

The TFS 11*b* adapts an FIFO structure of logical block units in which data is managed in track units. The TFS 11*b* is a buffer for regarding that data passing through the TFS 11*b* has an update frequency higher than that of the MS 11 at the post stage. In other words, in the FIFO structure of the TFS 11*b*, a valid track (a latest track) passing through the FIFO is invalidated when rewriting in the same address from the host is performed. Therefore, a track passing through the TFS 11*b* can be regarded as having an update frequency higher than that of a track flushed from the TFS 11*b* to the MS 11. When the track is equal to the logical block size, the compaction processing in the MS 11 is unnecessary. It is unnecessary to set the storage area used as the TFS 11*b*.

Figure 8:
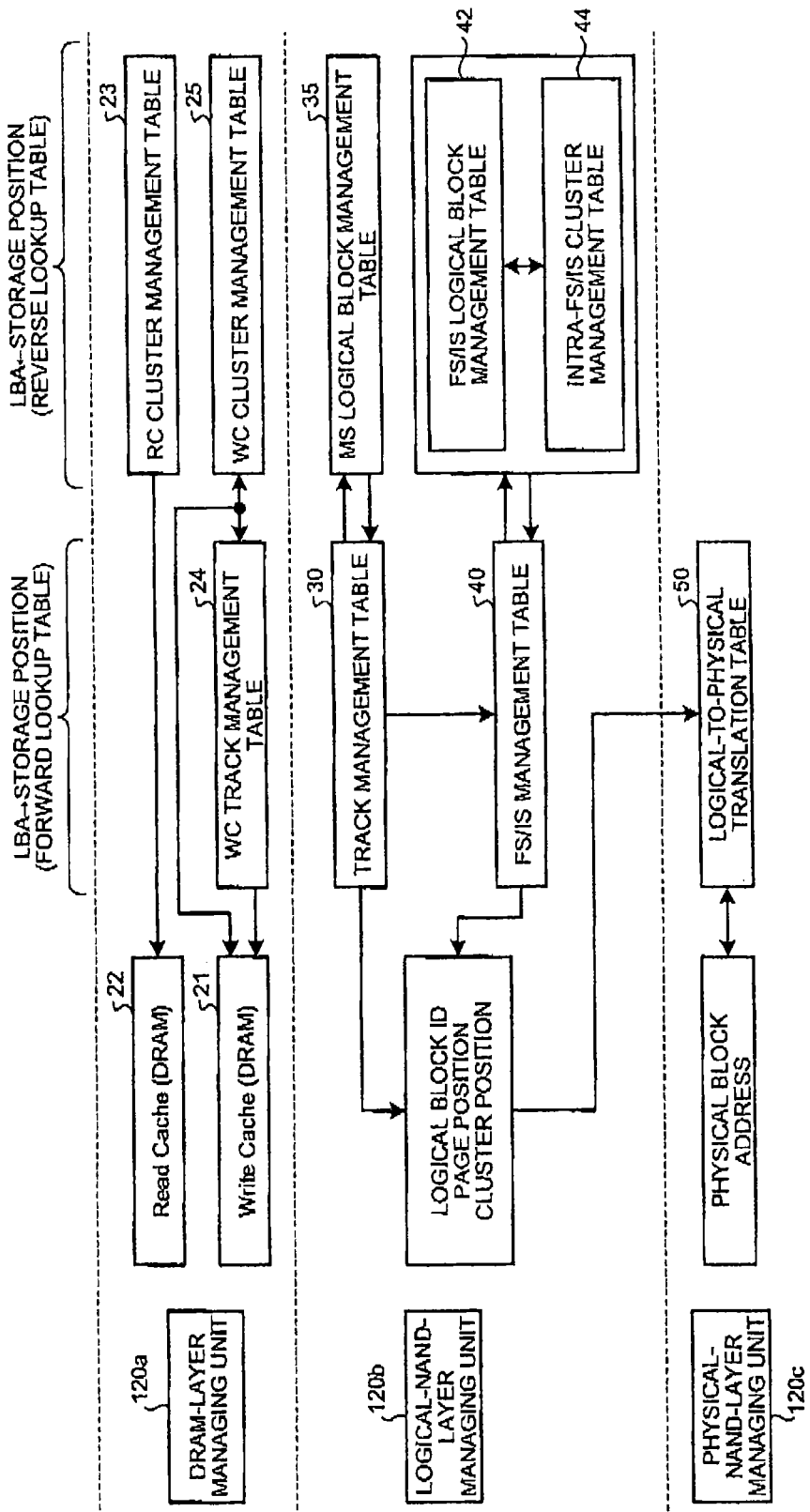
FIG. 8 is a diagram of a configuration example of a management table in a data managing unit.

FIG. 8 is a diagram of a management table for the data managing unit 120 to control and manage the respective components shown in FIGS. 5 and 6. The data managing unit 120 has, as explained above, the function of bridging the ATA-command processing unit 121 and the NAND memory 10 and includes a DRAM-layer managing unit 120*a* that performs management of data stored in the DRAM 20, a logical-NAND-layer managing unit 120*b* that performs management of data stored in the NAND memory 10, and a physical-NAND-layer managing unit 120*c* that manages the NAND memory 10 as a physical storage device. An RC cluster management table 23, a WC track management table 24, and a WC cluster management table 25 are controlled by the DRAM-layer managing unit 120*a*. A track management table 30, an FS/IS management table 40, an MS logical block management table 35, an FS/IS logical block management table 42, and an intra-FS/IS cluster management table 44 are managed by the logical-NAND-layer managing unit 120*b*. A logical-to-physical translation table 50 is managed by the physical-NAND-layer managing unit 120*c*.

The RC 22 is managed by the RC cluster management table 23, which is a reverse lookup table. In the reverse lookup table, from a position of a storage device, a logical address stored in the position can be searched. The WC 21 is managed by the WC cluster management table 25, which is a reverse lookup table, and the WC track management table 24, which is a forward lookup table. In the forward lookup table, from a logical address, a position of a storage device in which data corresponding to the logical address is present can be searched.

Logical addresses of the FS 12 (the FSIB 12*a*), the IS 13, and the MS 11 (the TFS 11*b* and the MSIB 11*a*) in the NAND memory 10 are managed by the track management table 30, the FS/IS management table 40, the MS logical block management table 35, the FS/IS logical block management table 42, and the intra-FS/IS cluster management table 44. In the FS 12 (the FSIB 12*a*), the IS 13, and the MS 11 (the TFS 11*b* and MSIB 11*a*) in the NAND memory 10, conversion of a logical address and a physical address is performed of the logical-to-physical translation table 50. These management tables are stored in an area on the NAND memory 10 and read onto the DRAM 20 from the NAND memory 10 during initialization of the SSD 100.

RC Cluster Management Table 23 (Reverse Lookup)

The RC cluster management table 23 is explained with reference to FIG. 9. As explained above, the RC 22 is managed in the n-way set associative system indexed by logical cluster address LSB (k−i) bits. The RC cluster management table 23 is a table for managing tags of respective entries of the RC (the cluster size×m-line×n-way) 22. Each of the tags includes a state flag 23*a* including a plurality of bits and a logical track address 23*b*. The state flag 23*a* includes, besides a valid bit indicating whether the entry may be used (valid/invalid), for example, a bit indicating whether the entry is on a wait for readout from the NAND memory 10 and a bit indicating whether the entry is on a wait for readout to the ATA-command processing unit 121. The RC cluster management table 23 functions as a reverse lookup table for searching for a logical track address coinciding with LBA from a tag storage position on the DRAM 20.

WC Cluster Management Table 25 (Reverse Lookup)

The WC cluster management table 25 is explained with reference to FIG. 10. As explained above, the WC 21 is managed in the n-way set associative system indexed by logical cluster address LSB (k–i) bits. The WC cluster management table 25 is a table for managing tags of respective entries of the WC (the cluster size×m-line×n-way) 21. Each of the tags includes a state flag 25a of a plurality of bits, a sector position bitmap 25b, and a logical track address 25c.

The state flag 25a includes, besides a valid bit indicating whether the entry may be used (valid/invalid), for example, a bit indicating whether the entry is on a wait for flush to the NAND memory 10 and a bit indicating whether the entry is on a wait for writing from the ATA-command processing unit 121. The sector position bitmap 25b indicates which of $2^{(l-k)}$ sectors included in one cluster stores valid data by expanding the sectors into $2^{(l-k)}$ bits. With the sector position bitmap 25b, management in sector units same as the LBA can be performed in the WC 21. The WC cluster management table 25 functions as a reverse lookup table for searching for a logical track address coinciding with the LBA from a tag storage position on the DRAM 20.

WC Track Management Table 24 (Forward Lookup)

Figure 11:
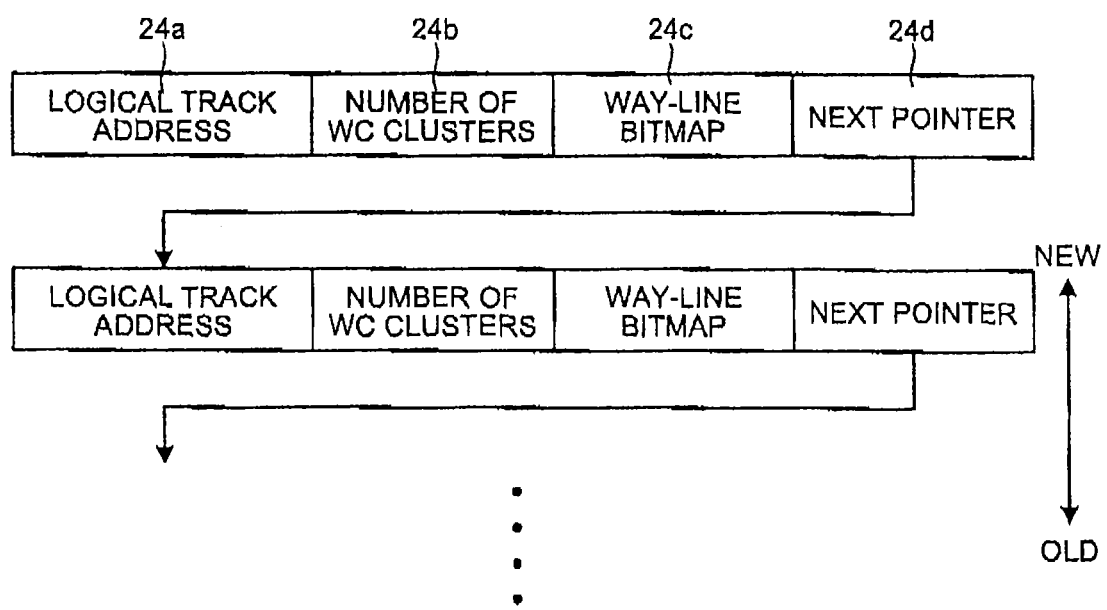
FIG. 11 is a diagram of an example of a WC track management table.

The WC track management table 24 is explained with reference to FIG. 11. The WC track management table 24 is a table for managing information in which clusters stored on the WC 21 are collected in track units and represents the order (LRU) of registration in the WC 21 among the tracks using the linked list structure having an FIFO-like function. The LRU can be represented by the order updated last in the WC 21. An entry of each list includes a logical track address 24a, the number of valid clusters 24b in the WC 21 included in the logical track address, a way-line bitmap 24c, and a next pointer 24d indicating a pointer to the next entry. The WC track management table 24 functions as a forward lookup table because required information is obtained from the logical track address 24a.

The way-line bitmap 24c is map information indicating in which of m×n entries in the WC 21 a valid cluster included in the logical track address in the WC 21 is stored. The Valid bit is "1" in an entry in which the valid cluster is stored. The way-line bitmap 24c includes, for example, (one bit (valid)+$\log_2 n$ bits (n-way))×m bits (m-line). The WC track management table 24 has the linked list structure. Only information concerning the logical track address present in the WC 21 is entered.

Track Management Table 30 (Forward Lookup)

The track management table 30 is explained with reference to FIG. 12. The track management table 30 is a table for managing a logical data position on the MS 11 in logical track address units. When data is stored in the FS 12 or the IS 13 in cluster units, the track management table 30 stores basic information concerning the data and a pointer to detailed information. The track management table 30 is configured in an array format having a logical track address 30a as an index. Each entry having the logical track address 30a as an index includes information such as a cluster bitmap 30b, a logical block ID 30c+an intra-logical block track position 30d, a cluster table pointer 30e, the number of FS clusters 30f, and the number of IS clusters 30g. The track management table 30 functions as a forward lookup table because, using a logical track address as an index, required information such as a logical block ID (corresponding to a storage device position) in which track corresponding to the logical track address is stored.

The cluster bitmap 30b is a bitmap obtained by dividing $2^{(k-i)}$ clusters belonging to one logical track address range into, for example, eight in ascending order of logical cluster addresses. Each of eight bits indicates whether clusters corresponding to $2^{(k-i-3)}$ cluster addresses are present in the MS 11 or present in the FS 12 or the IS 13. When the bit is "0", this indicates that the clusters as search objects are surely present in the MS 11. When the bit is "1", this indicates that the clusters are likely to be present in the FS 12 or the IS 13.

The logical block ID 30c is information for identifying a logical block ID in which track corresponding to the logical track address is stored. The intra-logical block track position 30d indicates a storage position of a track corresponding to the logical track address (30a) in the logical block designated by the logical block ID 30c. Because one logical block includes maximum $2^i$ valid tracks, the intra-logical block track position 30d identifies $2^i$ track positions using i bits.

The cluster table pointer 30e is a pointer to a top entry of each list of the FS/IS management table 40 having the linked list structure. In the search through the cluster bitmap 30b, when it is indicated that the cluster is likely to be present in the FS 12 or the IS 13, search through the FS/IS management table 40 is executed by using the cluster table pointer 30e. The number of FS clusters 30f indicates the number of valid clusters present in the FS 12. The number of IS clusters 30g indicates the number of valid clusters present in the IS 13.

FS/IS Management Table 40 (Forward Lookup)

The FS/IS management table 40 is explained with reference to FIG. 13. The FS/IS management table 40 is a table for managing a position of data stored in the FS 12 (including the FSIB 12a) or the IS 13 in logical cluster addresses. As shown in FIG. 13, the FS/IS management table 40 is formed in an independent linked list format for each logical track address. As explained above, a pointer to a top entry of each list is stored in a field of the cluster table pointer 30e of the track management table 30. In FIG. 13, linked lists for two logical track addresses are shown. Each entry includes a logical cluster address 40a, a logical block ID 40b, an intra-logical block cluster position 40c, an FS/IS block ID 40d, and a next pointer 40e. The FS/IS management table 40 functions as a forward lookup table because required information such as the logical block ID 40b and the intra-logical block cluster position 40c (corresponding to a storage device position) in which cluster corresponding to the logical cluster address 40a is stored is obtained from the logical cluster address 40a.

The logical block ID 40b is information for identifying a logical block ID in which cluster corresponding to the logical cluster address 40a is stored. The intra-logical block cluster position 40c indicates a storage position of a cluster corresponding to the logical cluster address 40a in a logical block designated by the logical block ID 40b. Because one logical block includes maximum $2^k$ valid clusters, the intra-logical block cluster position 40c identifies $2^k$ positions using k bits. An FS/IS block ID, which is an index of the FS/IS logical block management table 42 explained later, is registered in the FS/IS block ID 40d. The FS/IS block ID 40d is information for identifying a logical block belonging to the FS 12 or the IS 13. The FS/IS block ID 40d in the FS/IS management table 40 is registered for link to the FS/IS logical block management table 42 explained later. The next pointer 40e indicates a pointer to the next entry in the same list linked for each logical track address.

MS Logical Block Management Table 35 (Reverse Lookup)

The MS logical block management table 35 is explained with reference to FIG. 14. The MS logical block management table 35 is a table for unitarily managing information concerning a logical block used in the MS 11 (e.g., which track is stored and whether a track position is additionally recordable). In the MS logical block management table 35, information concerning logical blocks belonging to the FS 12 (including the FSIB 12) and the IS 13 is also registered. The MS logical block management table 35 is formed in an array format having a logical block ID 35a as an index. The number of entries can be 32 K entries at the maximum in the case of the 128 GB NAND memory 10. Each of the entries includes a track management pointer 35b for $2^i$ tracks, the number of valid tracks 35c, a writable top track 35d, and a valid flag 35e. The MS logical block management table 35 functions as a reverse lookup table because required information such as a logical track address stored in the logical block is obtained from the logical block ID 35a corresponding to a storage device position.

The track management pointer 35b stores a logical track address corresponding to each of $2^i$ track positions in the logical block designated by the logical block ID 35a. It is possible to search through the track management table 30 having the logical track address as an index using the logical track address. The number of valid tracks 35c indicates the number of valid tracks (maximum $2^i$) among tracks stored in the logical block designated by the logical block ID 35a. The writable top track position 35d indicates a top position (0 to $2^{i-1}$, $2^i$ when additional recording is finished) additionally recordable when the logical block designated by the logical block ID 35a is a block being additionally recorded. The valid flag 35e is "1" when the logical block entry is managed as the MS 11 (including the MSIB 11a). Here, "additional recording" means that writing cluster or track, in appending manner, to empty logical pages in a logical block.

FS/IS Logical Block Management Table 42 (Reverse Lookup)

Figure 15:
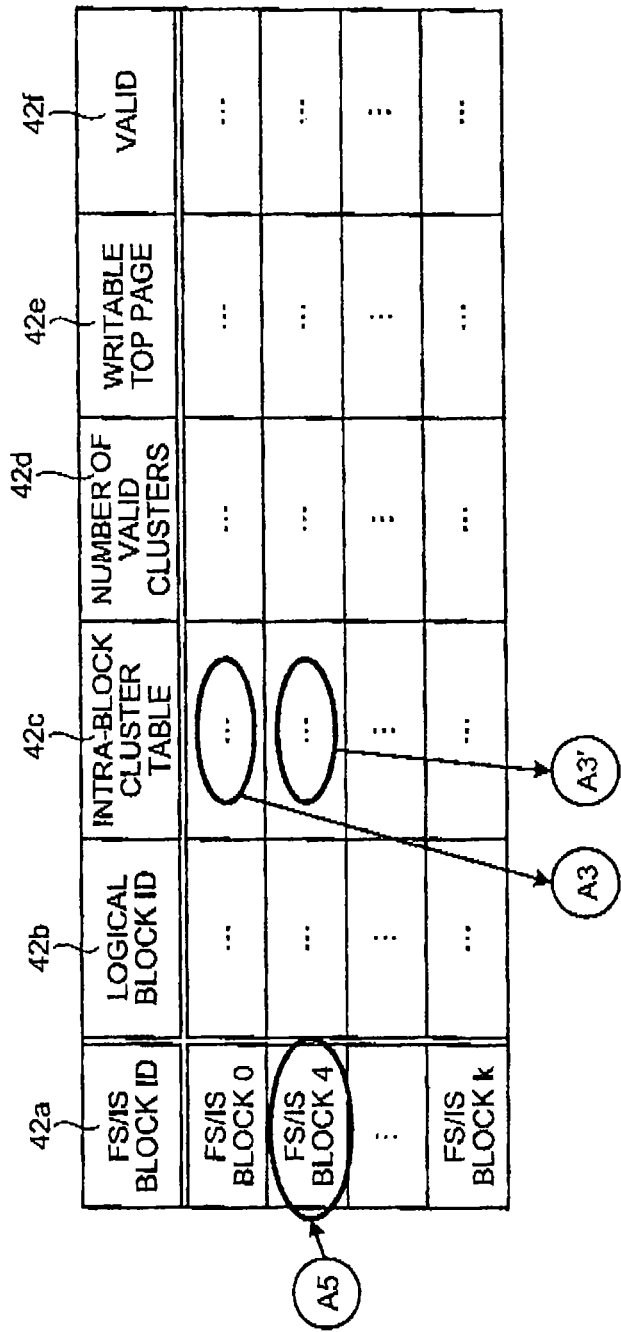
FIG. 15 is a diagram of an example of an FS/IS logical block management table.

The FS/IS logical block management table 42 is explained with reference to FIG. 15. The FS/IS logical block management table 42 is formed in an array format having an FS/IS block ID 42a as an index. The FS/IS logical block management table 42 is a table for managing information concerning a logical block used as the FS 12 or the IS 13 (correspondence to a logical block ID, an index to the intra-FS/IS cluster management table 44, whether the logical block is additionally recordable, etc.). The FS/IS logical block management table 42 is accessed by mainly using the FS/IS block ID 40d in the FS/IS management table 40. Each entry includes a logical block ID 42b, an intra-block cluster table 42c, the number of valid clusters 42d, a writable top page 42e, and a valid flag 42f. The MS logical block management table 35 functions as a reverse lookup table because required information such as cluster stored in the logical block is obtained from the FS/IS block ID 42 corresponding to a storage device position.

Logical block IDs corresponding to logical blocks belonging to the FS 12 (including the FSIB 12) and the IS 13 among logical blocks registered in the MS logical block management table 35 are registered in the logical block ID 42b. An index to the intra-FS/IS cluster management table 44 explained later indicating a logical cluster designated by which logical cluster address is registered in each cluster position in a logical block is registered in the intra-block cluster table 42c. The number of valid clusters 42d indicates the number of (maximum $2^k$) valid clusters among clusters stored in the logical block designated by the FS/IS block ID 42a. The writable top page position 42e indicates a top page position (0 to $2^{j-1}$, $2^j$ when additional recording is finished) additionally recordable when the logical block designated by the FS/IS block ID 42a is a block being additionally recorded. The valid flag 42f is "1" when the logical block entry is managed as the FS 12 (including the FSIB 12) or the IS 13.

Intra-FS/IS Cluster Management Table 44 (Reverse Lookup)

Figure 16:
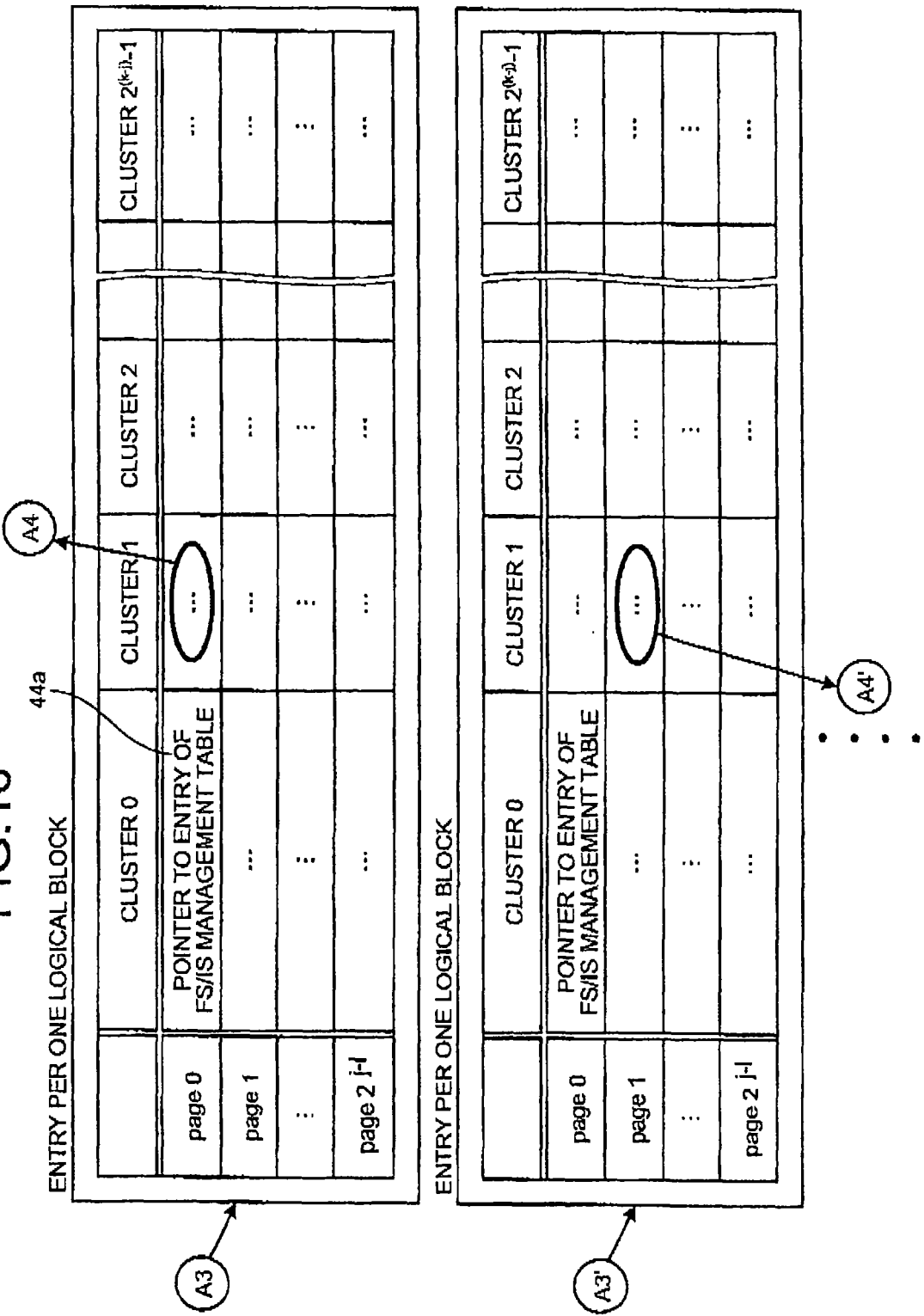
FIG. 16 is a diagram of an example of an intra-FS/IS cluster management table.

The intra-FS/IS cluster management table 44 is explained with reference to FIG. 16. The intra-FS/IS cluster management table 44 is a table indicating which cluster is recorded in each cluster position in a logical block used as the FS 12 or the IS 13. The intra-FS/IS cluster management table 44 has $2^j$ pages×$2^{(k-j)}$ clusters=$2^k$ entries per one logical block. Information corresponding to 0th to $2^k-1$th cluster positions among cluster positions in the logical block is arranged in continuous areas. Tables including the $2^k$ pieces of information are stored by the number equivalent to the number of logical blocks (P) belonging to the FS 12 and the IS 13. The intra-block cluster table 42c of the FS/IS logical block management table 42 is positional information (a pointer) for the P tables. A position of each entry 44a arranged in the continuous areas indicates a cluster position in one logical block. As content of the entry 44a, a pointer to a list including a logical cluster address managed by the FS/IS management table 40 is registered such that it is possible to identify which cluster is stored in the cluster position. In other words, the entry 44a does not indicate the top of a linked list. A pointer to one list including the logical cluster address in the linked list is registered in the entry 44a.

Logical-To-Physical Translation Table 50 (Forward Lookup)

The logical-to-physical translation table 50 is explained with reference to FIG. 17. The logical-to-physical translation table 50 is formed in an array format having a logical block ID 50a as an index. The number of entries can be maximum 32 K entries in the case of the 128 GB NAND memory 10. The logical-to-physical translation table 50 is a table for managing information concerning conversion between a logical block ID and a physical block ID and the life. Each of the entries includes a physical block address 50b, the number of times of erasing 50c, and the number of times of readout 50d. The logical-to-physical translation table 50 functions as a forward lookup table because required information such as a physical block ID (a physical block address) is obtained from a logical block ID.

The physical block address 50b indicates eight physical block IDs (physical block addresses) belonging to one logical block ID 50a. The number of times of erasing 50c indicates the number of times of erasing of the logical block ID. A bad block (BB) is managed in physical block (512 KB) units. However, the number of times of erasing is managed in one logical block (4 MB) units in the 32-bit double speed mode. The number of times of readout 50d indicates the number of times of readout of the logical block ID. The number of times of erasing 50c can be used in, for example, wear leveling processing for leveling the number of times of rewriting of a NAND-type flash memory. The number of times of readout 50d can be used in refresh processing for rewriting data stored in a physical block having deteriorated retention properties.

An example of the wear leveling processing is described in the International Application No. PCT/JP2008/066508 and No. PCT/JP2008/066507. An example of the refresh processing is described in the International Application No. PCT/JP2008/067597, the entire contents of which are incorporated herein by reference.

The management tables shown in FIG. 8 are collated by management object as explained below.

RC management: The RC cluster management table 23

WC management: The WC cluster management table 25 and the WC track management table 24

MS management: The track management table 30 and the MS logical block management table 35

FS/IS management: The track management table 30, the FS/IS management table 40, the MS logical block management table 35, the FS/IS logical block management table 42, and the intra-FS/IS cluster management table 44

The structure of an MS area including the MS 11, the MSIB 11a, and the TFS 11b is managed in an MS structure management table (not shown). Specifically, logical blocks and the like allocated to the MS 11, the MSIB 11*a*, and the TFS 11*b* are managed. The structure of an FS/IS area including the FS 12, the FSIB 12*a*, and the IS 13 is managed in an FS/IS structure management table (not shown). Specifically, logical blocks and the like allocated to the FS 12, the FSIB 12*a*, and the IS 13 are managed.

Read Processing

Figure 18:
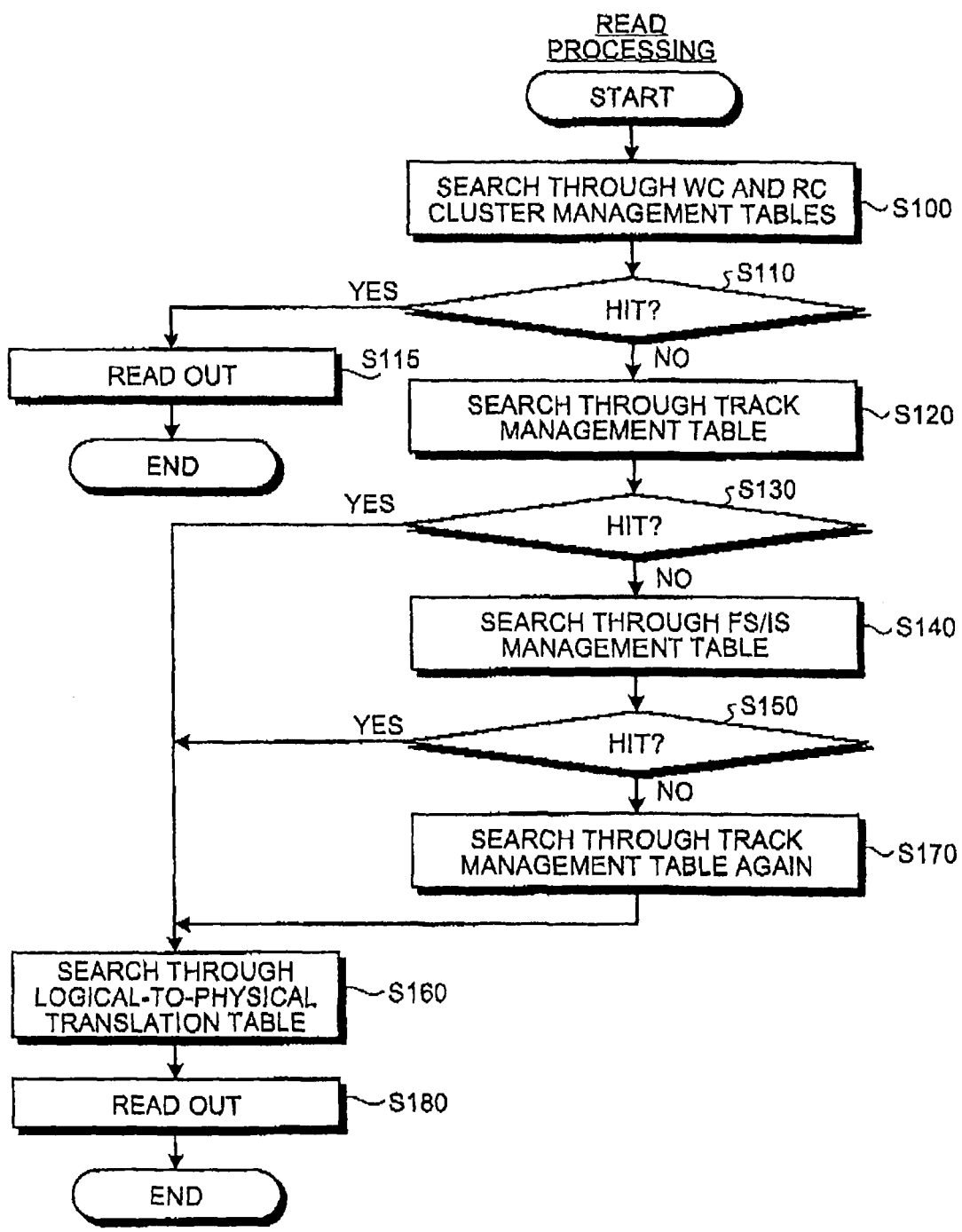
FIG. 18 is a flowchart of an operation example of readout processing.

Read processing is explained with reference to a flowchart shown in FIG. 18. When a Read command, LBA as a readout address, and a readout size are input from the ATA-command processing unit 121, the data managing unit 120 searches through the RC cluster management table 23 shown in FIG. 9 and the WC cluster management table 25 shown in FIG. 10 (step S100). Specifically, the data managing unit 120 selects lines corresponding to LSB (k−i) bits (see FIG. 7) of a logical cluster address of the LBA from the RC cluster management table 23 and the WC cluster management table 25 and compares logical track addresses 23*b* and 25*c* entered in each way of the selected lines with a logical track address of the LBA (step S110). When a way such that a logical track address entered in itself coincides with a logical track address of LBA is present, the data managing unit 120 regards this as cache hit. The data managing unit 120 reads out data of the WC 21 or the RC 22 corresponding to the hit line and way of the RC cluster management table 23 or the WC cluster management table 25 and sends the data to the ATA-command processing unit 121 (step S115).

When there is no hit in the RC 22 or the WC 21 (step S110), the data managing unit 120 searches in which part of the NAND memory 10 a cluster as a search object is stored. First, the data managing unit 120 searches through the track management table 30 shown in FIG. 12 (step S120). The track management table 30 is indexed by the logical track address 30*a*. Therefore, the data managing unit 120 checks only entries of the logical track address 30*a* coinciding with the logical track address designated by the LBA.

The data managing unit 120 selects a corresponding bit from the cluster bitmap 30*b* based on a logical cluster address of the LBA desired to be checked. When the corresponding bit indicates "0", this means that latest data of the cluster is surely present the MS (step S130). In this case, the data managing unit 120 obtains logical block ID and a track position in which the track is present from the logical block ID 30*c* and the intra-logical block track position 30*d* in the same entry of the logical track address 30*a*. The data managing unit 120 calculates an offset from the track position using LSB (k−i) bits of the logical cluster address of the LBA. Consequently, the data managing unit 120 can calculate position where cluster corresponding to the logical cluster address in the NAND memory 10 is stored. Specifically, the logical-NAND-layer managing unit 120*b* gives the logical block ID 30*c* and the intra-logical block position 30*d* acquired from the track management table 30 as explained above and the LSB (k−i) bits of the logical cluster address of the LBA to the physical-NAND-layer managing unit 120*c*.

The physical-NAND-layer managing unit 120*c* acquires a physical block address (a physical block ID) corresponding to the logical block ID 30*c* from the logical-to-physical translation table 50 shown in FIG. 17 having the logical block ID as an index (step S160). The data managing unit 120 calculates a track position (a track top position) in the acquired physical block ID from the intra-logical block track position 30*d* and further calculates, from the LSB (k−i) bits of the logical cluster address of the LBA, an offset from the calculated track top position in the physical block ID. Consequently, the data managing unit 120 can acquire cluster in the physical block. The data managing unit 120 sends the cluster acquired from the MS 11 of the NAND memory 10 to the ATA-command processing unit 121 via the RC 22 (step S180).

On the other hand, when the corresponding bit indicates "1" in the search through the cluster bitmap 30*b* based on the logical cluster address of the LBA, it is likely that the cluster is stored in the FS 12 or the IS 13 (step S130). In this case, the data managing unit 120 extracts an entry of the cluster table pointer 30*e* among relevant entries of the logical track address 30*a* in the track management table 30 and sequentially searches through linked lists corresponding to a relevant logical track address of the FS/IS management table 40 using this pointer (step S140). Specifically, the data managing unit 120 searches for an entry of the logical cluster address 40*a* coinciding with the logical cluster address of the LBA in the linked list of the relevant logical track address. When the coinciding entry of the logical cluster address 40*a* is present (step S150), the data managing unit 120 acquires the logical block ID 40*b* and the intra-logical block cluster position 40*c* in the coinciding list. In the same manner as explained above, the data managing unit 120 acquires the cluster in the physical block using the logical-to-physical translation table 50 (steps S160 and S180). Specifically, the data managing unit 120 acquires physical block addresses (physical block IDs) corresponding to the acquired logical block ID from the logical-to-physical translation table 50 (step S160) and calculates a cluster position of the acquired physical block ID from an intra-logical block cluster position acquired from an entry of the intra-logical block cluster position 40*c*. Consequently, the data managing unit 120 can acquire the cluster in the physical block. The data managing unit 120 sends the cluster acquired from the FS 12 or the IS 13 of the NAND memory 10 to the ATA-command processing unit 121 via the RC 22 (step S180).

When the cluster as the search object is not present in the search through the FS/IS management table 40 (step S150), the data managing unit 120 searches through the entries of the track management table 30 again and decides a position on the MS 11 (step S170).

Write Processing

Write processing is explained with reference to a flowchart shown in FIG. 19. Data written by a Write command is always once stored on the WC 21. Thereafter, the data is written in the NAND memory 10 according to conditions. In the write processing, it is likely that flush processing and compaction processing are performed. In this embodiment, the write processing is roughly divided into two stages of write cache flash processing (hereinafter, WCF processing) and clean input buffer processing (hereinafter, CIB processing). Steps S300 to S320 indicate processing from a Write request from the ATA-command processing unit 121 to the WCF processing. Step S330 to the last step indicate the CIB processing.

The WCF processing is processing for copying data in the WC 21 to the NAND memory 10 (the FSIB 12*a* of the FS 12 or the MSIB 11*a* of the MS 11). A Write request or a Cache Flush request alone from the ATA-command processing unit 121 can be completed only by this processing. This makes it possible to limit a delay in the started processing of the Write request of the ATA-command processing unit 121 to, at the maximum, time for writing in the NAND memory 10 equivalent to a capacity of the WC 21.

The CIB processing includes processing for moving the data in the FSIB 12*a* written by the WCF processing to the FS 12 and processing for moving the data in the MSIB 11*a* written by the WCF processing to the MS 11. When the CIB processing is started, it is likely that data movement among the components (the FS 12, the IS 13, the MS 11, etc.) in the NAND memory and compaction processing are performed in a chain-reacting manner. Time required for the overall processing substantially changes according to a state.

WCF Processing

First, details of the WCF processing are explained. When a Write command, LBA as a writing address, and a writing size is input from the ATA-command processing unit 121, the DRAM-layer managing unit 120a searches through the WC cluster management table 25 shown in FIG. 10 (steps S300 and S305). A state of the WC 21 is defined by the state flag 25a (e.g., 3 bits) of the WC cluster management table 25 shown in FIG. 10. Most typically, a state of the state flag 25a transitions in the order of invalid (usable)→a wait for writing from an ATA→valid (unusable)→a wait for flush to an NAND→invalid (usable). First, a line at a writing destination is determined from logical cluster address LSB (k−i) bits of the LBA and n ways of the determined line are searched. When the logical track address 25c same as that of the input LBA is stored in the n ways of the determined lines (step S305), the DRAM-layer managing unit 120a secures this entry as an entry for writing cluster because the entry is to be overwritten (valid (unusable)→a wait for writing from an ATA).

The DRAM-layer managing unit 120a notifies the ATA-command processing unit 121 of a DRAM address corresponding to the entry. When writing by the ATA-command processing unit 121 is finished, the data managing unit 120 changes the state flag 25a of the entry to valid (unusable) and registers required data in spaces of the sector position bitmap 25b and the logical track address 25c. The data managing unit 120 updates the WC track management table 24. Specifically, when an LBA address same as the logical track address 24a already registered in the lists of the WC track management table 24 is input, the data managing unit 120 updates the number of WC clusters 24b and the way-line bitmap 24c of a relevant list and changes the next pointer 24d such that the list becomes a latest list. When an LBA address different from the logical track address 24a registered in the lists of the WC track management table 24 is input, the data managing unit 120 creates a new list having the entries of the logical track address 24a, the number of WC clusters 24b, the way-line bitmap 24c, and the next pointer 24d and registers the list as a latest list. The data managing unit 120 performs the table update explained above to complete the write processing (step S320).

On the other hand, when the logical track address 25c same as that of the input LBA is not stored in the n ways of the determined line, the data managing unit 120 judges whether flush to the NAND memory 10 is necessary (step S305). First, the data managing unit 120 judges whether a writable way in the determined line is a last nth way. The writable way is a way having the state flag 25a of invalid (usable) or a way having the state flag 25a of valid (unusable) and a wait for flush to a NAND. When the state flag 25a is a wait for flush to a NAND, this means that flush is started and an entry is a wait for the finish of the flush. When the writable way is not the last nth way and the writable way is a way having the state flag 25a of invalid (usable), the data managing unit 120 secures this entry as an entry for cluster writing (invalid (usable)→a wait for writing from an ATA). The data managing unit 120 notifies the ATA-command processing unit 121 of a DRAM address corresponding to the entry and causes the ATA-command processing unit 121 to execute writing. In the same manner as explained above, the data managing unit 120 updates the WC cluster management table 25 and the WC track management table 24 (step S320).

When the writable way is not the last nth way and when the writable way is the way having the state flag 25a of valid (unusable) and a wait for flush to a NAND, the data managing unit 120 secures this entry as an entry for writing cluster (valid (unusable) and a wait for flush to a NAND→valid (unusable) and a wait for flush from a NAND and a wait for writing from an ATA). When the flush is finished, the data managing unit 120 changes the state flag 25a to a wait for writing from an ATA, notifies the ATA-command processing unit 121 of a DRAM address corresponding to the entry, and causes the ATA-command processing unit 121 to execute writing. In the same manner as explained above, the data managing unit 120 updates the WC cluster management table 25 and the WC track management table 24 (step S320).

The processing explained above is performed when flush processing does not have to be triggered when a writing request from the ATA-command processing unit 121 is input. On the other hand, processing explained below is performed when flush processing is triggered after a writing request is input. At step S305, when the writable way in the determined line is the last nth way, the data managing unit 120 selects track to be flushed, i.e., an entry in the WC 21 based on the condition explained in (i) of the method of determining data to be flushed from the WC 21 to the NAND memory 10, i.e., (i) when a writable way determined by a tag is a last (in this embodiment, nth) free way, i.e., when the last free way is to be used, track updated earliest based on an LRU among track registered in the line is decided to be flushed.

When that track to be flushed is determined according to the policy explained above, as explained above, if all cluster in the WC 21 included in an identical logical track address are to be flushed and an amount of cluster to be flushed exceeds 50% of a track size, i.e., if the number of valid cluster in the WC is equal to or larger than $2^{(k-i-1)}$ in the track decided to be flushed, the DRAM-layer managing unit 120a performs flush to the MSIB 11a (step S310). If the amount of cluster does not exceeds 50% of the track size, i.e., the number of valid cluster in the WC is smaller than $2^{(k-i-1)}$ in the track decided to be flushed, the DRAM-layer managing unit 120a performs flush to the FSIB 12a (step S315). Details of the flush from the WC 21 to the MSIB 11a and the flush from the WC 21 to the FSIB 12a are explained later. The state flag 25a of the selected flush entry is transitioned from Valid (unusable) to a wait for flush to the NAND memory 10.

This judgment on a flush destination is executed by using the WC track management table 24. An entry of the number of WC clusters 24 indicating the number of valid clusters is registered in the WC track management table 24 for each logical track address. The data managing unit 120 determines which of the FSIB 12a and the MSIB 11a should be set as a destination of flush from the WC 21 referring to the entry of the number of WC clusters 24b. All clusters belonging to the logical track address are registered in a bitmap format in the way-line bitmap 24c. Therefore, in performing flush, the data managing unit 120 can easily learn, referring to the way-line bitmap 24c, a storage position in the WC 21 of each of the cluster that should be flushed.

During the write processing or after the write processing, the data managing unit 120 also execute the flush processing to the NAND memory 10 in the same manner when the following condition is satisfied:

(ii) the number of tracks registered in the WC 21 exceeds a predetermined number.

WC→MSIB (Copy)

When flush from the WC 21 to the MSIB 11a is performed according to the judgment based on the number of valid clusters (the number of valid clusters is equal to or larger than $2^{(k-i-1)}$), the data managing unit 120 executes a procedure explained below as explained above (step S310).

1. Referring to the WC cluster management table 25 and referring to the sector position bitmaps 25b in tags corresponding to cluster to be flushed, when all the sector position bitmaps 25b are not "1", the data managing unit 120 performs intra-track sector padding (track padding) explained later for merging with sector not present in the WC 21 by reading out the missing sector included in the identical logical track address from the MS 11.

2. When the number of tracks decided to be flushed is less than $2^i$, the data managing unit 120 adds tracks decided to be flushed having $2^{(k-i-1)}$ or more valid clusters until the number of tracks decided to be flushed reaches $2^i$ from the oldest one in the WC 21.

3. When there are $2^i$ or more tracks to be copied, the data managing unit 120 performs writing in the MSIB 11a in logical block units with each $2^i$ tracks as a set.

4. The data managing unit 120 writes the tracks that cannot form a set of $2^i$ tracks in the MSIB 11a in track units.

5. The data managing unit 120 invalidates clusters and tracks belonging to the copied tracks among those already present on the FS, the IS, and the MS after the Copy is finished.

Update processing for the respective management tables involved in the Copy processing from the WC 21 to the MSIB 11a is explained. The data managing unit 120 sets the state flag 25a in entries corresponding to all clusters in the WC 21 belonging to a flushed track in the WC cluster management table 25 Invalid. Thereafter, writing in these entries is possible. Concerning a list corresponding to the flushed track in the WC track management table 24, the data managing unit 120 changes or deletes, for example, the next pointer 24d of an immediately preceding list and invalidates the list.

On the other hand, when track flush from the WC 21 to the MSIB 11a is performed, the data managing unit 120 updates the track management table 30 and the MS logical block management table 35 according to the track flush. First, the data managing unit 120 searches for the logical track address 30a as an index of the track management table 30 to judge whether the logical track address 30a corresponding to the flushed track is already registered. When the logical track address 30a is already registered, the data managing unit 120 updates fields of the cluster bitmap 30b (because the track is flushed to the MS 11 side, all relevant bits are set to "0") of the index and the logical block ID 30c+the intra-logical block track position 30d. When the logical track address 30a corresponding to the flushed track is not registered, the data managing unit 120 registers the cluster bitmap 30b and the logical block ID 30c+the intra-logical block track position 30d in an entry of the relevant logical track address 30a. The data managing unit 120 updates, according to the change of the track management table 30, entries of the logical block ID 35a, the track management pointer 35b, the number of valid tracks 35c, the writable top track 35d, and the like in the MS logical block management table 35 when necessary.

When track writing is performed from other areas (the FS 12 and the IS 13) to the MS 11 or when intra-MS track writing by compaction processing in the MS 11 is performed, valid clusters in the WC 21 included in the logical track address as a writing object may be simultaneously written in the MS 11. Such passive merge may be present as writing from the WC 21 to the MS 11. When such passive merge is performed, the clusters are deleted from the WC 21 (invalidated).

WC→FSIB (Copy)

When flush from the WC 21 to the FSIB 12a is performed according to the judgment based on the number of valid clusters (the number of valid clusters is equal to or larger than $2^{(k-i-1)}$, the data managing unit 120 executes a procedure explained below.

1. Referring to the sector position bitmaps 25b in tags corresponding to clusters to be flushed, when all the sector position bitmaps 25b are not "1", the data managing unit 120 performs intra-cluster sector padding (cluster padding) for merging with sector not present in the WC 21 by reading out the missing sector included in the identical logical cluster address from the FS 12, the IS 13, and the MS 11.

2. The data managing unit 120 extracts clusters from a track having only less than $2^{(k-i-1)}$ valid clusters tracing tracks in the WC 21 in order from oldest one and, when the number of valid clusters reaches $2^k$, writes all the clusters in the FSIB 12a in logical block units.

3. When $2^k$ valid clusters are not found, the data managing unit 120 writes all track with the number of valid clusters less than $2^{(k-i-1)}$ in the FSIB 12a by the number equivalent to the number of logical pages.

4. The data managing unit 120 invalidates clusters with same logical cluster address as the clusters copied among those already present on the FS 12 and the IS 13 after the Copy is finished.

Update processing for the respective management tables involved in such Copy processing from the WC 21 to the FSIB 12a is explained. The data managing unit 120 sets the state flag 25a in entries corresponding to all clusters in the WC 21 belonging to a flushed track in the WC cluster management table 25 Invalid. Thereafter, writing in these entries is possible. Concerning a list corresponding to the flushed track in the WC track management table 24, the data managing unit 120 changes or deletes, for example, the next pointer 24d of an immediately preceding list and invalidates the list.

On the other hand, when cluster flush from the WC 21 to the FSIB 12a is performed, the data managing unit 120 updates the cluster table pointer 30e, the number of FS clusters 31f, and the like of the track management table 30 according to the cluster flush. The data managing unit 120 also updates the logical block ID 40b, the intra-logical block cluster position 40c, and the like of the FS/IS management table 40. Concerning clusters not present in the FS 12 originally, the data managing unit 120 adds a list to the linked list of the FS/IS management table 40. According to the update, the data managing unit 120 updates relevant sections of the MS logical block management table 35, the FS/IS logical block management table 42, and the intra-FS/IS cluster management table 44.

CIB Processing

When the WCF processing explained above is finished, the logical-NAND-layer managing unit 120b executes CIB processing including processing for moving the data in the FSIB 12a written by the WCF processing to the FS 12 and processing for moving the data in the MSIB 11a written by the WCF processing to the MS 11. When the CIB processing is started, as explained above, it is likely that data movement among the blocks and compaction processing are performed in a chain reacting manner. Time required for the overall processing substantially changes according to a state. In the CIB processing, basically, first, the CIB processing in the MS 11 is performed (step S330), subsequently, the CIB processing in the FS 12 is performed (step S340), the CIB processing in the MS 11 is performed again (step S350), the CIB processing in the IS 13 is performed (step S360), and, finally, the CIB processing in the MS 11 is performed again (step S370). In flush processing from the FS 12 to the MSIB 11a, flush processing from the FS 12 to the IS 13, or flush processing from the IS 13 to the MSIB 11a, when a loop occurs in a procedure, the processing may not be performed in order. The CIB processing in the MS 11, the CIB processing in the FS 12, and the CIB processing in the IS 13 are separately explained.

CIB Processing in the MS 11

First, the CIB processing in the MS 11 is explained (step S330). When movement of track from the WC 21, the FS 12, and the IS 13 to the MS 11 is performed, the track is written in the MSIB 11*a*. After the completion of writing in the MSIB 11*a*, as explained above, the track management table 30 is updated and the logical block ID 30*c*, the intra-block track position 30*d*, and the like in which tracks are arranged are changed (Move). When new track is written in the MSIB 11*a*, track present in the MS 11 or the TFS 11*b* from the beginning is invalidated. This invalidation processing is realized by invalidating a track from an entry of a logical block in which old track information is stored in the MS logical block management table 35. Specifically, a pointer of a relevant track in a field of the track management pointer 35*b* in the entry of the MS logical block management table 35 is deleted and the number of valid tracks is decremented by one. When all tracks in one logical block are invalidated by this track invalidation, the valid flag 35*e* is invalidated. Logical blocks of the MS 11 including invalid tracks are generated by such invalidation or the like. When this is repeated, efficiency of use of logical blocks may fall to cause insufficiency in usable logical blocks.

When such a situation occurs and the number of logical blocks allocated to the MS 11 exceeds the upper limit of the number of logical blocks allowed for the MS 11, the data managing unit 120 performs compaction processing to create a free block FB. The free block FB is returned to the physical-NAND-layer managing unit 120*c*. The logical-NAND-layer managing unit 120*b* reduces the number of logical blocks allocated to the MS 11 and, then, acquires a writable free block FB from the physical-NAND-layer managing unit 120*c* anew. The compaction processing is processing for collecting valid clusters of a logical block as a compaction object in a new logical block or copying valid tracks in the logical block as the compaction object to other logical blocks to create a free block FB returned to the physical-NAND-layer managing unit 120*c* and improve efficiency of use of logical blocks. In performing compaction, when valid clusters on the WC 21, the FS 12, and the IS 13 are present, the data managing unit 120 executes passive merge for merging all the valid clusters included in a logical track address as a compaction object. Logical blocks registered in the TFS 11*b* are not included in the compaction object.

An example of Move from the MSIB 11*a* to the MS 11 or to the TFS 11*b* and compaction processing with presence of a full logical block in the MSIB 11*a* set as a condition is specifically explained. The "full" logical block means the logical block in which all logical pages has been written and additional recording is impossible.

1. Referring to the valid flag 35*e* of the MS logical block management table 35, when an invalidated logical block is present in the MS 11, the data managing unit 120 sets the logical block as a free block FB.

2. The data managing unit 120 moves a full logical block in the MSIB 11*a* to the MS 11. Specifically, the data managing unit 120 updates the MS structure management table (not shown) explained above and transfers the logical block from management under the MSIB 11*a* to management under the MS 11.

3. The data managing unit 120 judges whether the number of logical blocks allocated to the MS 11 exceeds the upper limit of the number of logical blocks allowed for the MS 11. When the number of logical blocks exceeds the upper limit, the data managing unit 120 executes MS compaction explained below.

4. Referring to a field and the like of the number of valid tracks 35*c* of the MS logical block management table 35, the data managing unit 120 sorts logical blocks having invalidated tracks among logical blocks not included in the TFS 11*b* with the number of valid tracks.

5. The data managing unit 120 collects tracks from logical blocks with small numbers of valid tracks and carries out compaction. In carrying out compaction, first, the tracks are copied for each of the logical blocks ($2^i$ tracks are copied at a time) to carry out compaction. When a track as a compaction object has valid clusters in the WC 21, the FS 12, and the IS 13, the data managing unit 120 also merges the valid clusters.

6. The data managing unit 120 sets the logical block at a compaction source as a free block FB.

7. When the compaction is performed and one logical block includes the valid $2^i$ tracks, the data managing unit 120 moves the logical block to the top of the TFS 11*b*.

8. When the free block FB can be created by copying the valid tracks in the logical block to another logical block, the data managing unit 120 additionally records the valid tracks in the number smaller than $2^i$ in the MSIB 11*a* in track units.

9. The data managing unit 120 sets the logical block at the compaction source as the free block FB.

10. When the number of logical blocks allocated to the MS 11 falls below the upper limit of the number of logical blocks allowed for the MS 11, the data managing unit 120 finishes the MS compaction processing.

CIB Processing in the FS 12

The CIB processing in the FS 12 is explained (step S340). When full logical blocks in which all logical pages are written are created in the FSIB 12*a* by cluster writing processing from the WC 21 to the FSIB 12*a*, the logical blocks in the FSIB 12*a* are moved from the FSIB 12*a* to the FS 12. According to the movement, an old logical block is flushed from the FS 12 of the FIFO structure configured by a plurality of logical blocks.

Flush from the FSIB 12*a* to the FS 12 and flush from the FS 12 to the MS 11 and/or the IS 13 are specifically realized as explained below.

1. Referring to the valid flag 35*e* and the like of the FS/IS logical block management table 42, when an invalidated logical block is present in the FS 12, the data managing unit 120 sets the logical block as a free block FB.

2. The data managing unit 120 flushes a full logical block in the FSIB 12*a* to the FS 12. Specifically, the data managing unit 120 updates the FS/IS structure management table (not shown) and transfers the logical block from management under the FSIB 12*a* to management under the FS 12.

3. The data managing unit 120 judges whether the number of logical blocks allocated to the FS 12 exceeds the upper limit of the number of logical blocks allowed for the FS 12. When the number of logical blocks exceeds the upper limit, the data managing unit 120 executes flush explained below.

4. The data managing unit 120 determines cluster that should be directly copied to the MS 11 without being moving to the IS 13 among clusters in an oldest logical block as an flush object (actually, because a management unit of the MS 11 is a track, the cluster is determined in track units).

(A) The data managing unit 120 scans valid clusters in the oldest logical block as the flush object in order from the top of a logical page.

(B) The data managing unit 120 finds, referring to a field of the number of FS clusters 30*f* of the track management table 30, how many valid clusters a track to which the cluster belongs has in the FS 12.

(C) When the number of valid clusters in the track is equal to or larger than a predetermined threshold (e.g., 50% of $2^{k-1}$), the data managing unit 120 sets the track as a candidate of flush to the MS 11.

5. The data managing unit 120 writes the track that should be flushed to the MS 11 in the MSIB 11a.

6. When valid clusters to be flushed in the track units are left in the oldest logical block, the data managing unit 120 further executes flush to the MSIB 11a.

7. When valid clusters are present in the logical block as the flush object even after the processing of 2 to 4 above, the data managing unit 120 moves the oldest logical block to the IS 13.

When flush from the FS 12 to the MSIB 11a is performed, immediately after the flush, the data managing unit 120 executes the CIB processing in the MS 11 (step s350).

CIB Processing in the IS 13

The CIB processing in the IS 13 is explained (step S360). The logical block is added to the IS 13 according to the movement from the FS 12 to the IS 13. However, according to the addition of the logical block, the number of logical blocks exceeds an upper limit of the number of logical blocks that can be managed in the IS 13 formed of a plurality of logical blocks. When the number of logical blocks exceeds the upper limit, in the IS 13, the data managing unit 120 performs flush of one to a plurality of logical blocks to the MS 11 and executes IS compaction. Specifically, the data managing unit 120 executes a procedure explained below.

1. The data managing unit 120 sorts tracks included in the IS 13 with the number of valid clusters in the track×a valid cluster coefficient, collects $2^{i+1}$ tracks (for two logical blocks) with a large value of a product, and flushes the tracks to the MSIB 11a.

2. When a total number of valid clusters of $2^{i+1}$ logical blocks with a smallest number of valid clusters is, for example, equal to or larger than $2^k$ (for one logical block), which is a predetermined set value, the data managing unit 120 repeats the step explained above.

3. After performing the flush, the data managing unit 120 collects $2^k$ clusters in order from a logical block with a smallest number of valid clusters and performs compaction in the IS 13.

4. The data managing unit 120 releases a logical block not including a valid cluster among the logical blocks at compaction sources as a free block FB.

When flush from the IS 13 to the MSIB 11a is performed, immediately after the flush, the data managing unit 120 executes the CIB processing in the MS 11 (step S370).

FIG. 20 is a diagram of combinations of inputs and outputs in a flow of data among components and indicates what causes the flow of the data as a trigger. Basically, data is written in the FS 12 according to cluster flush from the WC 21. However, when intra-cluster sector padding (cluster padding) is necessary incidentally to flush from the WC 21 to the FS 12, data from the FS 12, the IS 13, and the MS 11 are merged.

In the WC 21, it is possible to perform management in sector (512 B) units by identifying presence or absence of $2^{(l-k)}$ sectors in a relevant logical cluster address using the sector position bitmap 25b in the tag of the WC cluster management table 25. On the other hand, a management unit of the FS 12 and the IS 13, which are functional components in the NAND memory 10, is a cluster and a management unit of the MS 11 is a track. In this way, a management unit in the NAND memory 10 is larger than the sector.

Therefore, in writing data in the NAND memory 10 from the WC 21, when data with a logical cluster or track address identical with that of the data to be written is present in the NAND memory 10, it is necessary to write the data in the NAND memory 10 after merging a sector in the cluster or track to be written in the NAND memory 10 from the WC 21 with a sector in the identical logical cluster address present in the NAND memory 10.

This processing is the intra-cluster sector padding processing (the cluster padding) and the intra-track sector padding (the track padding) shown in FIG. 20. Unless these kinds of processing are performed, correct data cannot be read out. Therefore, when data is flushed from the WC 21 to the FSIB 12a or the MSIB 11a, the WC cluster management table 25 is referred to and the sector position bitmaps 25b in tags corresponding to clusters to be flushed is referred to. When all the sector position bitmaps 25b are not "1", the intra-cluster sector padding or the intra-track sector padding for merging with a sector in an identical cluster or an identical track included in the NAND memory 10 is performed. A work area of the DRAM 20 is used for this processing. A plurality of sectors included in a logical cluster address or a logical track address is merged on the work area of the DRAM 20 and data image (cluster image or track image) to be flushed is created. The created data image is written in the MSIB 11a or written in the FSIB 12a from the work area of the DRAM 20.

In the IS 13, basically, data is written according to block flush from the FS 12 (Move) or written according to compaction in the IS 13.

In the MS 11, data can be written from all components, the WC 21, the FS 12, the IS 13, the MS 11. When track is written in the MS 11, padding due to data of the MS 11 itself can be caused because data can only be written in track units (track padding). Further, when the data is flushed from the WC 21, the FS 12, or the IS 13 in track units, in addition to track padding, fragmented data in other components, the WC 21, the FS 12, and the IS 13 are also involved according to passive merge. Moreover, in the MS 11, data is also written according to the MS compaction.

In the passive merge, when track flush from one of three components of the WC 21, the FS 12, or the IS 13 to the MS 11 is performed, valid clusters stored in the other two components included in the logical track address range of the flushed track and valid clusters in the MS 11 are collected and merged in the work area of the DRAM 20 and written in the MSIB 11a from the work area of the DRAM 20 as data for one track.

Figure 21:
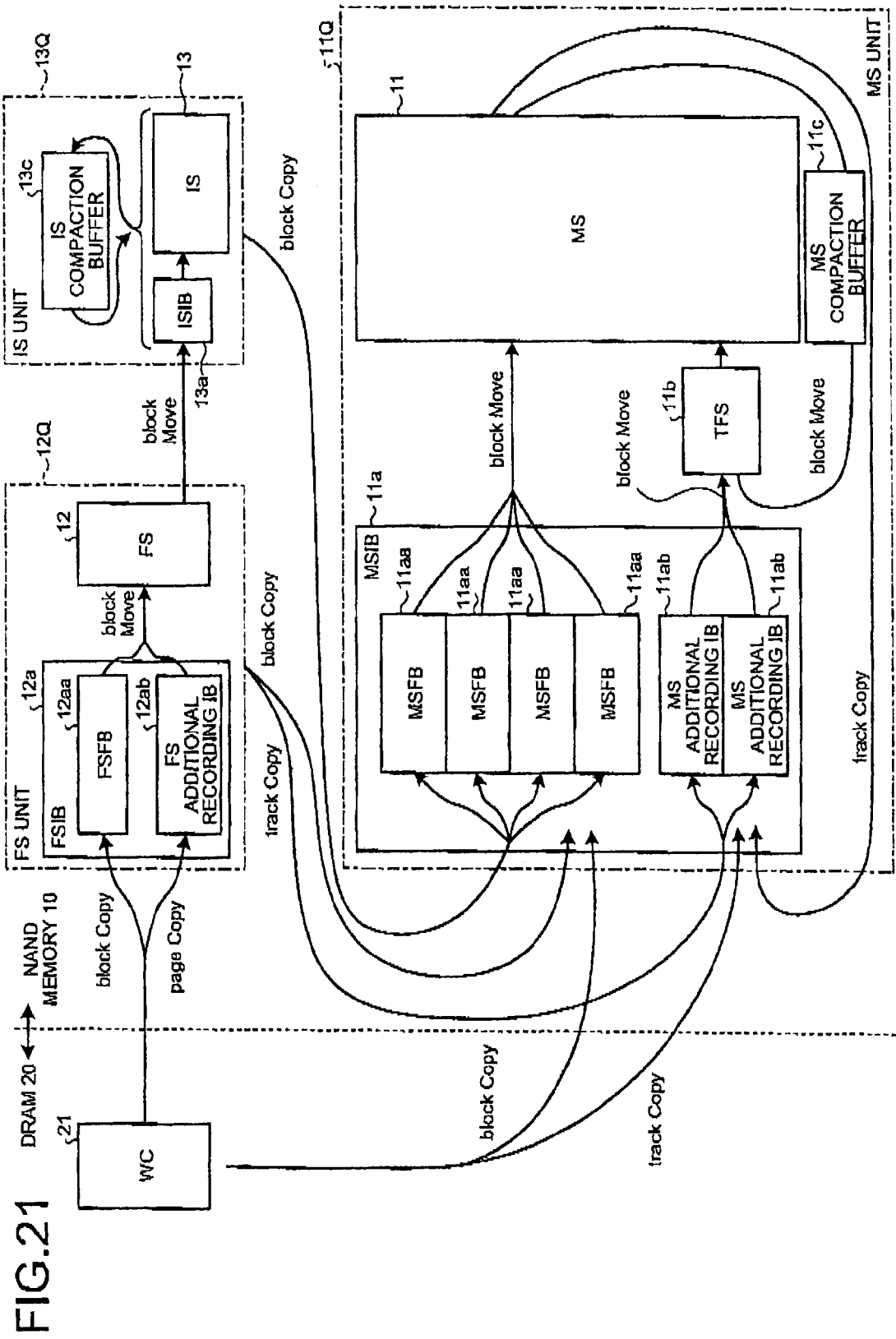
FIG. 21 is a more detailed functional block diagram related to the write processing from the WC to the NAND memory.

This embodiment is explained more in detail. FIG. 21 is a diagram of a detailed functional configuration related to the write processing of the NAND memory 10 shown in FIG. 6. Redundant explanation is omitted.

FS Configuration

An FS unit 12Q includes the FS input buffer (FSIB) 12a and the FS 12. The FS 12 has a capacity for a large number of logical blocks. The FIFO structure is managed in logical block units. The FSIB 12a to which data flushed from the WC 21 is input is provided at a pre-stage of the FS 12. The FSIB 12a includes an FS full block buffer (FSFB) 12aa and an FS additional recording buffer (FS additional recording IB) 12ab. The FSFB 12aa has a capacity for one to a plurality of logical blocks. The FSIB 121ab also has a capacity for one to a plurality of logical blocks. When the data flushed from the WC 21 is data for one logical block, data copy in logical block units (block Copy) to the FSFB 12aa is performed. When the data is not the data for one logical block, data copy in logical page unit (page Copy) to the FSIB 12ab is performed.

IS Configuration

An IS unit 13Q includes the IS 13, an IS input buffer (ISIB) 13a, and an IS compaction buffer 13c. The ISIB 13a has a capacity for one to a plurality of logical blocks, the IS compaction buffer 13c has a capacity for, for example, one logical block, and the IS 13 has a capacity for a large number of logical blocks. In the IS 13, as in the FS 12, the FIFO structure is managed in logical block units. The IS compaction buffer 13c is a buffer for performing compaction in the IS unit 13Q.

As explained above, the IS unit 13Q performs management of data in cluster units in the same manner as the FS unit 12Q. When movement of a logical block from the FS unit 12Q to the IS unit 13Q, i.e., flush from the FS 12 is performed, a logical block as an flush object, which is a previous management object of the FS unit 12Q, is changed to a management object of the IS unit 13 (specifically, the ISIB 13a) according to relocation of a pointer (block Move). When the number of logical blocks of the IS 13 exceeds a predetermined upper limit according to the movement of the logical block from the FS unit 12Q to the IS unit 13Q, data flush from the IS 13 to an MS unit 11Q and IS compaction processing are executed and the number of logical blocks of the IS unit 13Q is returned to a specified value.

MS Configuration

The MS unit 11Q includes the MSIB 11a, the track pre-stage buffer (TFS) 11b, and the MS 11. The MSIB 11a includes one to a plurality of (in this embodiment, four) MS full block input buffers (hereinafter, MSFBs) 11aa and one to a plurality of (in this embodiment, two) additional recording input buffers (hereinafter, MS additional recording IBs) 11ab. One MSFB 11aa has a capacity for one logical block. The MSFB 11aa is used for writing in logical block units. One MS additional recording IB 11ab has a capacity for one logical block. The MS additional recording IB 11ab is used for additional writing in track units.

The $2^i$ valid tracks flushed from the WC 21, the $2^i$ valid tracks flushed from the FS 12, or the $2^i$ valid tracks flushed from the IS 13 are written in the MSFB 11aa in logical block units (block Copy). The logical block, which functions as the MSFB 11aa, filled with the $2^i$ valid tracks is directly moved to the MS 11 (block Move) without being moved through the TFS 11b. After the logical block is moved to the MS 11, a free block FB is allocated as the MSFB 11aa anew.

The valid track less than $2^i$ flushed from the WC 21 or the valid track less than $2^i$ flushed from the FS 12 is written, in appending manner, to the MS additional recording IB 11ab in track units (track Copy). The logical block, which functions as the MS additional recording IB 11ab, filled with the $2^i$ valid tracks is moved to the TFS 11b (block Move). After the logical block is moved to the TFS 11b, a free block FB is allocated as the MS additional recording IB 11ab anew.

The TFS 11b is a buffer that has a capacity for a large number of logical blocks and adapts an FIFO structure of logical block units in which data is managed with track units. The TFS 11b is interposed between the MS additional recording IB 11ab and the MS 11. The logical block, which functions as the MS additional recording IB 11ab, filled with the $2^i$ valid tracks is moved to an input side of the TFS 11b having the FIFO structure. Further, one logical block including $2^i$ valid tracks, which functions as the MS compaction buffer 11c, formed by the compaction processing is moved to the input side of the TFS 11b (block Move).

The MS compaction buffer 11c is a buffer for performing compaction in the MS 11. When a track in the MS is written in the MS compaction buffer 11c according to the compaction processing in the MS 11, passive merge for writing valid clusters in the WC 21, the FS unit 12Q, and the IS unit 13Q, which are included in the track as a writing object, in the MS compaction buffer 11c via the work area of the DRAM 20 is performed. In this embodiment, logical blocks registered in the MSIB 11a and the TFS 11b are not included in the compaction object.

Figure 22:
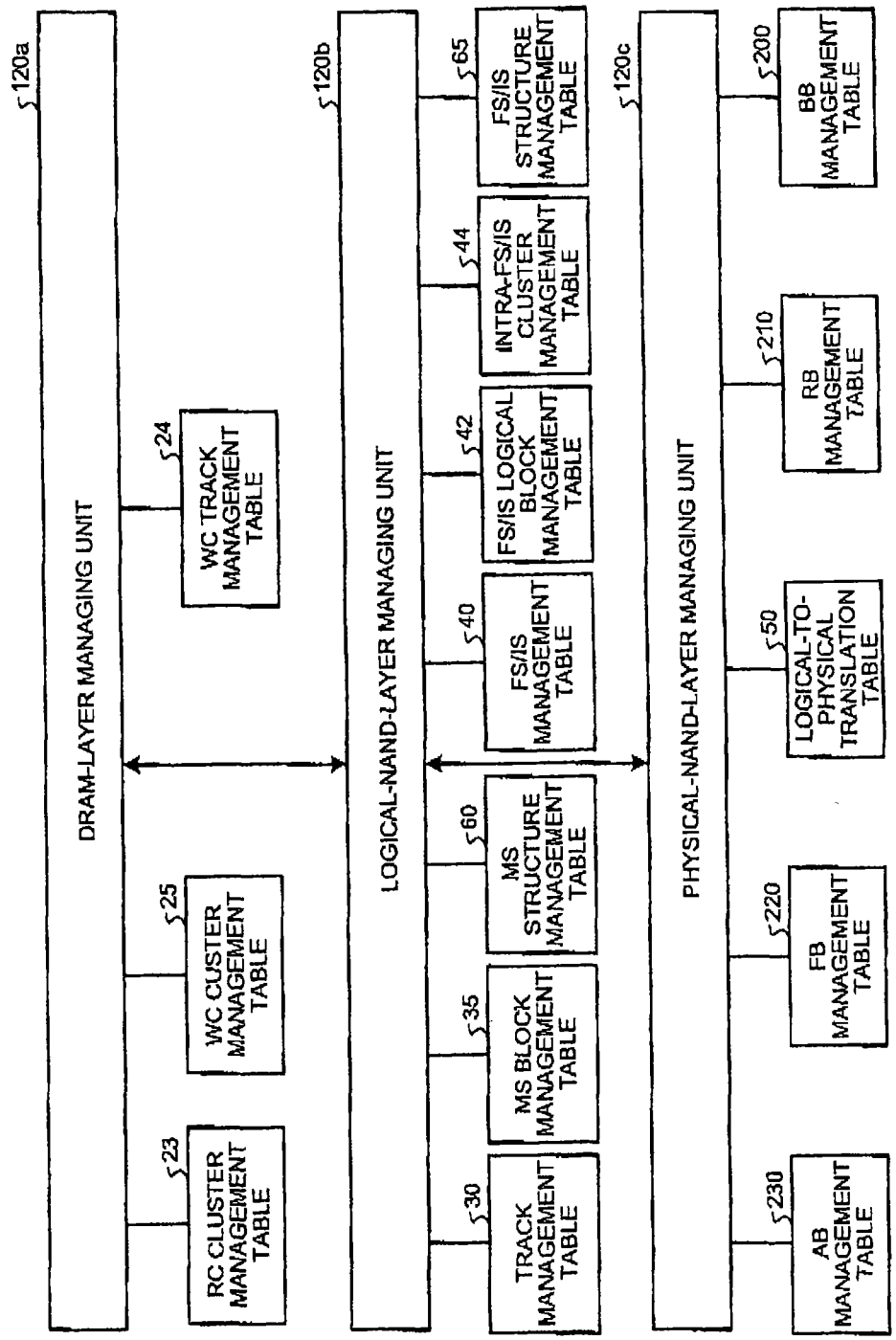
FIG. 22 is a diagram of another configuration example of a management table in a data managing unit.

FIG. 22 is a diagram of a more detailed functional configuration of the data managing unit 120. As explained above, the data managing unit 120 includes the DRAM-layer managing unit 120a that performs management of data stored in the DRAM 20, the logical-NAND-layer managing unit 120b that performs management of data stored in the NAND memory 10, and the physical-NAND-layer managing unit 120c that manages the NAND memory 10 as a physical storage device.

The DRAM-layer managing unit 120a includes the RC cluster management table 23, the WC cluster management table 25, and the WC track management table 24 and performs management of a DRAM layer based on the management tables. The logical-NAND-layer managing unit 120b includes, besides the track management table 30, the MS block management table 35, the FS/IS management table 40, the FS/IS logical block management table 42, and the intra-FS/IS cluster management table 44, an MS structure management table 60 and an FS/IS structure management table 65 and performs management of a logical NAND layer of the NAND memory 10 based on the management tables. The physical-NAND-layer managing unit 120c includes, besides the logical-to-physical translation table 50, a bad block management table (BB management table) 200, a reserved block management table (RB block management table) 210, a free block management table (FB management table) 220, and an active block management table (AB management table) 230 and performs management of a physical NAND layer of the NAND memory 10 using the management tables.

Physical NAND Layer

Figure 23:
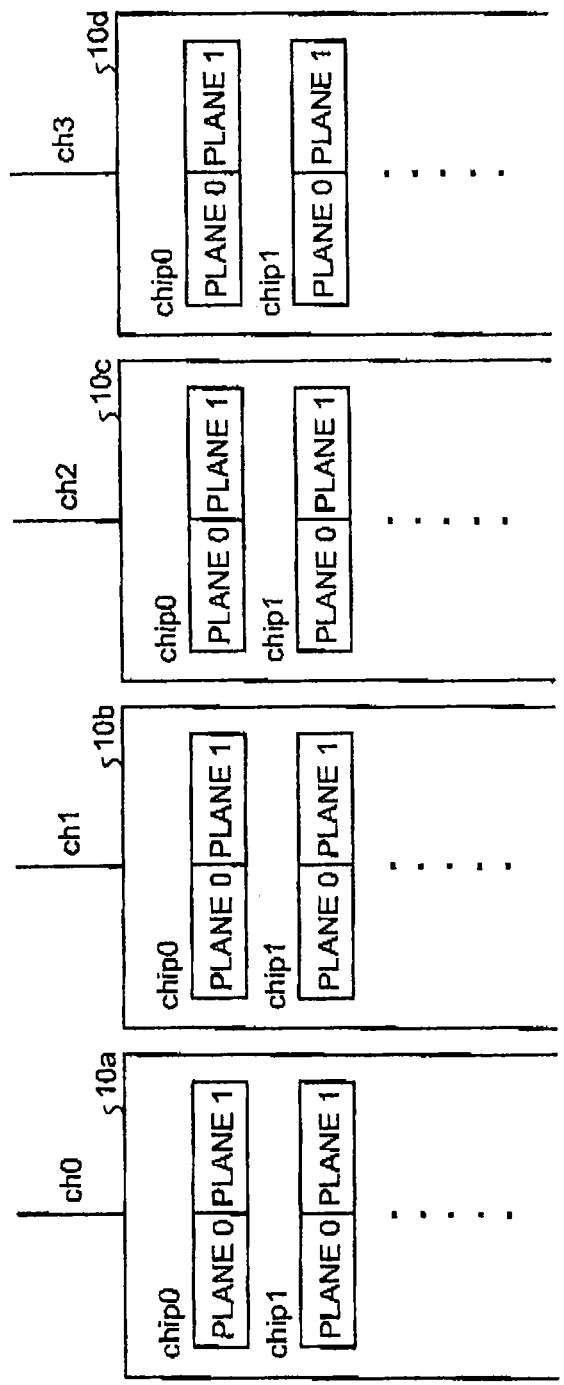
FIG. 23 is a diagram of a relation among parallel operation elements, planes, and channels.

First, the physical NAND layer is explained. As explained above, in the 32-bit double speed mode, four channels (ch0, ch1, ch2, and ch3) are actuated in parallel and erasing, writing, and readout are performed by using a double speed mode of an NAND memory chip. As shown in FIG. 23, each of NAND memory chips in the four parallel operation elements 10a to 10d is divided into, for example, two districts of a plane 0 and a plane 1. The number of division is not limited to two. The plane 0 and the plane 1 include peripheral circuits independent from one another (e.g., a row decoder, a column decoder, a page buffer, and a data cache) and can simultaneously perform erasing, writing, and readout based on a command input from the NAND controller 112. In the double speed mode of the NAND memory chip, high-speed writing is realized by controlling the plane 0 and the plane 1 in parallel.

A physical block size is 512 kB. Therefore, in the 32-bit double speed mode, an erasing unit of the physical block is increased to 512 kB×4×2=4 MB according to the parallel operation of the four channels and the simultaneous access to the two planes. As a result, in the 32-bit double speed mode, eight planes operate in parallel.

FIG. 24 is a diagram of another example of the logical-to-physical translation table 50. In the logical-to-physical translation table 50 shown in FIG. 24, a field of erasing time 50e indicating time when a logical block corresponding to the logical block ID 50a is erased is added to the logical-to-physical table 50 shown in FIG. 17. As the erasing time 50e, for example, a value obtained by measuring the number of times an erasing operation is applied to the logical blocks in the NAND memory chip or energization time of the NAND controller 112 only has to be used. The erasing time 50e is used for free block FB management in the FB management table 220 explained later.

The BB management table 200 is a table for managing bad blocks BB in physical block (512 kB) units. As shown in FIG.

25, the BB management table 200 is formed in a two-dimensional array format having, for example, for every 4 (channels)×2 (planes/channels) intra-channel planes, information concerning physical blocks for (the number of physical blocks/planes)×(the number of NAND memory chips/one parallel operation element). In each entry of the BB management table 200, a physical block ID 200a for each physical block is stored.

In the case of this embodiment, one NAND memory chip has a 2 GB size. Physical block IDs "0" to "2047" are allocated to a plane 0 of a first chip. Physical block IDs "2048" to "4095" are allocated to a plane 1 of the first chip. When the bad block BB generated during use is registered in the BB management table 200, the physical-NAND-layer managing unit 120c adds bad blocks BB immediately behind last valid entries of intra-channel plane IDs (ID#0 to ID#7) corresponding thereto without sorting the bad blocks BB.

For example, a physical block for which, when a use is allocated to a free block FB, an erasing operation is not normally finished is registered as the bad block BB, or for which, when data is written in a active block AB used as the FS 12, IS 13, or MS 11, writing operation is not normally finished may be registered as the bad block BB.

The RB management table 210 is a table for managing physical blocks (reserved blocks RB) remaining when 4 MB logical blocks are formed in eight physical block units (512 kB). The RB management table 210 is managed in a format same as that of the BB management table 200. By managing the blocks in FIFO for each of intra-channel plane IDs corresponding thereto, the reserved blocks RB are preferentially used in order from one registered earliest.

The FB management table 220 is a table for managing free blocks FB presently not allocated to a use (e.g., use for the FS12, IS 13, or MS11) in 4 MB logical block units and is a list in the FIFO format sorted in order of creation of the free blocks FB. A logical block ID is stored in each entry. The free block FB returned to the FB management table 220 according to compaction processing or the like is added to the tail end of the list. Free block FB allocation is performed by returning a top block of the list.

Figure 26:
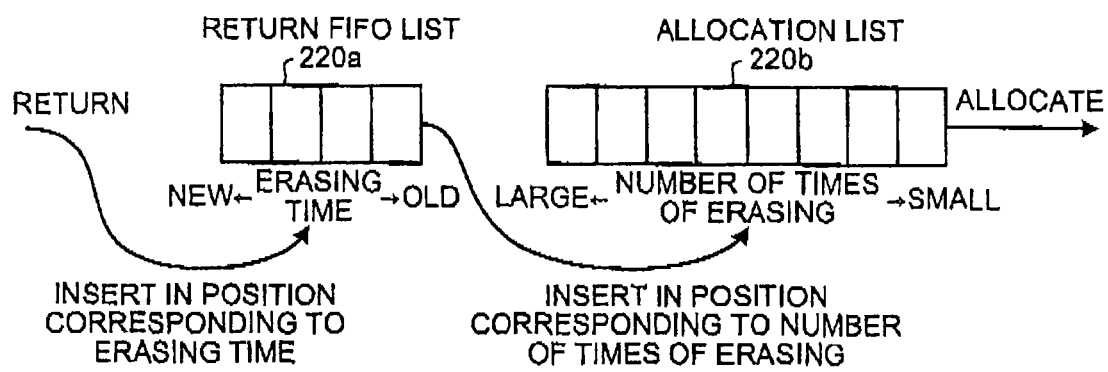
FIG. 26 is a diagram of an internal configuration example of an FB management table.

As shown in FIG. 26, the FB management table is configured in two stages of a return FIFO list 220a and an allocation list 220b. The return FIFO list 220a is aligned in order of the erasing time 50e. In the allocation list 220b, a logical block with a smaller number of times of erasing 50c is located closer to the top of the list. This is a configuration for preventing an erasing operation from being repeated at short time intervals. An unnecessary logical block returned to the FB management table 220 is added to the tail end of the return FIFO list 220a and stored there for a fixed period.

A logical block pushed out from the return FIFO list 220a is inserted in somewhere in the allocation list 220b according to the number of times of erasing 50c of the logical block. When allocation of the free block FB is requested from the logical-NAND-layer managing unit 120b, the logical-NAND-layer managing unit 120c extracts the free block FB from the top of the allocation list 220b and allocates the free block FB.

With the FB management table, it is possible to equally distribute logical blocks to be erased (wear leveling processing) such that the numbers of times of erasing and erasing intervals of all logical blocks are generally equal. It is known that the life of a NAND-type flash memory depends on intervals of erasing processing besides the number of times of erasing and, as the intervals are longer, retention properties are better and the life is longer. This also indicates that, when the erasing intervals are short, the retention properties are bad and the life is spoiled. It is also known that, even if writing is performed at short intervals, unless appropriate long term erasing is performed, the retention properties are recovered.

The AB management table 230 is a list of logical blocks (active blocks AB), to which a use (e.g., use for the FS12, IS 13, or MS11) are allocated, allocated from the free blocks FB. As in the FB management table 220, in the AB management table 230, a logical block ID is stored in each entry. A logical block with earlier registration order is located closer to the top. The AB management table is used for, for example, refresh processing.

The refresh processing is a technique for preventing an error exceeding error correction ability of the SSD 110 from occurring because of the influence of aged deterioration of written data and read disturb, which is data breakage involved in read processing. Specifically, for example, before an error exceeding the error correction ability occurs, processing for reading out stored data and performing error correction and, then, rewriting the data in the NAND-type flash memory is performed. For example, a block with a large number of times of readout 50d, a top block of the AB management table 230, and the like can be set as monitoring objects of the refresh processing.

The physical-NAND-layer managing unit 120c performs logical block/physical block management explained below. First, a correspondence relation between a logical block ID and eight physical block IDs in the logical-to-physical translation table 50 is explained with reference to FIG. 27.

Figure 27:
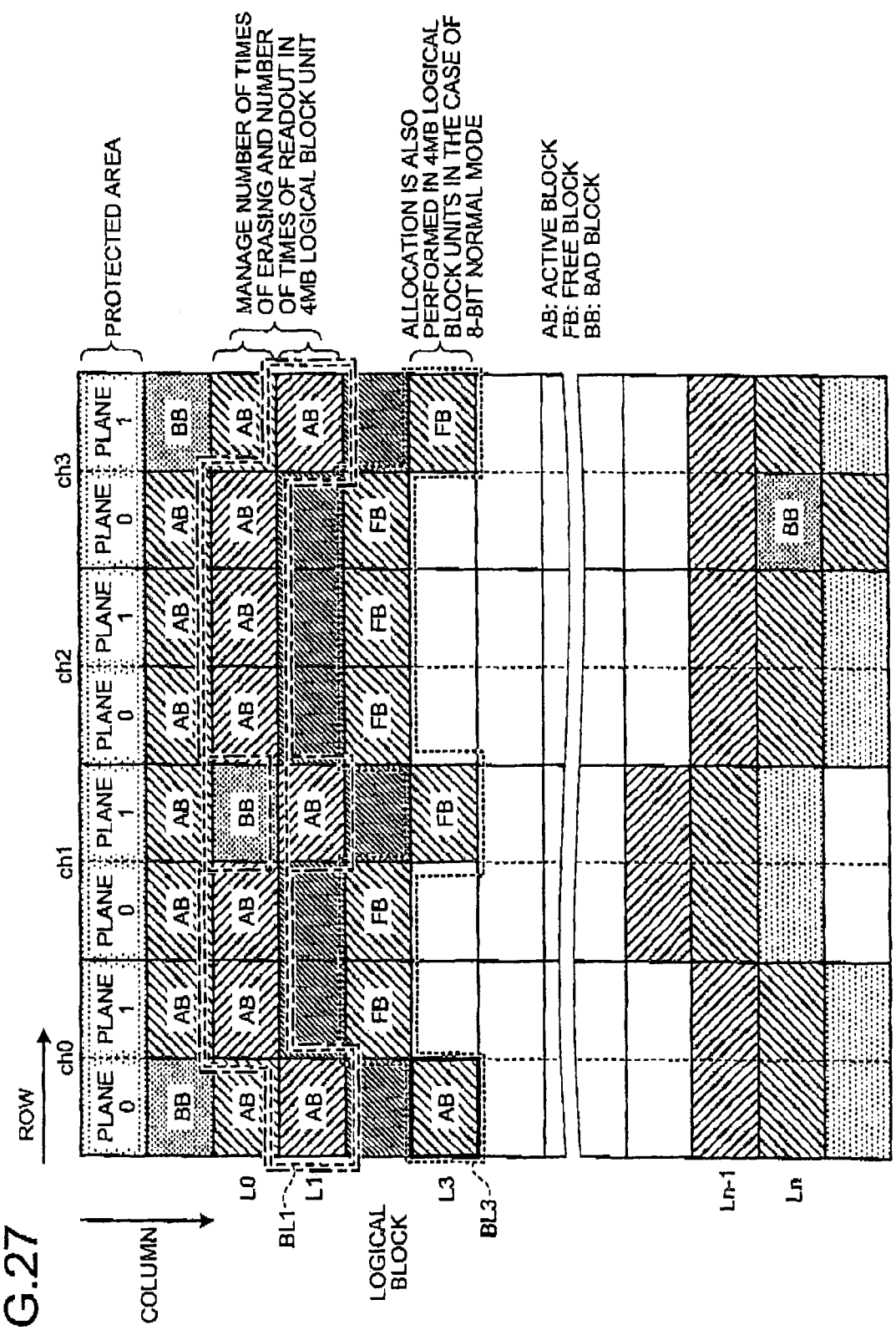
FIG. 27 is a diagram of a correspondence relation between logical blocks and physical blocks of the NAND memory.

As explained above, eight physical block IDs associated with the logical block ID 50a as an index of the logical-to-physical translation table 50 are registered in fields of the physical block ID 50b of the logical-to-physical translation table 50. FIG. 27 is a diagram of a correspondence relation between logical block IDs and physical block IDs of the NAND memory 10. One section represents one physical block. A physical block ID is allocated to each of the physical blocks. A logical block L0 (active block AB) includes, for example, eight physical blocks in the first row and the third column, the second row and the second column, the third row and the second column, the fourth row and the second column, the fifth row and the second column, the six row and the second column, the seventh row and the second column, and the eighth row and the third column. A logical block L1 (active block AB) surrounded by a broken line BL1 includes, for example, eight physical blocks in the first row and a fourth column, the second row and the third column, the third row and the third column, the fourth row and the third column, the fifth row and the third column, the sixth row and the third column, the seventh row and the third column, and the eighth row and the fourth column.

Thereafter, for example, it is assumed that, when a use is allocated to the logical block L1 (in this case, the logical block L1 is the free block FB) and erasing operation is executed or when data is written in the logical block L1 used as the FS 12, IS 13, or MS 11 (in this case, the logical block L1 is the active block AB as shown in FIG. 27) and writing operation is executed, the erasing or writing operation for the physical block in the fourth row and the third column of the logical block L1 is not normally finished, and as a result, the physical block is registered in the BB management table 200 as the bad block BB that cannot be used as a storage area.

The physical-NAND-layer managing unit 120c detects the registration and selects, as a replacement candidate for the bad block BB, the reservation block RB in a channel and a plane identical with those of the physical block registered as the bad block BB from the RB management table 210.

In the case of FIG. 27, a physical block (the reserved block RB) in the fourth row and the fourth column adjacent to the bad block BB is selected as a replacement candidate for the bad block BB in the fourth row and the third column.

The physical-NAND-layer managing unit 120c searches through an entry of the logical block ID 50a corresponding to the logical block L1 of the logical-to-physical translation table 50 and changes a physical block ID of the bad block BB corresponding to the fourth row and the third column among the eight physical block IDs included in a field of the physical block ID 50b in the entry to a physical address ID corresponding to the reserved block RB in the fourth row and the fourth column selected from the RB management table 210.

Consequently, thereafter, the logical block L1 includes a combination of eight new physical blocks in the first row and the fourth column, the second row and the third column, the third row and the third column, the fourth row and the fourth column, the fifth row and the third column, the sixth row and the third column, the seventh row and the third column, and the eighth row and the fourth row surrounded by an alternate long and short dash line. It is assumed that a logical block ID of the logical block L1 is "L1".

Thereafter, the physical-NAND-layer managing unit 120c secures a new free block FB (not shown in FIG. 27) from the FB management table 220. It is assumed that a logical block ID of the secured free block FB is "L2". The physical-NAND-layer managing unit 120c executes replacement of the logical block IDs using the logical-to-physical translation table 50.

Specifically, the physical-NAND-layer managing unit 120c associates the eight physical blocks, which are associated with the new free block FB with the logical block ID "L2", with the logical block ID "L1". At the same time, the physical-NAND-layer managing unit 120c associates the eight physical blocks in the first row and the fourth column, the second row and the third column, the third row and the third column, the fourth row and the fourth column, the fifth row and the third column, the sixth row and the third column, the seventh row and the third column, and the eighth row and the fourth column surrounded by the alternate long and short dash line with the logical block ID "L2". The number of times of erasing 50c, the number of times of readout 50d, and the erasing time 50e are also replaced according to the update of the physical block IDs. Thereafter, the physical-NAND-layer managing unit 120c registers the logical block ID "L2" in the FB management table 220. The logical-NAND-layer managing unit 120b executes erasing or writing operation in the newly secured logical block with the same logical block ID "L1" afresh.

On the other hand, when the reserved block RB that can be replaced with the bad block BB is not present, the physical-NAND-layer managing unit 120c performs processing explained below. For example, it is assumed that the physical block in the fourth row and the third column is registered in the BB management table 200 as the bad block BB and the reserved block RB is not present in an identical channel and an identical plane for the bad block BB. In this case, first, the physical-NAND-layer managing unit 120c registers the seven physical blocks in the first row and the fourth column, the second row and the third column, the third row and the third column, the fifth row and the third column, the sixth row and the third column, the seventh row and the third column, and the eighth row and the fourth column excluding the fourth row and the third column in the logical block L1 in the RB management table 210. Thereafter, in the same manner as explained above, the physical-NAND-layer managing unit 120c secures a new free block FB from the FB management table 220 and executes replacement of the logical block IDs as explained above, and, then, sets the logical block ID acquired from the FB management table 220 unusable.

In this way, even when the bad block BB is generated, the physical-NAND-layer managing unit 120c is executing replacement of the logical block IDs. Therefore, the logical block ID used in the logical-NAND-layer managing unit 120b does not change before and after the generation of the bad block BB. Therefore, even when at least one of a plurality of physical blocks is registered as a bad block, a correspondence relation between LBA logical addresses and logical blocks is not changed. It is possible to prevent overhead of rewriting of the management tables in the logical-NAND-layer managing unit 120b.

In the 8-bit normal mode for independently driving one plane in the parallel operation elements 10a to 10d, an erasing unit of the mode is one physical block (512 KB). The 8-bit normal mode is used when a writing size is small, for example, when a log for recording updated contents of the management tables is additionally written.

When the free block FB used in such an 8-bit normal mode, i.e., a physical block in 512 KB units is necessary, the physical-NAND-layer managing unit 120c secures 4 MB logical block in the 32-bit double speed mode and selects one physical block in the secured logical block. FIG. 27 indicates that a logical block L3 surrounded by a broken line BL3 including one physical block surrounded by a thick line, which is used soon in the logical-NAND-layer managing unit 120b, is assigned.

In the 8-bit normal mode, first, the physical-NAND-layer managing unit 120c uses the selected one physical block. When the one physical block is filled with data because of the additional recording of the log, the physical-NAND-layer managing unit 120c uses another physical block among the eight physical blocks in the logical block L3. Thereafter, such processing is repeated.

Erasing processing in the 32-bit double speed mode is explained. The physical-NAND-layer managing unit 120c counts up, every time data in the NAND memory 10 is erased in logical block units, a field of the number of times of erasing 50c in a logical block ID corresponding to an erased logical block of the logical-to-physical translation table 50 shown in FIG. 24 by one and updates the erasing time 50e to latest data.

Logical NAND Layer

The MS structure management table 60 and the FS/IS structure management table 65 used for management in a logical NAND layer are explained with reference to FIGS. 28 and 29. The MS structure management table 60 shown in FIG. 28 includes an area for managing the structure of the MS unit 11Q and an area for storing state information. The MS structure management table 60 includes an MS buffer management table 61 for managing logical block IDs allocated as the MSFB 11aa, the MS additional recording IB slab, and the TFS 11b, a logical block ID list by the number of valid tracks 62 for storing logical block IDs with a small number of valid tracks in order to increase the speed of sort processing during the MS compaction, and areas 63 and 64 for managing a maximum number of logical blocks MBL and the number of valid logical blocks VBL as state information.

In the MS structure management table 60, fixed fields 61a to 61c with a required number of entries are prepared for the MSFB 11aa, the MS additional recording IB 11ab, and the TFS 11b. Logical block IDs are recorded in the fixed fields 61a to 61c. The field 61c for the TFS 11b has the linked list structure. FIFO-like management for the TFS 11b having the FIFO structure is performed.

In the logical block ID list by the number of valid tracks 62, a required number of entries are prepared for a logical block with one valid track, a required number of entries are prepared for a logical block with two valid tracks, . . . , and a required number of entries are prepared for a logical block with $2^i-1$ valid tracks. A logical block ID is recorded in each of the entries. When a field of the number of valid tracks 35c of the MS logical block management table 35 is searched, the logical block ID list by the number of valid tracks 62 is always updated to a latest state. Logical blocks registered in the MS buffer management table 61 as the MSIB 11a and the TFS 11b are not entered in the logical block ID list by the number of valid tracks 62.

In the fixed field 63 for the maximum number of logical blocks MBL as state information, a maximum number of logical blocks MBL as the number of logical blocks that the MS unit 11Q is allowed to acquire is recorded. In the fixed field 64 for the number of valid logical blocks VBL as state information, the number of valid logical blocks VBL as the number of logical blocks presently managed as the MS unit 11Q is recorded.

Figure 29:
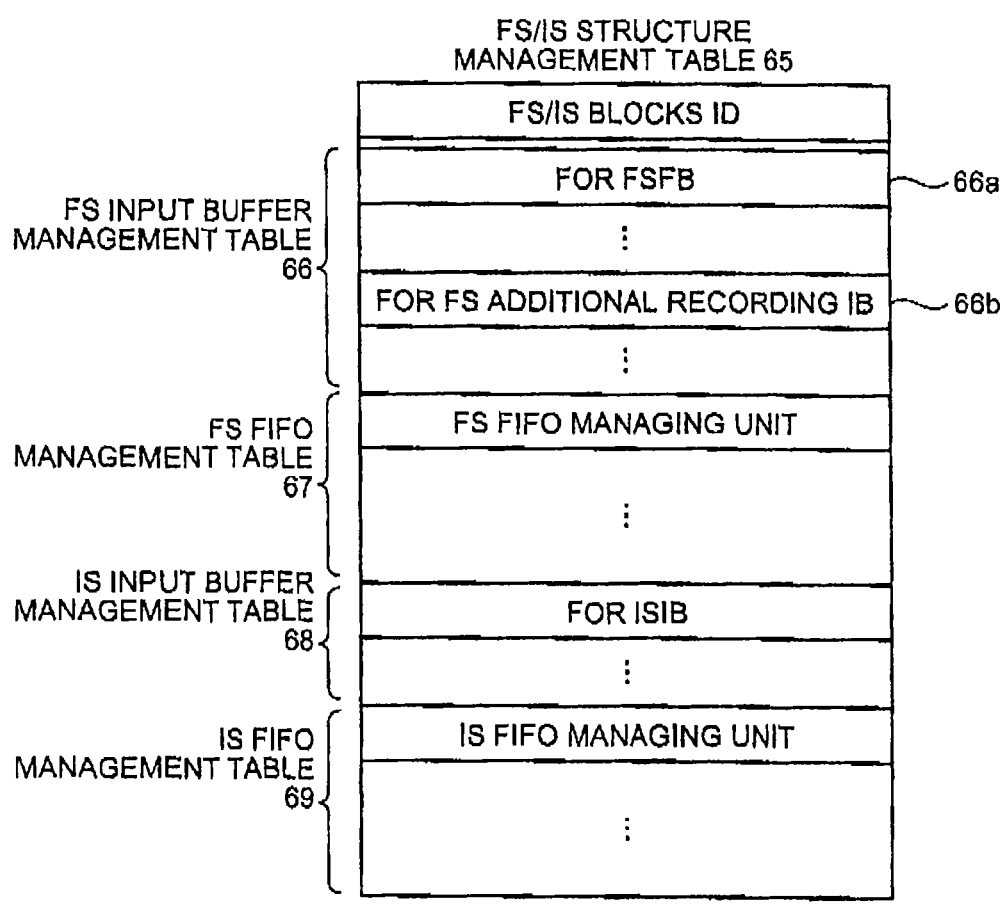
FIG. 29 is a diagram of an example of an FS/IS structure management table.

The FS/IS structure management table 65 shown in FIG. 29 has an area for managing the structure of the FS unit 12Q and the IS unit 13Q. The FS/IS structure management table 65 includes an FS input buffer management table 66 for managing logical block ID allocated as the FSIB 12a and the FS additional recording IB 12ab, an FS FIFO management table 67 for managing the FIFO structure of the FS 12, an IS input buffer management table 68 for managing a logical block ID allocated as the ISIB 13a, and the IS FIFO management table 69 for managing the FIFO structure of the IS 13.

In the FS input buffer management table 66, fixed fields 66a and 66b with a required number of entries are prepared for the FSFB 12aa and the FS additional recording IB 12ab. The FS/IS block ID 42a as an index of the FS/IS logical block management table 42 is registered in the fixed fields 66a and 66b. In the IS input buffer management table 68, fixed fields with a required number of entries are prepared for the ISIB 13a. The FS/IS block ID 42a is registered in the fixed fields. In the FS FIFO management table 67, entries for the number of logical blocks forming the FIFO structure of the FS 12 are prepared in fixed fields. The FS/IS block ID 42a is registered in the fixed fields of the FS FIFO management table 67. In the IS FIFO management table 69, entries for the number of logical blocks forming the FIFO structure of the IS 13 are prepared in fixed fields. The FS/IS block ID 42a is registered in the fixed fields.

Figure 19:
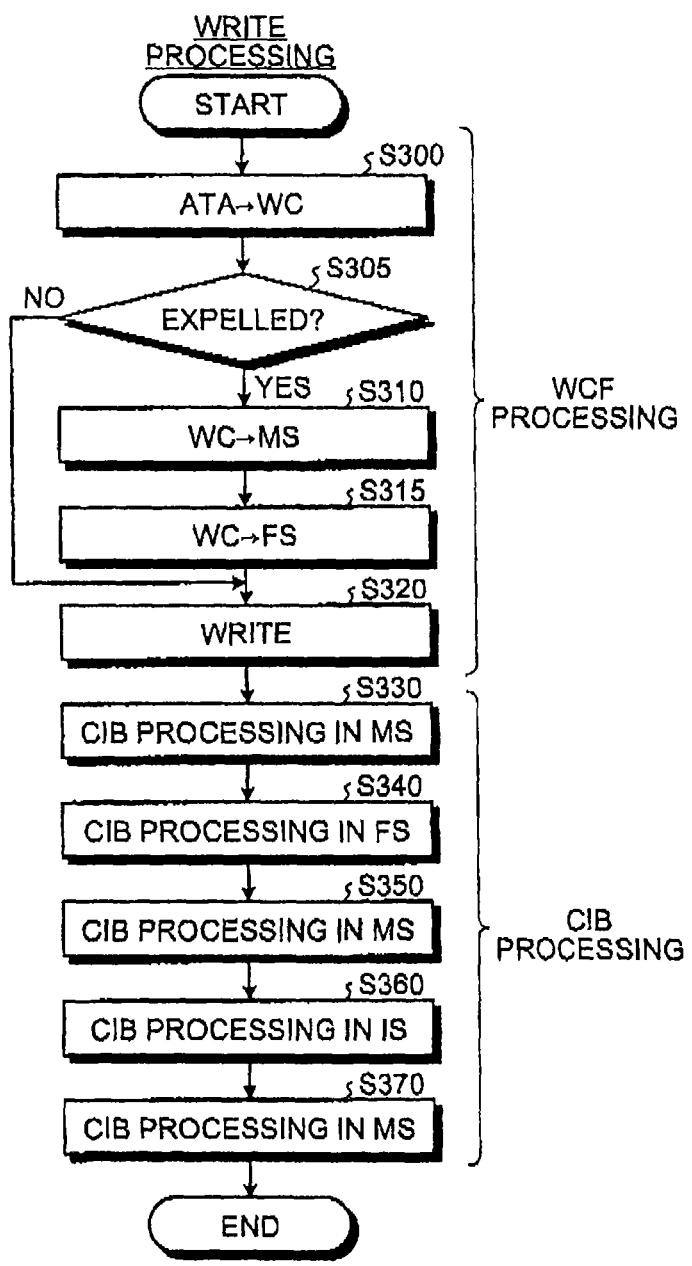
FIG. 19 is a flowchart of an operation example of write processing.

Update processing for the management tables involved in the Copy processing from the WC 21 to the MSIB 11a in executing the write processing divided into the two stages (the WCF processing and the CIB processing) explained with reference to FIG. 19 is explained. Here, Copy in track units from the WC 21 to the MS additional recording IB 11ab is performed. The DRAM-layer managing unit 120a checks the WC track management table 24 in order from the top, referring to the way-line bitmap 24c in a track entry in which the logical track address 24a corresponding to a track decided to be flushed is registered, changes the state flag 25a in an entry in the WC cluster management table 25 corresponding to an entry with a valid bit "1" in m×n entries of the way-line bitmap 24c from Valid to a wait for flush to a NAND, and notifies the logical-NAND-layer managing unit 120b of an flush request.

Figure 28:
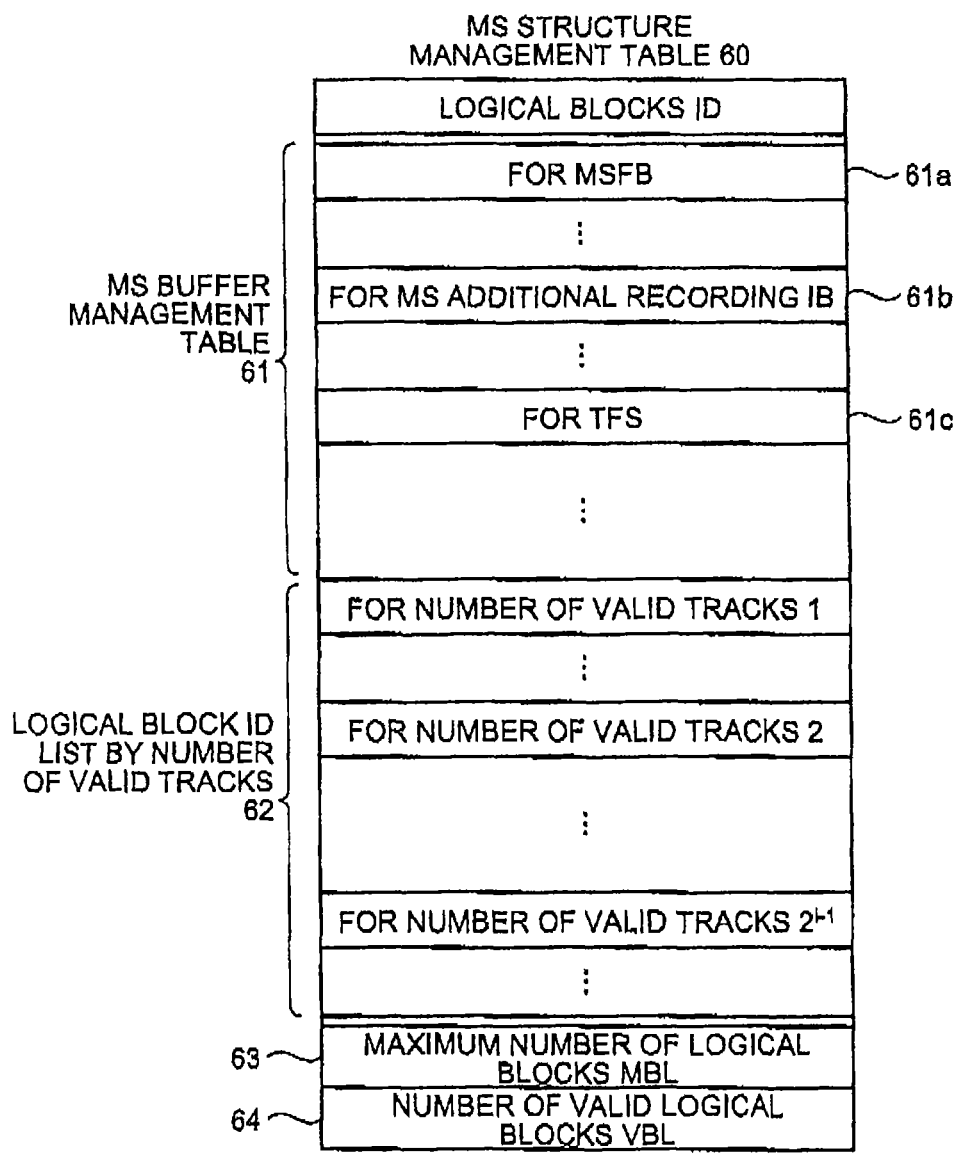
FIG. 28 is a diagram of an example of an MS structure management table.

On the other hand, the logical-NAND-layer managing unit 120b checks a state of the MS additional recording IB 11ab referring to the MS buffer management table 61 of the MS structure management table 60 shown in FIG. 28 and the MS logical block management table 35 shown in FIG. 14. When it is judged from the field 61b for the MS additional recording IB of the MS buffer management table 61 that the MS additional recording IB 11ab is already present, the logical-NAND-layer managing unit 120b acquires information concerning the number of writable tracks for a logical block ID registered in the field 61b for the MS additional recording IB from the field of the number of valid tracks 35c of the MS logical block management table 35 and notifies the DRAM-layer managing unit 120a of the acquired number of writable tracks.

When it is judged from the field 61b for the MS additional recording IB of the MS buffer management table 61 that the MS additional recording IB 11ab is not present, the logical-NAND-layer managing unit 120b issues a request for acquiring the free block FB to the physical-NAND-layer managing unit 120c and acquires the free block FB together with a logical block ID allocated as the free block FB. The logical-NAND-layer managing unit 120b notifies the DRAM-layer managing unit 120a of the number of writable tracks $2^i$ of the acquired free block FB.

The DRAM-layer managing unit 120a selects tracks from the WC track management table 24 by the number of writable tracks notified from the logical-NAND-layer managing unit 120b and judges whether the intra-track sector padding and/or the passive merge needs to be performed. In order to check whether clusters and/or tracks included in range of the logical track addresses to be flushed is present in the NAND memory 10 and judges whether the intra-track sector padding and/or the passive merge needs to be performed, the DRAM-layer managing unit 120a notifies the logical-NAND-layer managing unit 120b of required information such as a logical track address to be flushed.

When the logical-NAND-layer managing unit 120b receives this notification, the logical-NAND-layer managing unit 120b searches through the logical track address 30a as an index of the track management table 30 and, when necessary, further searches through the FS/IS management table 40, and judges whether a logical track address identical with the logical track address to be flushed is present on the NAND memory 10. The logical-NAND-layer managing unit 120b notifies the physical-NAND-layer managing unit 120c of a result of the search. Consequently, the physical-NAND-layer managing unit 120c performs flush from the WC 21 to the MS additional recording IB 11ab involving the intra-track sector padding and/or the passive merge or not involving the intra-track sector padding and the passive merge.

When the finish of the flush from the WC 21 to the MS additional recording IB 11ab is notified from the physical-NAND-layer managing unit 120c, if a new free block FB is acquired from the physical-NAND-layer managing unit 120c as the MS additional recording IB 11ab, the logical-NAND-layer managing unit 120b sets the valid flag 35e of an entry of the MS logical block management table 35 corresponding to a logical block ID of the free block FB given from the physical-NAND-layer managing unit 120c valid, registers the logical block ID in the field 61b for the MS additional recording IB of the MS buffer management table 61, and increments the number of valid logical blocks VBL of the MS structure management table 60.

The logical-NAND-layer managing unit 120b updates the track management table 30. In other words, the logical-NAND-layer managing unit 120b registers required information such as the cluster bit map 30b, the logical block ID 30c, and the intra-logical block track position 30d in an entry of the logical track address 30a corresponding to the track flushed from the WC 21 to the MS additional recording IB 11ab.

When an old track having the identical logical track address is not present in the NAND memory 10 and the intra-track sector padding and the passive merge is not performed, the logical-NAND-layer managing unit 120b registers required information concerning the new track flushed from the WC 21 in an entry corresponding to the logical track address of the track management table 30. The logical-NAND-layer managing unit 120b registers information concerning the track flushed from the WC 21 in an entry corresponding to a written logical block ID of the MS logical block management table 35. As the registration in the MS logical block management table 35, there are, for example, update of the logical track address (the track management pointer 35b) as an index of the track management table 30 corresponding to the tracks stored in the logical block allocated to the MS 11, update of the number of valid tracks 35c, and update of the writable top track 35d.

When an old track having the identical logical track address is present in the NAND memory 10 (the old track is superseded) and the intra-track sector padding and/or the passive merge is performed, the logical-NAND-layer managing unit 120b updates required information such as the logical block ID 30c and the intra-logical block track position 30d in an entry of the logical track address 30a corresponding to a merge source track in the track management table 30. Specifically, the logical-NAND-layer managing unit 120b changes the logical block ID 30c from an old logical block ID in the MS 11 to which the merge source track is associated to a new logical block ID corresponding to the MS additional recording IB 11ab. The intra-logical block track position 30d is changed according to an additional recording state.

Moreover, the logical-NAND-layer managing unit 120b deletes a relevant section of a field of the track management pointer 35b in an entry corresponding to the old logical block ID to which the merge source track is associated in the MS logical block management table 35, decrements the number of valid tracks 35c, and updates the logical block ID list by the number of valid tracks 62 of the MS structure management table 60. When the number of valid tracks 35c in the entry corresponding to the old logical block ID to which the merge source track is associated is reduced to 0 by the decrement, the logical-NAND-layer managing unit 120b decrements the number of valid logical blocks VBL of the MS structure management table 60 and returns the logical block as the free block FB to the physical-NAND-layer managing unit 120c. The logical-NAND-layer managing unit 120b sets the valid flag 35e of the entry corresponding to the released logical block invalid. Moreover, in the same manner as explained above, the logical-NAND-layer managing unit 120b registers information concerning the new track flushed from the WC 21 in the MS logical block management table 35.

When the completion of flush from the WC 21 to the MS additional recording IB 11ab is notified from the physical-NAND-layer managing unit 120c, the logical-NAND-layer managing unit 120b notifies the DRAM-layer managing unit 120a of the completion of the flush (WCF processing). The DRAM-layer managing unit 120a receives the notification and sets the state flags 25a in entries corresponding to all clusters belonging to the flushed track in the WC cluster management table 25 invalid (usable). Thereafter, writing of data from the host apparatus 1 in the entries is possible. Concerning a list corresponding to the flushed track in the WC track management table 24, for example, the next pointer 24d of an immediately preceding list is changed or deleted and the list is invalidated.

The CIB processing is explained. When the WCF processing is finished, the CIB processing including processing for moving the data of the FSIB 12a written by the WCF processing to the FS 12 and processing for moving the data of the MSIB 11a written by the WCF processing to the MS 11 or the TFS 11b is executed. A detailed procedure of the CIB processing is explained below with reference to a flowchart shown in FIG. 30.

CIB Processing in the MS Unit 11Q

First, the CIB processing in the first time in the MS unit 11Q explained at step S330 in FIG. 19 is explained in detail. The logical-NAND-layer managing unit 120b acquires, from a field of the number of valid tracks 35c of the MS logical block management table 35, information of the number of valid tracks concerning logical block IDs registered in the field 61a for the MSFB and the field 61b for the MS additional recording IB of the MS buffer management table 61 of the MS structure management table 60. The logical-NAND-layer managing unit 120b checks whether one or more full blocks, in which all logical pages are written with tracks, are present in the MSFB 11aa or the MS additional recording IB 11ab of the MSIB 11a (step S400). When one or more full blocks are present in the MSIB 11a, the logical-NAND-layer managing unit 120b performs the processing explained below. When the judgment at step S400 is NO, the procedure shifts to step S440.

When the judgment at step S400 is YES, the logical-NAND-layer managing unit 120b checks whether an invalid logical block, the number of valid tracks 35c of which is 0, is present in the MS referring to the number of valid tracks 35c of the MS logical block management table 35. When the invalid logical block is present in the MS, the logical-NAND-layer managing unit 120b returns the invalid logical bock to the physical-NAND-layer managing unit 120c (step S405). In an entry of the MS logical block management table 35 corresponding to the returned invalid logical block, the valid flag 35e is set invalid and the number of valid logical blocks VBL of the MS structure management table 60 is decremented. The logical-NAND-layer managing unit 120b directly moves a full logical block in the MSFB 11aa to the MS 11 and moves a full logical block in the MS additional recording IB 11ab to the TFS 11b (step S407). This Move processing is processing for only deleting relevant logical block IDs registered in the field 61a for the MSFB and the field 61b for the MS additional recording IB of the MS buffer management table 61 of the MS structure management table 60.

The logical-NAND-layer managing unit 120b compares the number of valid logical blocks VBL as state information of the MS structure management table 60 with the maximum number of logical blocks MBL (step S410). As a result of the comparison, when the number of valid logical blocks VBL exceeds the maximum number of logical blocks MBL, the logical-NAND-layer managing unit 120b judges that the free blocks FB are insufficient, executes MS compaction processing explained below block by block, increases invalid logical blocks that should be returned to the physical-NAND-layer managing unit 120c entirely configured by invalid tracks, and reduces the number of valid logical blocks VBL to be smaller than the maximum number of blocks MBL (step S420). When the free blocks FB are not insufficient in the judgment at step S410, the procedure is shifted to step S440.

As the MS compaction processing, as explained above, there are two types, i.e., $2^i$ track MS compaction and less than $2^i$ track MS compaction. In the $2^i$ track MS compaction, the MS compaction buffer 11c is used and a logical block used as the MS compaction buffer 11c after the compaction is moved to the top of the TFS 11b. In the less than $2^i$ track MS compaction, valid tracks are copied to the MS additional recording IB 11ab.

First, the logical-NAND-layer managing unit 120b executes the $2^i$ track MS compaction for collecting $2^i$ tracks from logical blocks with a small number of valid tracks referring to the logical block ID list by the numbers of valid tracks 62 of the MS structure management table 60 and copying the collected $2^i$ tracks to the MS compaction buffer 11c acquired from the physical-NAND-layer managing unit 120c.

Specifically, the logical-NAND-layer managing unit 120b issues an acquisition request for a free block FB to the physical-NAND-layer managing unit 120c and acquires a free block FB together with a logical block ID allocated as the free bock FB. The logical-NAND-layer managing unit 120b requests the physical-NAND-layer managing unit 120c to copy a plurality of tracks selected as compaction objects to the free block FB. When the tracks as the compaction objects have valid clusters in the WC 21, the FS unit 12Q, and the IS unit 13Q, the logical-NAND-layer managing unit 120b executes the passive merge for collecting and merging the valid clusters in the MS compaction buffer 11c.

When the completion of the compaction is notified from the physical-NAND-layer managing unit 120c, the logical-NAND-layer managing unit 120b updates the logical block ID 30c in an entry having the logical track addresses 30a corresponding to the tracks subjected to the compaction of the track management table 30a to the logical block ID of the free block FB acquired from the physical-NAND-layer managing unit 120c and updates the intra-logical block track position 30d.

The logical-NAND-layer managing unit 120b registers the logical block ID of the free block FB acquired from the physical-NAND-layer managing unit 120c, which is used as the MS compaction buffer 11c, as a new entry in the MS logical block management table 35 and registers required information in respective fields in the entry. As the registration, there are update of the track management pointer 35b, update of the number of valid tracks, update of the writable top track 35d, and the like.

The logical-NAND-layer managing unit 120b registers the logical block ID used as the MS compaction buffer 11c at the top of the FIFO structure (the linked list) of the field 61c for the TFS of the MS buffer management table 61 of the MS structure management buffer 60 to move the MS compaction buffer 11c configured by one logical block including the valid $2^i$ tracks as a result of the MS compaction to the top (an oldest position) of the TFS 11b. When the TFS 11b is full, an oldest logical block at the top is moved to the MS 11.

Subsequently, the data managing unit 120 invalidates old track at a compaction source in the MS 11. Specifically, the logical-NAND-layer managing unit 120b deletes a relevant section of a field of the track management pointer 35b in an entry corresponding to a logical block at the compaction source in the MS logical block management table 35, decrements the number of valid tracks 35c, and updates the logical block ID list by the number of valid tracks 62 of the MS structure management table 60. When the number of valid tracks 35c is reduced to 0 by the decrement, the logical-NAND-layer managing unit 120b decrements the number of valid logical blocks VBL of the MS structure management table 60, and returns this invalid logical block to the physical-NAND-layer managing unit 120c. The valid flag 35e of an entry of the MS logical block management table 35 corresponding to the returned logical block is set invalid.

When such compaction processing and processing for returning the invalid logical block FB are finished, the logical-NAND-layer managing unit 120b compares the number of valid logical blocks VBL and the maximum number of logical blocks MBL. When the number of valid logical blocks VBL exceeds the maximum number of logical blocks MBL, the logical-NAND-layer managing unit 120b executes the $2^i$ track MS compaction for collecting $2^i$ valid tracks again. When the $2^i$ track MS compaction for collecting $2^i$ valid tracks is impossible in a state in which the number of valid logical blocks VBL exceeds the maximum number of logical blocks MBL, the logical-NAND-layer managing unit 120b executes the less than $2^i$ track MS compaction.

In the less than $2^i$ track MS compaction, the logical-NAND-layer managing unit 120b copies tracks in a number less than the $2^i$ tracks as the compaction objects to the MS additional recording IB 11ab to generates an invalid logical block formed by the invalid $2^i$ tracks. The logical-NAND-layer managing unit 120b returns the generated invalid logical block to the physical-NAND-layer managing unit 120c to reduce the number of valid logical blocks VBL. Explanation of update of the management tables for the less than $2^i$ track MS compaction is omitted.

CIB Processing in the FS 12

The CIB processing in the FS 12 explained at step S340 in FIG. 19 is explained in detail. The logical-NAND-layer managing unit 120b acquires information of the number of valid clusters concerning the logical block IDs registered in the field 66a for the FSFB and the field 66b for the FS additional recording IB of the FS input buffer management table 66 of the FS/IS structure management table 65 from a field of the number of valid clusters 42d of the FS/IS logical block management table 32. The logical-NAND-layer managing unit 120b checks whether one or more full logical blocks, in which all logical pages are written with clusters, are present in the FSFB 12aa or the FS additional recording IB 12ab of the FSIB 12a (step S440). When one or more full logical blocks are present in the FSIB 12a, the logical-NAND-layer managing unit 120b performs the processing explained below. When the judgment at step S440 is NO, the procedure is finished here.

When the judgment at step S440 is YES, the logical-NAND-layer managing unit 120b checks whether an invalid logical block, the number of valid clusters 42d of which is 0, is present in the FS unit 12Q referring to the number of valid clusters 42d of the FS/IS structure management table 65 and the FS/IS logical block management table 42. When the invalid logical block is present in the FS unit 12Q, the logical-NAND-layer managing unit 120b returns the invalid logical block to the physical-NAND-layer managing unit 120c (step S445).

An entry of the returned logical block is deleted from the MS logical block management table 35 and the FS/IS logical block management table 42. The logical-NAND-layer managing unit 120b moves a full logical block in the FSFB 12aa to the FS 12 and moves a full logical block in the FS additional recording IB 12ab to the FS 12 (step S447). Specifically, the Move processing is processing for only deleting relevant logical block IDs registered in the field 66a for the FSFB and the field 66b for the FS additional recording IB of the FS input buffer management table 66 of the FS/IS structure management table 65.

The logical-NAND-layer managing unit 120b judges whether the number of logical blocks of the FS 12 having the FIFO structure exceeds a predetermined maximum number of logical blocks BLfsmax allowed for the FS 12 (step S450). Specifically, the logical-NAND-layer managing unit 120b judges whether the number of logical blocks calculated from the FS FIFO management table 67 exceeds the maximum number of logical blocks BLfsmax set in advance.

As a result of this comparison, when the calculated number of logical blocks exceeds the maximum number of logical blocks BLfsmax, the logical-NAND-layer managing unit 120b executes flush processing for, for example, two logical blocks at a time to the MS 11 (step S460) and flush processing for one logical block to the IS 13 (step S500) according to a state at that point. When the FS 12 is not full in the judgment at step S450, the logical-NAND-layer managing unit 120*b* finishes the processing here without performing flush processing from the FS 12 to the MSIB 11*a* and flush processing from the FS 12 to the ISIB 13*a*.

In the flush processing from the FS 12 to the MSIB 11*a*, first, the logical-NAND-layer managing unit 120*b* judges whether there is a logical block directly copied to the MSIB 11*a* without being moved through the IS unit 13Q from the FS 12 (step S455). Specifically, the logical-NAND-layer managing unit 120*b* checks clusters in an oldest logical block at the top of the FIFO of the FS 12 in order one by one and searches how many valid clusters a track to which the clusters belong has in the FS unit 12Q referring to a field of the number of FS clusters 31*f* of the track management table 30. When the number of valid clusters in the track is equal to or larger than a predetermined threshold (e.g., $2^{k-i-1}$), the logical-NAND-layer managing unit 120*b* sets the logical track address as a track decided to be flushed to the MSIB 11*a*.

The search is performed through a route explained below.

1. The logical-NAND-layer managing unit 120*b* obtains an oldest FS/IS block ID at the top of the FIFO from the FS FIFO management table 65 of the FS/IS structure management table 65.

2. The logical-NAND-layer managing unit 120*b* obtains an index to the intra-FS/IS cluster management table 44 from a field of the intra-block cluster table 42*c* in an entry of the FS/IS logical block management table 42 corresponding to the FS/IS block ID.

3. The logical-NAND-layer managing unit 120*b* obtains one pointer to the FS/IS management table 40 from each entry in one logical block designated by the index obtained in the intra-FS/IS cluster management table 44 and jumps to a relevant link of the FS/IS management table 40.

4. The logical-NAND-layer managing unit 120*b* obtains a relevant logical track address to which the link at a jump destination belongs.

5. The logical-NAND-layer managing unit 120*b* checks a field of the number of FS clusters 30*f* in a relevant entry of the track management table 30 using the obtained logical track address.

6. The logical-NAND-layer managing unit 120*b* repeats 3 to 5 explained above.

The flush processing from the FS 12 to the MS 11 is performed for, for example, two logical blocks at a time (block Copy). In other words, the logical-NAND-layer managing unit 120*b* collects tracks having the number of intra-track valid clusters equal to or larger than a predetermined threshold (e.g., $2^{k-i-1}$) for two logical blocks and flushes the collected tracks for two logical blocks to the MSFB 11*aa* of the MSIB 11*a* (step S460). In the flush processing, concerning clusters not present in the FS 12 in the flushed track, the logical-NAND-layer managing unit 120*b* executes the track padding for collecting the missing clusters from the MS unit 11Q and the passive merge for collecting valid clusters included in logical address range of the flushed tracks from the WC 21 and the IS unit 13Q.

However, when tracks decided to be flushed to the MSIB 11*a* are not present for two logical blocks, the logical-NAND-layer managing unit 120*b* flushes one logical block to the MSFB 11*aa* of the MSIB 11*a* (block Copy) and additionally records tracks not enough for one logical block in the MS additional recording IB 11*ab* in track units (track Copy) (step S460). Similarly, when tracks decided to be flushed to the MSIB 11*a* are not present for one logical block, the logical-NAND-layer managing unit 120*b* additionally records tracks not enough for one logical block in the MS additional recording IB 11*ab* in track units (track Copy) (step S460). Thereafter, when no valid cluster is left in the top logical block of the FS 12 of the FIFO structure, the logical-NAND-layer managing unit 120*b* returns the top logical block to the physical-NAND-layer managing unit 120*c* as an invalid logical block.

CIB Processing in the MS 11 (Step S350 in FIG. 19)

When the flush from the FS 12 to the MSIB 11*a* is performed in this way, the CIB processing in the MS unit 11Q is again executed (step S480). The CIB processing in the MS unit 11Q at step S480 is the same as the CIB processing in the first time in the MS unit 11Q (steps S400 to S420). Therefore, redundant explanation is omitted. After the CIB processing in the MS unit 11Q, the logical-NAND-layer managing unit 120*b* checks in the same manner as explained above whether a condition for flush from the FS 12 to the MSIB 11*a* is satisfied (step S455). When the flush condition is satisfied, the flush of every two logical blocks from the FS 12 to the MSIB 11*a* and the CIB processing in the MS 11 explained above is again executed. Such processing is repeated until the judgment NO is obtained at step S455.

CIB Processing in the FS 12

When the judgment at step S455 is NO, the logical-NAND-layer managing unit 120*b* judges whether a condition for flush from the FS 12 to the ISIB 13*a* is satisfied (step S490). Specifically, in the flush processing from the FS 12 to the MSIB 11*a*, when a valid cluster is left in the checked top logical block of the FS 12 in a full state having the FIFO structure, the logical-NAND-layer managing unit 120*b* executes flush from the FS 12 to the ISIB 13*a* assuming that condition for flush from the FS 12 to the IS 13 at step S490 is satisfied.

When the condition is satisfied at step S490, the logical-NAND-layer managing unit 120*b* moves the top logical block including only clusters not included in the track flushed to the MSIB 11*a* to the ISIB 13*a* (block Move) (step S500). At step S500, the logical-NAND-layer managing unit 120*b* executes, for example, flush of one logical block. Depending on a state, thereafter, after performing the procedure at steps S520 to S585, the logical-NAND-layer managing unit 120*b* may perform the flush from the FS 12 to the ISIB 13*a* at step S500 again according to the judgment at step S590.

A state in which the flush is performed again at step S500 is a state in which, for example, when a buffer (the FSFB 12*a* or the FS additional recording IB 12*ab*) having a plurality of full logical blocks is present in the FSIB 12*a*, if the FS 12 having the FIFO structure is full, flush of a plurality of logical blocks from the FS 12 to the MSIB 11*a* or the ISIS 13*a* is performed according to the move of a full block from the FSIB 12*a* to the FS 12. Under such a condition, it is likely that flush of a plurality of logical blocks from the FS 12 to the ISIS 13*a* is performed.

CIB Processing in the IS (Step S360 in FIG. 19)

Details of flush processing and compaction processing performed in the IS 13 when the condition at step S490 is satisfied are explained with reference to, besides FIG. 30, a flowchart shown in FIG. 31. First, in the same manner as explained above, the logical-NAND-layer managing unit 120*b* checks whether an invalid logical block is present in the IS unit 13Q and, when an invalid logical block is present in the IS unit 13Q, returns the invalid logical block to the physical-NAND-layer managing unit 120*c* (step S520). In entries of the MS logical block management table 35 and the FS/IS logical block management table 42 corresponding to an entry of the returned logical block, the valid flags 35*e* and 42*f* are set invalid.

The logical-NAND-layer managing unit 120b judges whether the number of logical blocks of the IS 13 having the FIFO structure exceeds the predetermined maximum number of logical blocks BLismax allowed for the IS 13 (step S530). Specifically, the logical-NAND-layer managing unit 120b judges whether the number of logical blocks calculated from the IS FIFO management table 69 exceeds the maximum number of logical blocks BLismax set in advance.

As a result of the comparison, when the calculated number of logical blocks exceeds the maximum number of logical blocks BLismax, the logical-NAND-layer managing unit 120b flushes tracks for, for example, two logical blocks at a time from the IS 13 to the MSFB 11aa of the MSIB 11a (step S540). When the IS 13 is not full in the judgment at step S530, the logical-NAND-layer managing unit 120b moves a full logical block in the ISIB 13a to the IS 13b without performing flush processing to the MSIB 11a (step S585).

Figure 12:
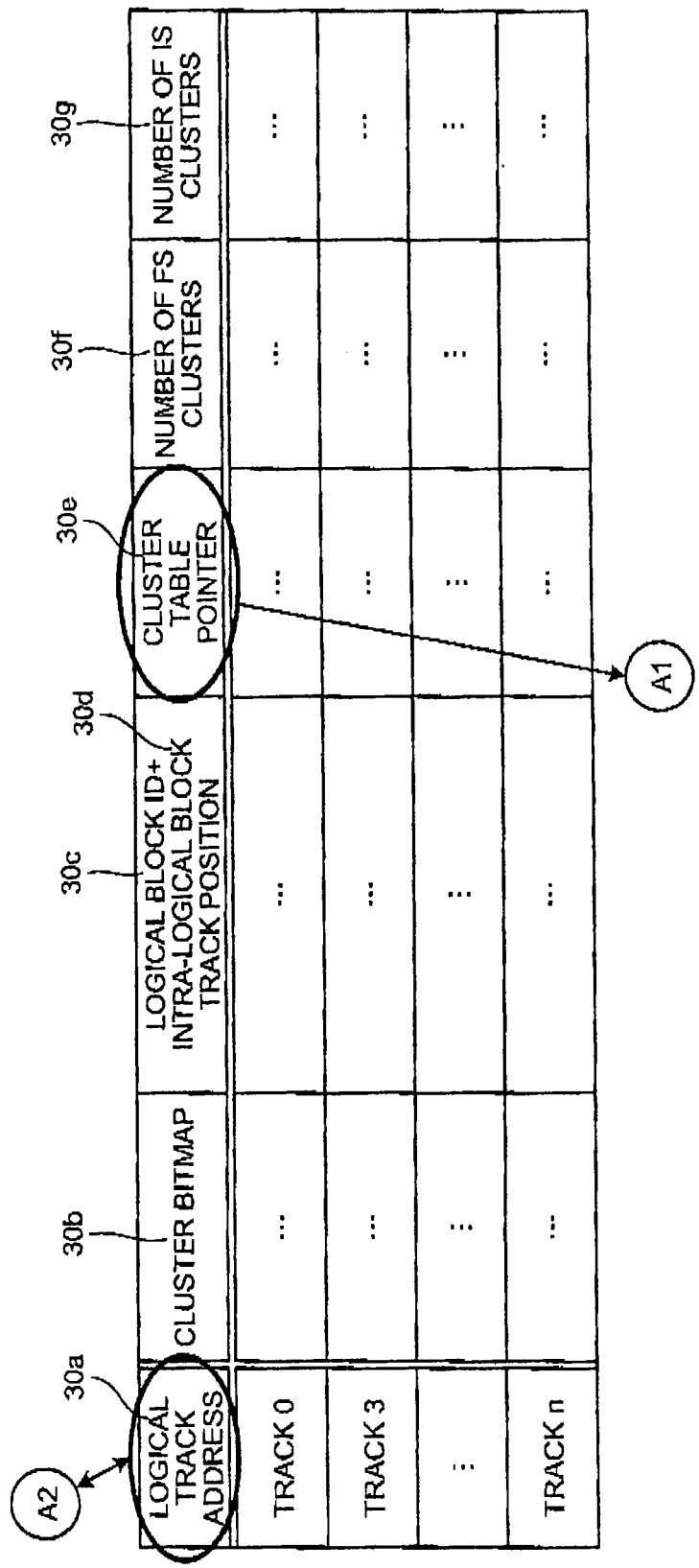
FIG. 12 is a diagram of an example of a track management table.
Figure 31:
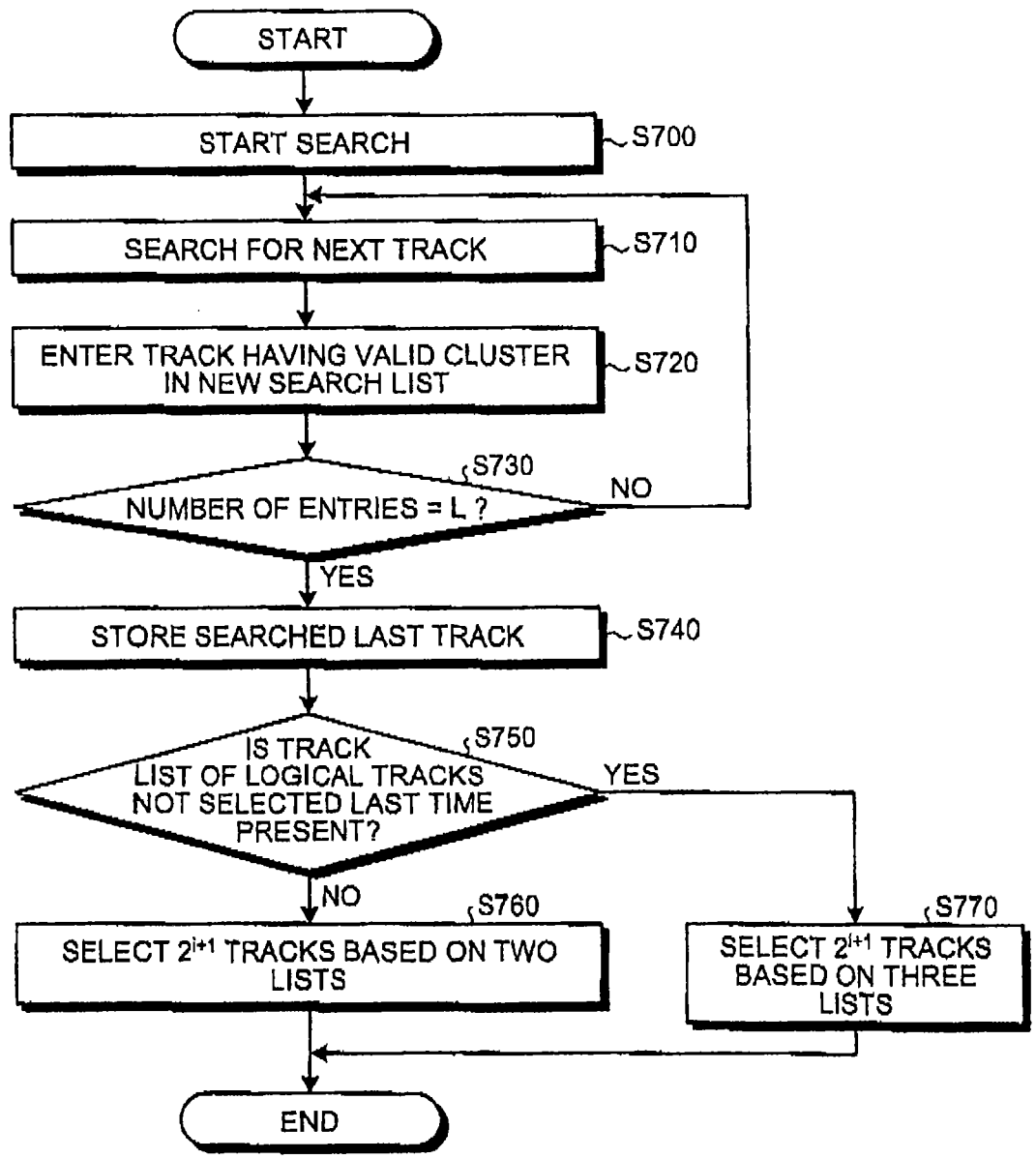
FIG. 31 is a flowchart of an example of a flush operation of an IS.

In the flush at step S540, the logical-NAND-layer managing unit 120b executes processing for selecting a track to be flushed shown in FIG. 31 using the track management table 30 or the like shown in FIG. 12. In FIG. 31, the logical-NAND-layer managing unit 120b starts the selection processing (cyclic search processing; hereinafter simply referred to as search processing) (step S700). The logical-NAND-layer managing unit 120b starts a search from the next logical track address of the logical track address 30a as an index of the track management table 30 stored at step S740 as a final searched track in the last search (step S710).

When the search is a search for the first time (a first cycle), the logical-NAND-layer managing unit 120b starts the search from a first entry of the track management table 30 (step S710). When the searched track stored at step S740 is a final entry (a track n in FIG. 12) of the track management table 30, in the next track search at step S710, the logical-NAND-layer managing unit 120b returns to the top entry (a track 0 in FIG. 12).

In this search, referring to a field (the number of valid clusters in a relevant logical track address) of the number of IS clusters 30g in the entry of the track management table 30, when a valid cluster is stored in the entry of the IS 13, the logical-NAND-layer managing unit 120b registers a logical track address of the entry in a not-shown newly searched track list (step S720). The logical-NAND-layer managing unit 120b compares the number of tracks registered in the newly searched track list with a predetermined threshold L. When the number of registered track is smaller than the threshold L, the logical-NAND-layer managing unit 120b shifts the procedure to step S710 and checks the next entry of the track management table 30 in the same manner as explained above.

By repeating such processing, the logical-NAND-layer managing unit 120b registers logical track addresses for the threshold L in the newly searched track list ("Yes" at step S730). The logical-NAND-layer managing unit 120b stores an entry (an index) of the track management table 30 corresponding to a logical track addresses registered in the newly searched track list last as a searched last track and finishes the search in the present cycle (step S740).

The logical-NAND-layer managing unit 120b judges whether there is an unselected track list in which logical track addresses not selected last time (not shown) are listed (step S750). In the case of the first cycle, because the unselected track list is not present, the logical-NAND-layer managing unit 120b selects $2^{i+1}$ logical tracks based on two lists, i.e., the newly searched track list and newly added intra-block track list (not shown) (step S760). The newly added intra-block track list is a list concerning tracks included in the logical block (entered in the IS input buffer management table 68 of the FS/IS structure management table 65) flushed from the FS 12 to the IS unit 13Q at step S500 in FIG. 30.

In the first cycle, the logical-NAND-layer managing unit 120b selects $2^{i+1}$ tracks as flush candidates using such two lists. In the selection, as explained above, a selection reference (score value) S obtained by using the number of valid clusters in track and a valid cluster coefficient is used.

Score value $S$=the number of valid clusters in track× valid cluster coefficient The valid cluster coefficient is a number weighted according to whether a track is present in a logical block in which an invalid track is present in the MS unit 11Q. The number is larger when the track is present than when the track is not present.

The number of valid clusters can be acquired by looking at a field of the number of IS clusters 30g of the track management table 30. The valid cluster coefficient can be acquired by looking at a field of the number of valid tracks 35c of the MS logical block management table 35 linked to the track management table 30 by a field of the track management pointer 35b.

The logical-NAND-layer managing unit 120b selects M (a predetermined set value) tracks with larger score values S from a plurality of tracks included in the newly added intra-block track list. The logical-NAND-layer managing unit 120b adds L tracks registered in the newly searched track list by the prior search to the selected M tracks and selects $2^{i+1}$ tracks with higher score values S from the L+M tracks as tracks to be flushed to the MS 11. The logical-NAND-layer managing unit 120b registers tracks other than the selected $2^{i+1}$ tracks among the L+M tracks in the unselected track list.

In a second or subsequent cycle, the logical-NAND-layer managing unit 120b selects $2^{i+1}$ tracks based on three lists, i.e., the unselected track list, the newly searched track list, and the newly added intra-block track list (step S770). It is determined according to judgment at step S570 in FIG. 30 explained later whether flush for a second or subsequent time should be performed. In the selection processing using the three lists, the logical-NAND-layer managing unit 120b selects N (a predetermined set value) tracks with higher score values S from a plurality of tracks included in the unselected track list, selects M (a predetermined set value) tracks with higher score values S from a plurality of tracks included in the newly added intra-block track list, adds L tracks registered in the newly searched track list obtained in the present second or subsequent cycle to the N+M tracks, and selects $2^{i+1}$ tracks with higher score values S out of the L+M+N tracks as tracks to be flushed to the MS 11. The logical-NAND-layer managing unit 120b registers tracks other than the selected $2^{i+1}$ tracks among the L+M+N logical tracks in the unselected track list used in the next cycle.

Figure 30:
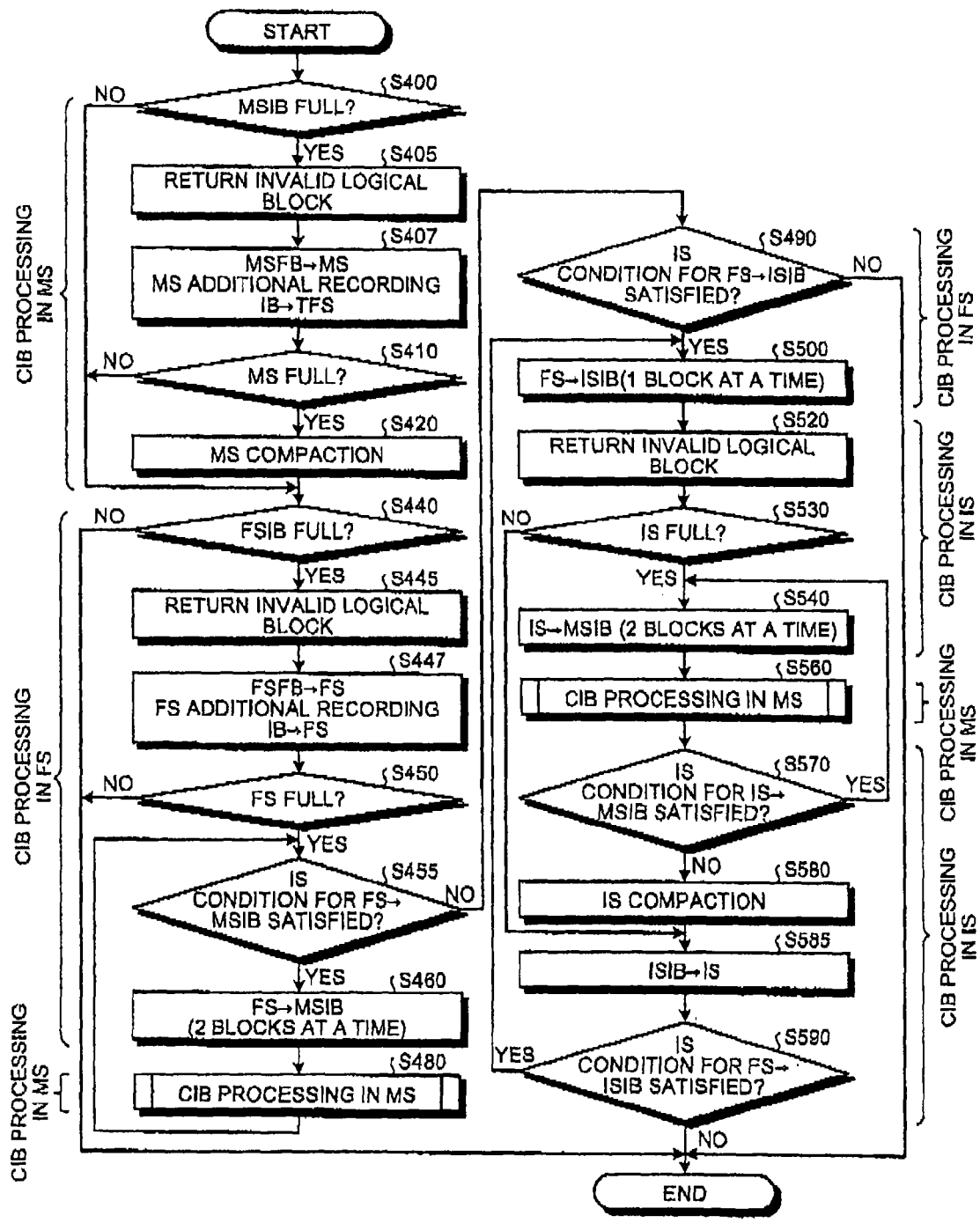
FIG. 30 is a detailed flowchart of an operation example of write processing.

Referring back to step S540 in FIG. 30, when the flush candidates of the tracks for two logical blocks are selected as explained above, the logical-NAND-layer managing unit 120b flushes the selected tracks for two logical blocks (i.e., $2^{i+1}$ tracks) to the MSFB 11aa of the MSIB 11a (step S540). In the flush processing, concerning clusters not present in the IS unit 13Q among the tracks to be flushed, the logical-NAND-layer managing unit 120b executes the track padding for collecting the missing clusters from the MS 11 unit 11Q and the passive merge for collecting valid clusters included in logical address range of the flushed tracks from the WC 21 and the FS unit 12Q. In the above description, the tracks to be flushed are selected according to the score value S based on the number of valid clusters and the coefficient indicating whether porous blocks are present in the MS. However, tracks to be flushed may be selected according to only the number of valid clusters.

CIB Processing in the MS (Step S370 in FIG. 19)

When the flush from the IS 13 to the MSIB 11a is performed in this way, the CIB processing in the MS 11 is again executed (step S560). The CIB processing in the MS 11 at step S560 is the same as the CIB processing in the MS 11 in the first time (steps S400 to S420). Therefore, redundant explanation is omitted.

CIB Processing in the IS

The logical-NAND-layer managing unit 120b judges whether flush from the IS 13 to the MSIB 11a should be executed again (step S570). The logical-NAND-layer managing unit 120b sorts, using fields of the MS logical block management table 35 and the number of valid clusters 42d of the FS/IS logical block management table 42 and the like, logical blocks in the IS 13 after the flush at step S540 in order from one with a smallest number of valid clusters. When a total number of valid clusters of two logical blocks with a smallest number of valid clusters is equal to or larger than $2^k$ (for one logical block), which is a predetermined set value, the logical-NAND-layer managing unit 120b judges that a condition for flush from the IS 13 to the MSIB 11a is satisfied (step S570).

When the condition for flush from the IS 13 to the MSIB 11a is satisfied, the logical-NAND-layer managing unit 120b shifts the procedure to step S540 and executes steps S700 to S750 and S770 in FIG. 31 to execute the flush processing for two logical blocks explained above again. As long as the judgment at step S570 is YES, the logical-NAND-layer managing unit 120b repeatedly executes the flush processing for two logical blocks from the IS 13 to the MSIB 11a and the CIB processing in the MS 11. When the judgment at step S570 is NO, the logical-NAND-layer managing unit 120b executes the compaction processing in the IS 13 (step S580).

In the IS compaction processing, the logical-NAND-layer managing unit 120b collects, using fields of the MS logical block management table 35 and the number of valid clusters 42d of the FS/IS logical block management table 42 and the like, clusters for one logical block in order from a logical block having a smallest number of valid clusters in the IS unit 13Q, i.e., $2^k$ clusters and copies the $2^k$ clusters to the IS compaction buffer 13c. When this copy processing is finished, the logical-NAND-layer managing unit 120b returns logical blocks without valid clusters among the logical blocks at a compaction source (a Copy source) to the physical-NAND-layer managing unit 120c as invalid logical blocks. The logical-NAND-layer managing unit 120b moves the IS compaction buffer 13c configured by logical blocks filled with valid clusters by the compaction processing to the IS 13.

After this compaction, full logical blocks in the ISIB 13a is moved to the IS 13 (step S585). Specifically, this Move processing is processing for only deleting a relevant logical block ID registered in the field for the ISIB of the IS input buffer management table 68 of the FS/IS structure management table 65.

Thereafter, the logical-NAND-layer managing unit 120b judges whether the condition for flush from the FS 12 to the ISIB 13a is satisfied (step S590). When the condition for flush from the FS 12 to the ISIB 13a is satisfied, the logical-NAND-layer managing unit 120b shifts the procedure to step S500 and repeats the procedure again. After the IS compaction processing is finished, when it is judged that the condition for flush from the FS 12 to the ISIB 13a is not satisfied, the logical-NAND-layer managing unit 120b finishes the present write processing. The above is the details of the write processing.

A main part of this embodiment is explained in detail. As explained above, when the $2^i$ track MS compaction or the less than $2^i$ track compaction is performed, logical blocks having invalidated tracks among the logical blocks in the MS 11 not included in the MSIB 11a and the TFS 11b are sorted with the number of valid tracks in the logical block by referring to, for example, the field of the number of valid tracks 35c of the MS logical block management table 35 in advance. Therefore, a method of efficiently managing the logical block in the MS 11 with the number of valid tracks and increasing speed of compaction is explained below.

As explained above, the MS logical block management table 35 shown in FIG. 14 is used for the compaction of the MS 11. In this embodiment, to reduce processing time of the compaction of the MS 11, the number of valid tracks in the logical block is managed by a linked list (a link list) for each number of valid tracks. Specifically, the linked list for each number of valid tracks is formed in the MS logical block management table 35.

FIG. 32 is a diagram of an example of an MS logical block management table having the linked list for each number of valid tracks. As shown in FIG. 32, the MS logical block management table 35 is formed in an array format with the logical block ID 35a set as an index. As entries, besides the track management pointer 35b, the number of valid tracks 35c, the writable top track 35d, and the valid flag 35e, a previous pointer 35g and a next pointer 35h are added.

As explained above, the number of valid tracks 35c indicates the number of valid tracks (maximum $2^i$) among tracks stored in the logical block designated by the logical block ID 35a.

In the MS logical block management table 35, a linked list structure is formed for each number of valid tracks by the previous pointer 35g and the next pointer 35h. The next pointer 35h indicates a pointer to the next entry liked for each number of valid tracks. The previous pointer 35g indicates a pointer to an immediately preceding entry linked for each number of valid tracks.

Figure 33:
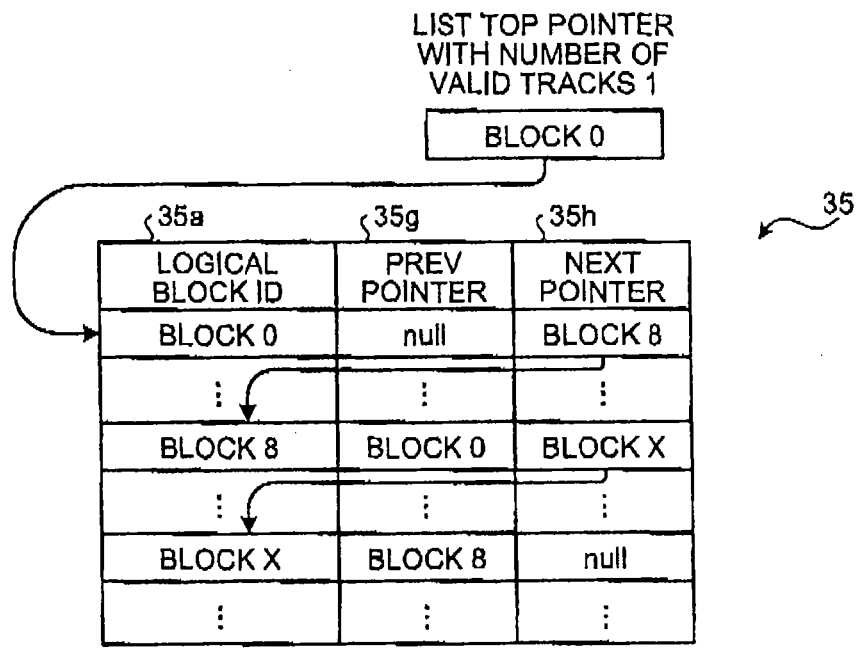
FIG. 33 is a diagram for explaining the structure of the linked list.

FIG. 33 is a diagram for explaining the structure of the linked list. Linked lists of the number of valid tracks 1, the number of valid tracks 2, . . . , and the number of valid tracks $2^i$ have the same structure. Therefore, as an example of the linked lists, the linked list of the number of valid tracks 1 is explained.

The MS logical block management table 35 has a list top pointer of the number of valid tracks 1. The list top pointer is a pointer to a top entry of each number of valid tracks of the MS logical block management table 35. For example, a special entry (not shown) for linked list management is provided at the end of the MS logical block management table 35. A list top pointer corresponding to each number of valid tracks is stored in this entry.

To retrieve a logical block ID of the number of valid tracks 1, first, a top entry of the number of valid tracks 1 is retrieved based on the list top pointer of the number of valid tracks 1. In FIG. 33, a logical block 0 is a top entry of the number of valid tracks 1.

In the MS logical block management table 35, each of logical block IDs 35a are associated with the previous pointer 35g and the next pointer 35h. The previous entry and the next entry are indicated by the previous pointer 35g and the next pointer 35h.

In FIG. 33, the next pointer 35h of the logical block 0 indicates an entry of a logical block 8 as the next entry of the number of valid tracks 1 (the next entry of the logical block 0). The next pointer 35*h* of the logical block 8 indicates an entry of a logical block X as the next entry of the number of valid blocks 1 (the next entry of the logical block 8). The previous pointer 35*g* of the block X indicates the entry of the logical block 8 as the immediately preceding entry of the number of valid tracks 1. The previous pointer 35*g* of the logical block 8 indicates an entry of the logical block 0 as the immediately preceding entry of the number of valid tracks 1.

When the logical block 0 is retrieved as the top entry of the number of valid tracks 1, the logical-NAND-layer managing unit 120*b* retrieves the logical block 8 as the next entry of the number of valid tracks 1 based on the next pointer 35*h* of the logical block 0. When the logical block 8 is retrieved as an entry of the number of valid tracks 1, the logical-NAND-layer managing unit 120*b* retrieves the logical block X as the next entry of the number of valid tracks 1 based on the next pointer 35*h* of the logical block 8. In this way, the logical-NAND-layer managing unit 120*b* retrieves entries of the number of valid tracks 1 in order and performs the compaction processing using logical blocks of the retrieved entries.

In FIG. 33, the logical blocks of the number of valid tracks 1 are retrieved. However, in the MS logical block management table 35, a logical block with the number of valid tracks 1, a logical block with the number of valid tracks 2, . . . , and a logical block with the number of valid tracks $2^i$ (equivalent to one logical block) have linked list structures, respectively. Therefore, the logical-NAND-layer managing unit 120*b* can retrieve a logical block for each number of valid tracks.

As explained above, a logical block can be retrieved for each number of valid tracks from the MS logical block management table 35. Therefore, it is possible to quickly find an appropriate logical block (a logical block with a small number of valid tracks) used for compaction from the MS logical block management table 35. When there is no linked list, to extract a logical block with a small number of valid tracks, for example, work for searching through the MS logical block management table 35 in order from the logical block 0 is necessary. However, in this method, it is likely that an optimum solution is not obtained unless the MS logical block management table 35 is searched through to the end.

As a method of extracting a logical block for each number of valid tracks, there is a method of using the logical block ID list by the number of valid tracks 62 shown in FIG. 28. In this method, before the logical-NAND-layer managing unit 120*b* performs compaction in the MS 11, logical blocks (logical block ID) in the MS 11 have to be sorted with the number of valid tracks.

On the other hand, in this embodiment, the MS logical block management table 35 can be searched through in order from a logical block with a smallest number of valid tracks using the linked lists. Therefore, it is possible to easily find a set of logical blocks with small numbers of valid tracks necessary for efficiently performing compaction. When the compaction is performed, the logical block ID list by the number of valid tracks 62 is unnecessary. Therefore, it is possible to efficiently perform management concerning the compaction in a narrow area.

Figure 34:
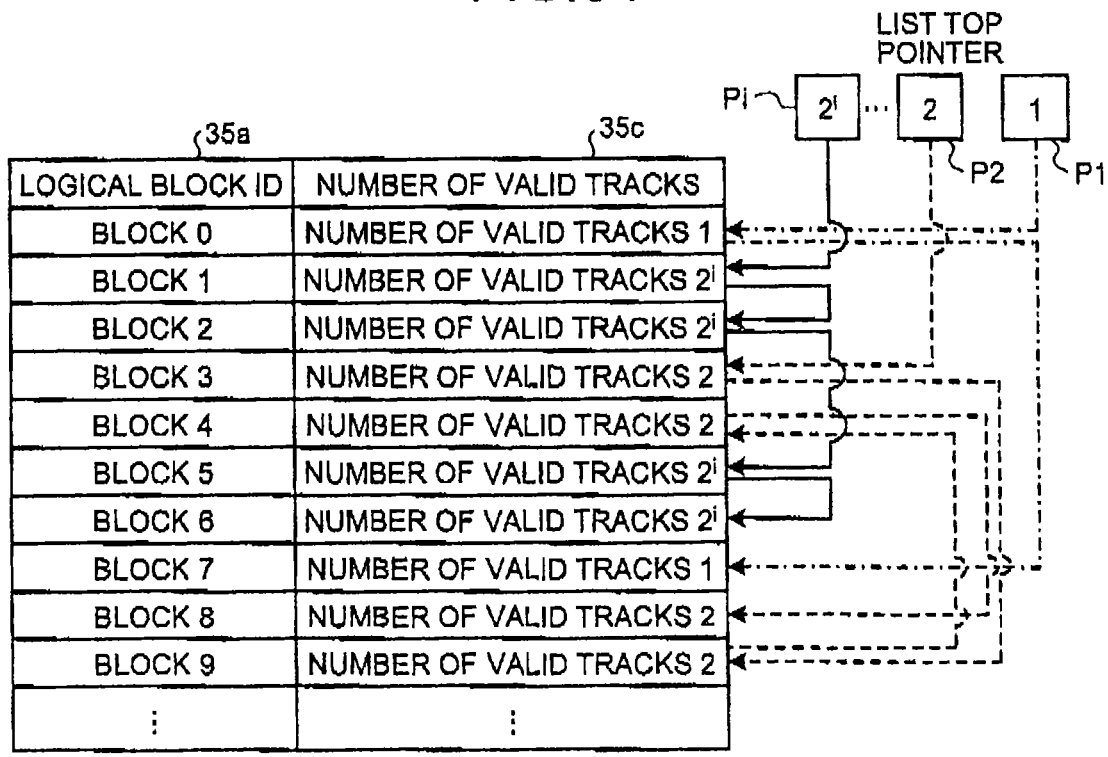
FIG. 34 is a diagram for explaining the linked list for each number of valid tracks.

FIG. 34 is a diagram for explaining the linked list for each number of valid tracks. In the figure, a list top pointer P1 of the number of valid tracks 1 indicates a logical block 0, a list top pointer P2 of the number of valid tracks 2 indicates a logical block 3, and a list top pointer Pi of the number of valid tracks $2^i$ indicates a logical block 1.

Logical blocks of the number of valid tracks 1 form (couple) linked lists in order of the logical block 0 and a logical block 7. Logical blocks of the number of valid tracks 2 form liked lists in order of the logical block 3, a logical block 9, a logical block 4, and a logical block 8. Logical blocks of the number of valid tracks $2^i$ form linked lists in order of the logical block 1, a logical block 2, a logical block 5, and a logical block 6.

Therefore, when the logical-NAND-layer managing unit 120*b* retrieves logical blocks of the number of valid tracks 1, the logical blocks can be retrieved in order of the logical block 0 and the logical block 7. When the logical-NAND-layer managing unit 120*b* retrieves logical blocks of the number of valid tracks 2, the logical blocks can be retrieved in order of the logical block 3, the logical block 9, the logical block 4, and the logical block 8. When the logical-NAND-layer managing unit 120*b* retrieves logical blocks of the number of valid tracks $2^i$, the logical blocks can be retrieved in order of the logical block 1, the logical block 2, the logical block 5, and the logical block 6.

When logical blocks with small numbers of valid tracks are collected to perform compaction, the compaction can be efficiently performed because useless movement of data is reduced. Therefore, in this embodiment, logical blocks are selected in order of preference from a logical block with a smallest number of valid tracks and the compaction of the logical blocks in the order of selection.

Specifically, the logical-NAND-layer managing unit 120*b* selects logical blocks in order of preference from a logical block with a smallest number of valid tracks from the MS logical block management table 35 using the linked lists. When $2^i$ valid tracks are collected, the logical-NAND-layer managing unit 120*b* executes $2^i$ track MS compaction via the MS compaction buffer 11*c* (first compaction target block). When it is impossible to collect $2^i$ valid tracks, the logical-NAND-layer managing unit 120*b* executes the less than $2^i$ track compaction via the MS additional recording IB 11*ab* (second compaction target block) for collecting the number of valid tracks smaller than $(2^i-1)$ from the logical blocks.

In the above explanation, a linked list is formed for the logical block with the number of tracks $2^i$ (a maximum number). However, the logical block with the number of valid tracks $2^i$ may be excluded from compaction targets. In this case, linked lists only have to be formed for logical blocks with the numbers of valid tracks 1 to $(2^i-1)$.

Figure 35:
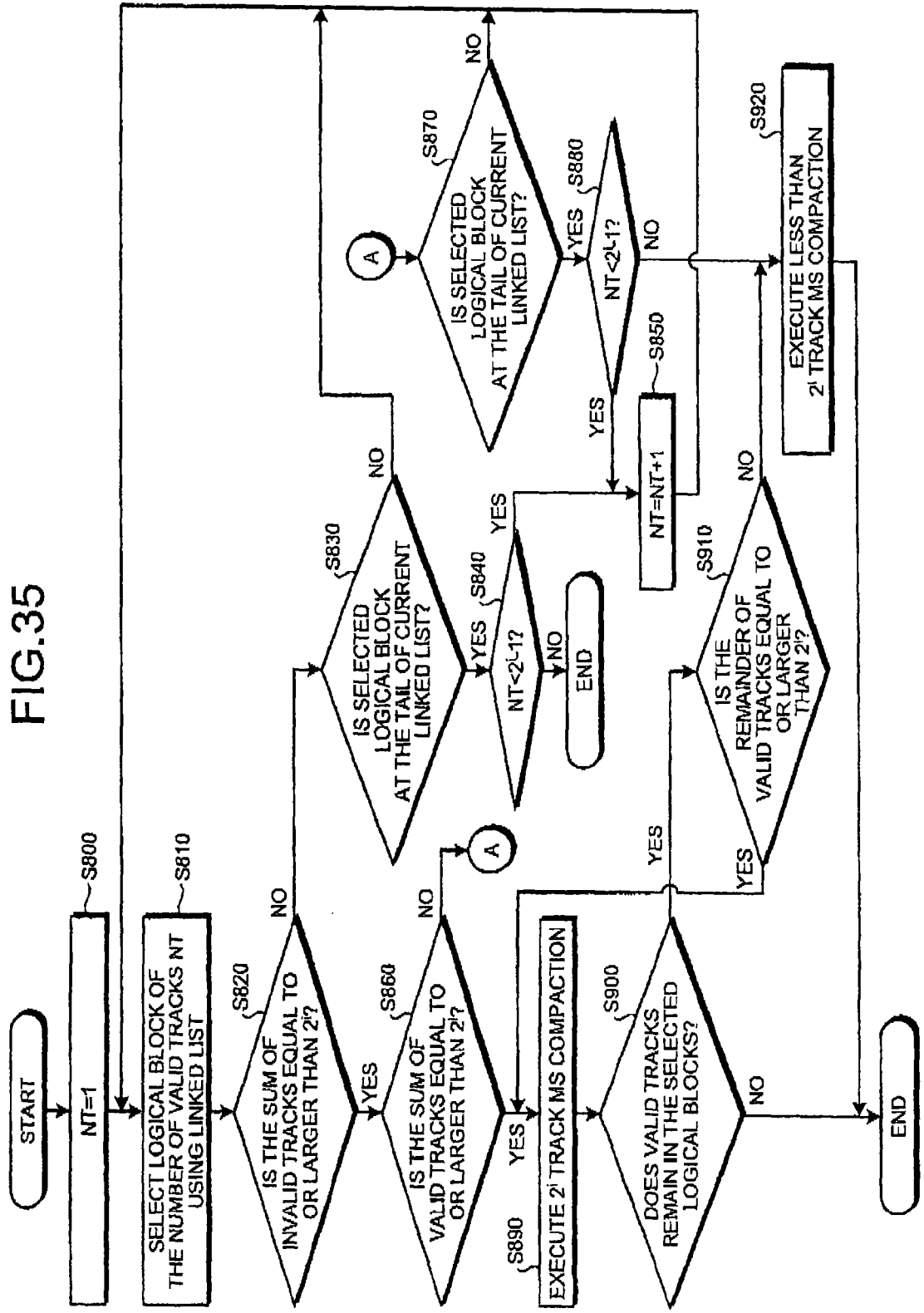
FIG. 35 is a flowchart of an example of compaction processing in a MS.

FIG. 35 is a flowchart of an example of the compaction processing in the MS 11. When the number of valid logical blocks VBL exceeds the maximum number of logical blocks MBL, the logical-NAND-layer managing unit 120*b* executes the compaction processing. The logical-NAND-layer managing unit 120*b* sets the number of valid tracks NT for the linked list to be 1 (step S800).

The logical-NAND-layer managing unit 120*b* checks the list top pointer P(NT) and selects a logical block of the number of valid tracks NT using the linked list (step S810). When a logical block of the number of valid tracks NT does not detected, the logical-NAND-layer managing unit 120*b* shifts the procedure to step S820.

The logical-NAND-layer managing unit 120*b* judges, for creating at least one free block FB by collecting valid tracks, whether the sum of invalid tracks in the selected logical blocks is equal to or larger than $2^i$ (step S820). When the sum of invalid tracks is equal to or larger than $2^i$ ("Yes" at step S820), the logical-NAND-layer managing unit 120*b* shifts the procedure to step S860. When the sum of invalid tracks is smaller than $2^i$ ("No" at step S820), the logical-NAND-layer managing unit 120*b* shifts the procedure to step S830.

The logical-NAND-layer managing unit 120*b* judges whether the selected logical block is at the tail of the current linked list (step S830). Specifically, the logical-NAND-layer managing unit 120*b* judges whether the next pointer 35*h* indicates null in FIG. 33. When the selected logical block is at the tail of the current linked list ("Yes" at step S830), the logical-NAND-layer managing unit 120*b* shifts the procedure to step S840. When the selected logical block is not at the tail of the current linked list ("No" at step S830), the logical-NAND-layer managing unit 120*b* shifts the procedure to step S810 and further selects a logical block indicated by the next pointer 35*h*.

The logical-NAND-layer managing unit 120*b* judges whether the number of valid tracks NT for the current linked list is smaller than $2^i-1$ (step S840). When the number of valid tracks NT for the current linked list is smaller than $2^i-1$ ("Yes" at step S840), the logical-NAND-layer managing unit 120*b* shifts the procedure to step S850. When the number of valid tracks NT for the current linked list is not smaller than $2^i-1$ ("No" at step S840), since a free block FB can not be created, the logical-NAND-layer managing unit 120*b* completes the compaction processing.

The logical-NAND-layer managing unit 120*b* increments the number of valid tracks NT for the linked list and checks the list top pointer P(NT+1) (step S850). The logical-NAND-layer managing unit 120*b* shifts the procedure to step S810 and further selects a logical block of the number of valid tracks NT+1 using the linked list.

The logical-NAND-layer managing unit 120*b* judges whether the sum of valid tracks in the selected logical blocks is equal to or larger than $2^i$ (step S860). If the writing of data in one logical page may cause data corruption in other logical page of the same logical block, data protection processing is required. For example, the logical-NAND-layer managing unit 120*b* copies data which may be corrupted before writing of data in appending manner. Since the writing of $2^i$ valid tracks (equivalent to a size of one logical block) at a time does not require such data protection processing and contributes to improvement of the writing efficiency, the logical-NAND-layer managing unit 120*b* collects as much as $2^i$ valid tracks. When the sum of valid tracks is equal to or larger than $2^i$ ("Yes" at step S860), the logical-NAND-layer managing unit 120*b* shifts the procedure to step S890. When the sum of valid tracks is smaller than $2^i$ ("No" at step S860), the logical-NAND-layer managing unit 120*b* shifts the procedure to step S870.

The logical-NAND-layer managing unit 120*b* judges whether the selected logical block is at the tail of the current linked list (step S870). When the selected logical block is at the tail of the current linked list ("Yes" at step S870), the logical-NAND-layer managing unit 120*b* shifts the procedure to step S880. When the selected logical block is not at the tail of the current linked list ("No" at step S870), the logical-NAND-layer managing unit 120*b* shifts the procedure to step S810 and further selects a logical block indicated by the next pointer 35*h*.

The logical-NAND-layer managing unit 120*b* judges whether the number of valid tracks NT for the current linked list is smaller than $2^i-1$ (step S880). When the number of valid tracks NT for the current linked list is smaller than $2^i-1$ ("Yes" at step S880), the logical-NAND-layer managing unit 120*b* shifts the procedure to step S850. When the number of valid tracks NT for the current linked list is not smaller than $2^i-1$ ("No" at step S880), the logical-NAND-layer managing unit 120*b* shifts the procedure to step S920.

The logical-NAND-layer managing unit 120*b* executes the $2^i$ MS compaction described above (step S890). Specifically, the logical-NAND-layer managing unit 120*b* requires a free block FB to the physical-NAND-layer managing unit 120*c* as the MS compaction buffer 11*c*. The logical-NAND-layer managing unit 120*b* collects $2^i$ valid tracks in the selected logical blocks and writes $2^i$ valid tracks in the MS compaction buffer 11*c* in logical block unit (block Copy).

The logical-NAND-layer managing unit 120*b* judges whether at least one valid track remains in the selected logical blocks (step S900). When at least one valid track remains in the selected logical blocks ("Yes" at step S900), the logical-NAND-layer managing unit 120*b* shifts the procedure to step S910. When at least one valid track does not remain in the selected logical blocks ("No" at step S900), the logical-NAND-layer managing unit 120*b* completes the compaction processing.

The logical-NAND-layer managing unit 120*b* judges whether the remainder of valid tracks in the selected logical blocks is equal to or larger than $2^i$ (step S910). When the remainder of valid tracks in the selected logical blocks is equal to or larger than $2^i$ ("Yes" at step S910), the logical-NAND-layer managing unit 120*b* shifts the procedure to step S890. When the remainder of valid tracks in the selected logical blocks is smaller than $2^i$ ("No" at step S910), the logical-NAND-layer managing unit 120*b* shifts the procedure to step S920.

The logical-NAND-layer managing unit 120*b* executes the less than $2^i$ MS compaction described above (step S920). Specifically, the logical-NAND-layer managing unit 120*b* collects less than $2^i$ valid tracks in the selected logical blocks and writes valid tracks in the MS additional recording IB 11*ab* in track unit (track Copy). After writing all valid tracks in the selected logical blocks, the logical-NAND-layer managing unit 120*b* completes the compaction processing.

The previous pointer 35*g*, the next pointer 35*h*, and the list top pointer are updated in the following cases:
  when a logical block is registered in the TFS 11*b* anew;
  when a logical block is registered in the MS 11 anew; and
  when a track having a logical track address same as that of a track in a logical block is written in other logical blocks and the original track in the logical blocks is invalidated (when the number of valid tracks decreases).

In other words, from the time when a logical block is started to be used by the MS 11 until the logical block is released as a free block FB, every time the number of valid tracks changes, the previous pointer 35*g*, the next pointer 35*h*, and the list top pointer are re-linked to relevant lists (entries).

The logical blocks (compaction source blocks) for which compaction is completed and in which all tracks are invalidated is deleted from an entry in the MS logical block management table 35. The MS compaction buffer 11*c* filled with $2^i$ valid tracks, which is generated by the compaction processing, is registered in the MS logical block management table 35.

In the explanation of this embodiment, a top entry (a logical block ID) of each number of valid tracks in the MS logical block management table 35 is designated by a list top pointer. However, the list top pointer does not have to be provided. In this case, any one of entries having the numbers of valid tracks as retrieval targets is retrieved from the MS logical block management table 35. Thereafter, logical block IDs having the numbers of valid tracks as the retrieval targets are retrieved in order by using the previous pointer 35*g* and the next pointer 35*h* of the retrieved entry.

In this embodiment, the linked list structure is formed for each number of valid tracks by the previous pointer 35*g* and the next pointer 35*h*. However, the linked list structure can be formed for each number of valid tracks only by the next pointer 35*h*.

In this embodiment, a linked list is applied to the MS logical block management table 35 to manage a logical block for each number of valid tracks. However, a linked list can be applied to the FS/IS logical block management table 42 to manage a logical block and an FS/IS block for each number of valid clusters.

As explained above, in this embodiment, a logical block is managed for each number of valid tracks with a linked list in the MS logical block management table 35. Therefore, a logical block for each number of valid tracks can be easily and quickly retrieved from the MS 11. Further, because compaction can be performed in order from a logical block with a smallest number of valid tracks, it is possible to efficiently perform the compaction without increasing unnecessary data movement. Therefore, it is possible to reduce processing time of the compaction.

In the MS logical block management table 35, a top entry of each number of valid tracks is designated by a list top pointer. Therefore, it is easy to retrieve a logical block for each number of valid tracks.

A logical block is managed for each number of valid tracks by the bidirectional linked list formed by the previous pointer 35*a* and the next pointer 35*h*. Therefore, when the number of valid tracks of a certain logical block decreases, it is possible to easily re-link the logical block to another linked list.

The present invention is not limited to the embodiments described above. Accordingly, various modifications can be made without departing from the scope of the present invention.

Furthermore, the embodiments described above include various constituents with inventive step. That is, various modifications of the present invention can be made by distributing or integrating any arbitrary disclosed constituents.

For example, various modifications of the present invention can be made by omitting any arbitrary constituents from among all constituents disclosed in the embodiments as long as problem to be solved by the invention can be resolved and advantages to be attained by the invention can be attained.

Furthermore, it is explained in the above embodiments that a cluster size multiplied by a positive integer equal to or larger than two equals to a logical page size. However, the present invention is not to be thus limited.

For example, the cluster size can be the same as the logical page size, or can be the size obtained by multiplying the logical page size by a positive integer equal to or larger than two by combining a plurality of logical pages.

Moreover, the cluster size can be the same as a unit of management for a file system of OS (Operating System) that runs on the host apparatus 1 such as a personal computer.

Furthermore, it is explained in the above embodiments that a track size multiplied by a positive integer equal to or larger than two equals to a logical block size. However, the present invention is not to be thus limited.

For example, the track size can be the same as the logical block size, or can be the size obtained by multiplying the logical block size by a positive integer equal to or larger than two by combining a plurality of logical blocks.

If the track size is equal to or larger than the logical block size, MS compaction processing is not necessary. Therefore, the TFS 11*b* can be omitted.

Second Embodiment

Figure 36:
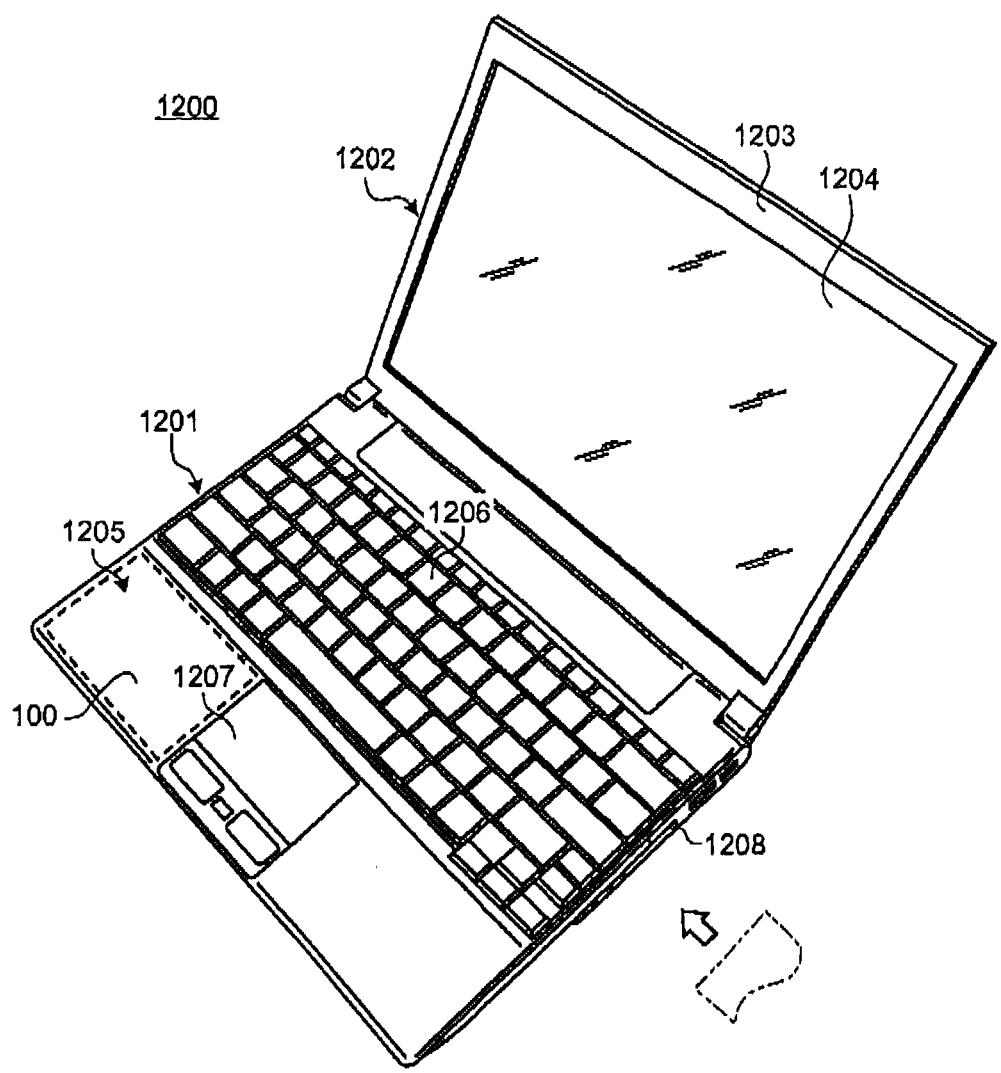
FIG. 36 is a perspective view of an example of a personal computer mounted with a memory system.

FIG. 36 shows a perspective view of an example of a personal computer. A personal computer 1200 includes a main body 1201 and a display unit 1202. The display unit 1202 includes a display housing 1203 and a display device 1204 accommodated in the display housing 1203.

The main body 1201 includes a chassis 1205, a keyboard 1206, and a touch pad 1207 as a pointing device. The chassis 1205 includes a main circuit board, an ODD unit (Optical Disk Device), a card slot, and the SSD 1100 described in the first embodiment.

The card slot is provided so as to be adjacent to the peripheral wall of the chassis 1205. The peripheral wall has an opening 1208 facing the card slot. A user can insert and remove an additional device into and from the card slot from outside the chassis 1205 through the opening 1208.

The SSD 1100 may be used instead of the prior art HDD in the state of being mounted in the personal computer 1200 or may be used as an additional device in the state of being inserted into the card slot of the personal computer 1200.

Figure 37:
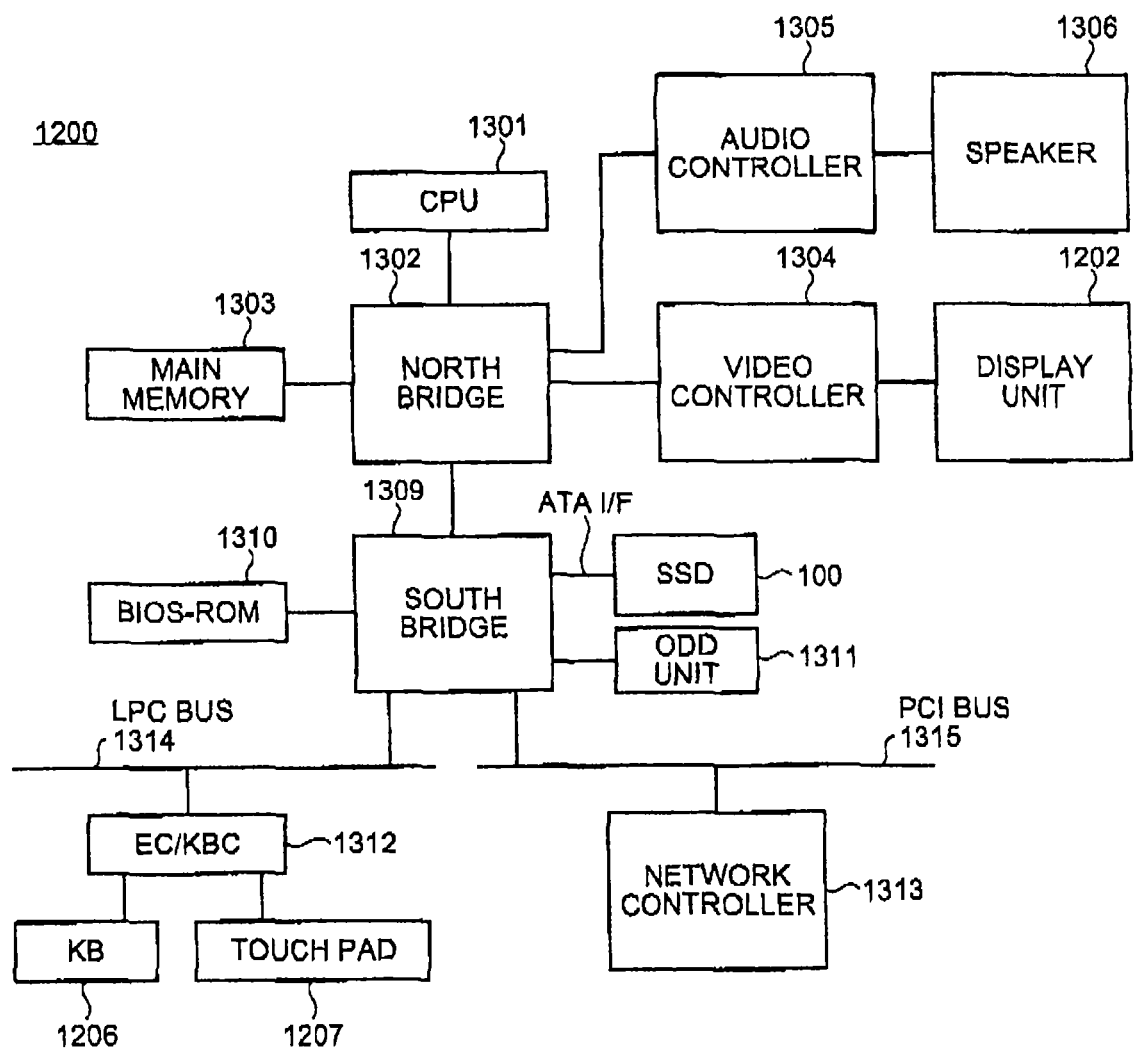
FIG. 37 is a diagram of a system configuration example of the personal computer mounted with the memory system.

FIG. 37 shows a diagram of an example of system architecture in a personal computer. The personal computer 1200 is comprised of CPU 1301, a north bridge 1302, a main memory 1303, a video controller 1304, an audio controller 1305, a south bridge 1309, a BIOS-ROM 1310, the SSD 1100 described in the first embodiment, an ODD unit 1311, an embedded controller/keyboard controller (EC/KBC) IC 1312, and a network controller 1313.

The CPU 1301 is a processor for controlling an operation of the personal computer 1200, and executes an operating system (OS) loaded from the SSD 1100 to the main memory 1303. The CPU 1301 executes these processes, when the ODD unit 1311 executes one of reading process and writing process to an optical disk. The CPU 1301 executes a system BIOS (Basic Input Output System) stored in the BIOS-ROM 1310. The system BIOS is a program for controlling a hard ware of the personal computer 1200.

The north bridge 1302 is a bridge device which connects the local bus of the CPU 1301 to the south bridge 1309. The north bridge 1302 has a memory controller for controlling an access to the main memory 1303. The north bridge 1302 has a function which executes a communication between the video controller 1304 and the audio controller 1305 through the AGP (Accelerated Graphics Port) bus.

The main memory 1303 stores program or data temporary, and functions as a work area of the CPU 1301. The main memory 1303 is comprised of, for example, DRAM. The video controller 1304 is a video reproduce controller for controlling a display unit which is used for a display monitor (LCD) 1316 of the portable computer 1200. The Audio controller 1305 is an audio reproduce controller for controlling a speaker of the portable computer 1200.

The south bridge 1309 controls devices connected to the LPC (Low Pin Count) bus, and controls devices connected to the PCI (Peripheral Component Interconnect) bus. The south bridge 1309 controls the SSD 1100 which is a memory device stored soft ware and data, through the ATA interface.

The personal computer 1200 executes an access to the SSD 1100 in the sector unit. For example, the write command, the read command, and the cache flash command are input through the ATA interface. The south bridge 1309 has a function which controls the BIOS-ROM 1310 and the ODD unit 1311.

The EC/KBC 1312 is one chip microcomputer which is integrated on the embedded controller for controlling power supply, and the key board controller for controlling the key board (KB) 1206 and the touch pad 1207. The EC/KBC 1312 has a function which sets on/off of the power supply of the personal computer 1200 based on the operation of the power button by user. The network controller 1313 is, for example, a communication device which executes the communication to the network, for example, the internet.

Although the memory system in the above embodiments is comprised as an SSD, it can be comprised as, for example, a memory card typified by an SD™ card. Moreover, the memory system can be applied not only to a personal computer but also to various electronic devices such as a cellular phone, a PDA (Personal Digital Assistant), a digital still camera, a digital video camera, and a television set.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
a nonvolatile semiconductor memory including a plurality of storage units;
a volatile semiconductor memory including a storage area;
a controller configured to:
  select valid data stored in first storage units;
  store write data in the storage area, the write data being sent from a host apparatus;
  write the selected valid data, as first valid data, in a second storage unit, when a sum of the valid data stored in the first storage units does not reach a size of a unit of storage;
  copy, as second valid data, the write data stored in the storage area, to the second storage unit, when the write data stored in the storage area reaches a size of a unit of management of the valid data; and
  write the first valid data and the second valid data stored in the second storage unit, in a third storage unit, when a total size of the first valid data and the second valid data stored in the second storage unit reaches the size of the unit of storage.

2. The memory system according to claim 1, wherein
the valid data is managed by the size of the unit of management, the size of the unit of management being larger than a size of one page, wherein
the size of one page is a unit of writing for the nonvolatile semiconductor memory, wherein
the size of the unit of management is smaller than a size of a unit of data erasing for the nonvolatile semiconductor memory.

3. The memory system according to claim 1, wherein
the controller is configured to manage a plurality of blocks using link information, the link information being a plurality of linked lists, wherein
the linked lists are configured to link blocks that have a same number of valid data.

4. The memory system according to claim 3, wherein
the linked lists include a first linked list and a second linked list, wherein
the first linked list manages blocks that have a first number of valid data, wherein
the second linked list manages blocks that have a second number of valid data, wherein
the first number is smaller than the second number, wherein
the first number and the second number are selected from among numbers of 1 to N−1.

5. The memory system according to claim 1, wherein
the first storage units are compaction source blocks, the size of the unit of storage being a size of one block, wherein
the controller is configured to acquire a first compaction target block and rewrite the selected valid data in the first compaction target block, when a sum of valid data stored in the compaction source blocks reaches the size of one block.

6. The memory system according to claim 1, wherein
the first storage units are compaction source blocks, the size of the unit of storage being a size of one block, wherein
the controller is configured to rewrite the selected valid data in the second storage unit, as the first valid data, when a sum of valid data stored in the compaction source blocks does not reach the size of one block.

7. The memory system according to claim 6, wherein
the controller is configured to copy, as the second valid data, the write data stored in the storage area, to the second storage unit, when the write data stored in the storage area reaches the size of the unit of management, wherein
the controller is configured to rewrite the first valid data and the second valid data stored in the second storage unit, in a second compaction target block, when the total size of the first valid data and the second valid data stored in the second storage unit reaches the size of one block.

8. The memory system according to claim 7, wherein
the controller is configured to release a block allocated to the second storage unit, after rewriting the first valid data and the second valid data stored in the second storage unit.

9. A compaction method comprising:
storing data in a nonvolatile semiconductor memory, the nonvolatile semiconductor memory including a plurality of storage units;
selecting valid data stored in first storage units;
storing write data in a storage area included in a volatile semiconductor memory, the write data being sent from a host apparatus;
writing the selected valid data, as first valid data, in a second storage unit, when a sum of the valid data stored in the first storage units does not reach a size of a unit of storage;
copying, as second valid data, the write data stored in the storage area, to the second storage unit, when the write data stored in the storage area reaches a size of a unit of management of the valid data; and
writing the first valid data and the second valid data stored in the second storage unit, in a third storage unit, when a total size of the first valid data and the second valid data stored in the second storage unit reaches the size of the unit of storage.

10. The method according to claim 9, wherein
the valid data is managed by the size of the unit of management, the size of the unit of management being larger than a size of one page, wherein
the size of one page is a unit of writing for the nonvolatile semiconductor memory, wherein
the size of the unit of management is smaller than a size of a unit of data erasing for the nonvolatile semiconductor memory.

11. The method according to claim 9, wherein
a plurality of blocks are managed using link information, the link information being a plurality of linked lists, wherein
the linked lists are configured to link blocks that have a same number of valid data.

12. The method according to claim 11, wherein
the linked lists include a first linked list and a second linked list, wherein
the first linked list manages blocks that have a first number of valid data, wherein
the second linked list manages blocks that have a second number of valid data, wherein the first number is smaller than the second number, wherein the first number and the second number are selected from among numbers of 1 to N−1.

13. The method according to claim 9, wherein the first storage units are compaction source blocks, the size of the unit of storage being a size of one block, wherein a first compaction target block is acquired and the selected valid data is rewritten in the first compaction target block, when a sum of valid data stored in the compaction source blocks reaches the size of one block.

14. The method according to claim 9, wherein the first storage units are compaction source blocks, the size of the unit of storage being a size of one block, wherein the selected valid data is rewritten in the second storage unit, as the first valid data, when a sum of valid data stored in the compaction source blocks does not reach the size of one block.

15. The method according to claim 14, wherein the write data stored in the storage area is copied, as the second valid data, to the second storage unit, when the write data stored in the storage area reaches the size of the unit of management, wherein the first valid data and the second valid data stored in the second storage unit are rewritten in a second compaction target block, when the total size of the first valid data and the second valid data stored in the second storage unit reaches the size of one block.

16. The method according to claim 15, wherein a block allocated to the second storage unit is released, after rewriting the first valid data and the second valid data stored in the second storage unit.

* * * * *